United States Patent
Bando et al.

(10) Patent No.: US 10,361,174 B2
(45) Date of Patent: Jul. 23, 2019

(54) ELECTRONIC DEVICE

(71) Applicant: Renesas Electronics Corporation, Tokyo (JP)

(72) Inventors: Koji Bando, Tokyo (JP); Tomohiro Nishiyama, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/035,152

(22) Filed: Jul. 13, 2018

(65) Prior Publication Data

US 2019/0067251 A1 Feb. 28, 2019

(30) Foreign Application Priority Data

Aug. 31, 2017 (JP) .................... 2017-166609

(51) Int. Cl.
*H01L 23/52* (2006.01)
*H01L 25/065* (2006.01)
*H01L 23/367* (2006.01)
*H01L 23/31* (2006.01)
*H01L 23/538* (2006.01)

(52) U.S. Cl.
CPC .......... *H01L 25/0657* (2013.01); *H01L 23/31* (2013.01); *H01L 23/3677* (2013.01); *H01L 23/5385* (2013.01); *H01L 23/5386* (2013.01); *H01L 2224/05554* (2013.01); *H01L 2224/0603* (2013.01); *H01L 2224/48091* (2013.01); *H01L 2224/48247* (2013.01); *H01L 2924/181* (2013.01)

(58) Field of Classification Search
CPC . H01L 23/3677; H01L 23/31; H01L 23/5386; H01L 23/5385; H01L 25/0657
USPC ..................................................... 257/777
See application file for complete search history.

(56) References Cited

U.S. PATENT DOCUMENTS

| | | | | |
|---|---|---|---|---|
| 6,072,240 A | * | 6/2000 | Kimura ................ | H01L 25/072 257/692 |
| 6,885,096 B2 | * | 4/2005 | Hirahara .............. | H01L 25/071 257/666 |
| 7,042,086 B2 | | 5/2006 | Shimoida et al. | |

(Continued)

FOREIGN PATENT DOCUMENTS

JP 2004-140068 A 5/2004
JP 2013-021318 A 1/2013

*Primary Examiner* — Luan C Thai
(74) *Attorney, Agent, or Firm* — McGinn IP Law Group, PLLC

(57) ABSTRACT

An improvement is achieved in the heat dissipation property of an electronic device including power transistors. A semiconductor module includes first and second packages included in an inverter circuit. In the first package, a semiconductor chip having a high-side power transistor is embedded. In the second package, a semiconductor chip having a low-side power transistor is embedded. At the both wide surfaces of the first and second packages, first metal electrodes electrically coupled to respective collector electrodes of the power transistors and second metal electrodes electrically coupled to respective emitter electrodes of the power transistors are exposed. To the first and second metal electrodes of the first and second packages, four respective bus bar plates having areas larger than those of the first and second metal electrodes are joined.

20 Claims, 40 Drawing Sheets

(56) References Cited

U.S. PATENT DOCUMENTS 7,633,758 B2 * 12/2009 Oohama ............... H01L 25/117
                                                       257/713
8,987,777 B2    3/2015 Hauenstein

* cited by examiner

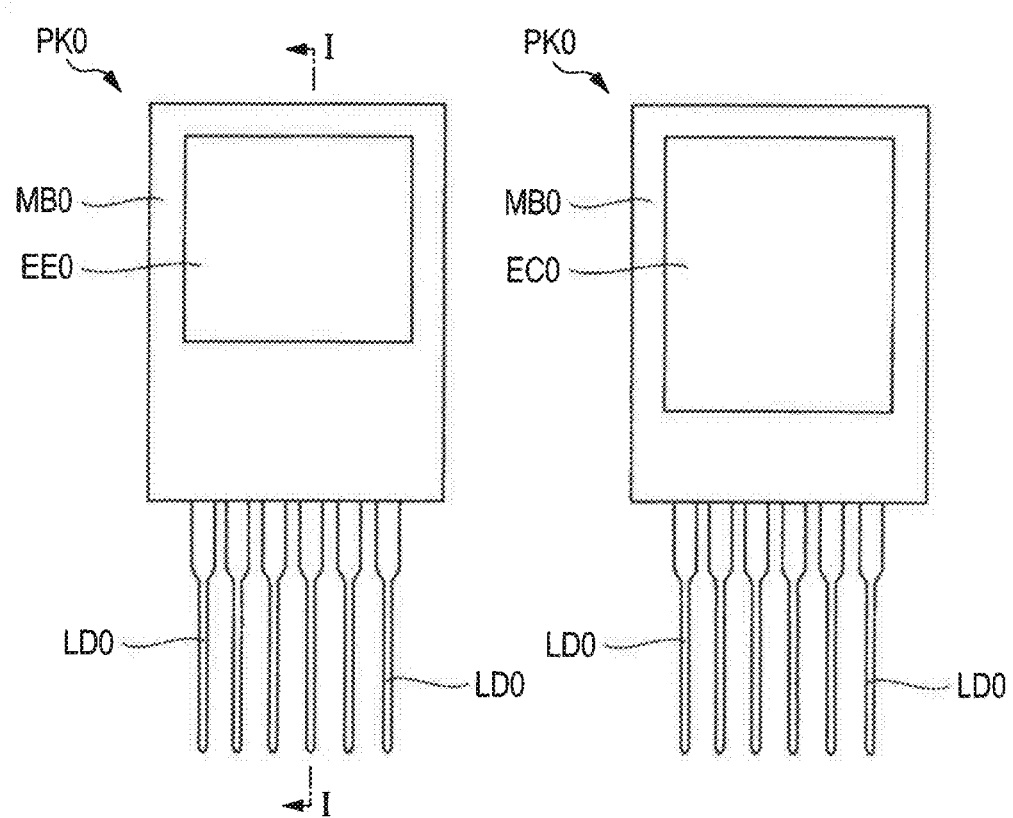
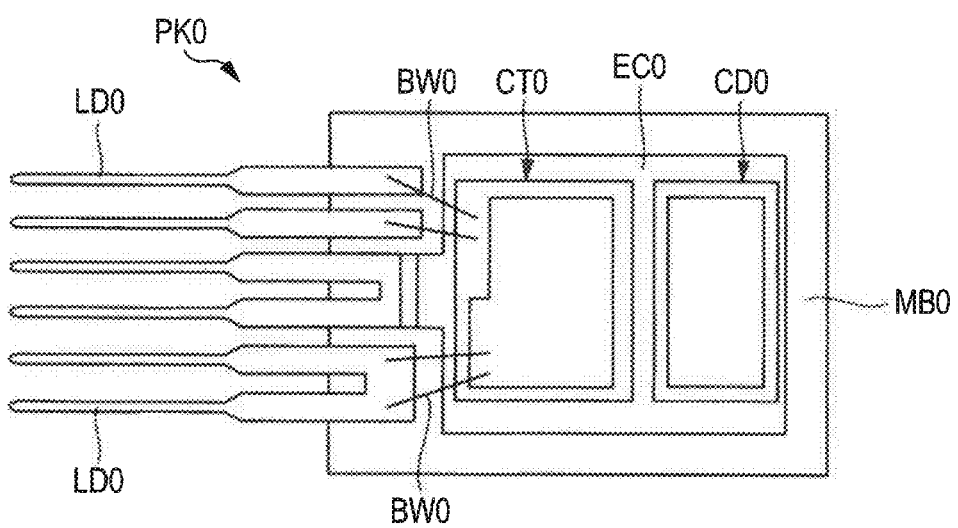

ELECTRONIC DEVICE

CROSS-REFERENCE TO RELATED APPLICATIONS

The disclosure of Japanese Patent Application No. 2017-166609 filed on Aug. 31, 2017 including the specification, drawings and abstract is incorporated herein by reference in its entirety.

BACKGROUND

The present invention relates to an electronic device and to, for example, a technique for an electronic device including a power transistor.

A semiconductor device including a power transistor is described in, e.g., each of Patent Documents 1 and 2. Patent Document 1 discloses a structure in which the respective main surfaces of stacked semiconductor chips facing each other are electrically coupled to a common metal wiring layer and, in a region where the upper and lower semiconductor chips do not two-dimensionally overlap, a metal wiring layer is provided which is electrically coupled to the control electrodes of the semiconductor chips to lead out the control electrodes. Patent Document 2 discloses a structure in which a high-side device and a low-side device are stacked via a common conductive interface and electrically, mechanically, and thermally connected to each other.

RELATED ART DOCUMENTS

Patent Documents

[Patent Document 1] Japanese Unexamined Patent Application Publication No. 2004-140068

[Patent Document 2] Japanese Unexamined Patent Application Publication No. 2013-21318

SUMMARY

In an electronic device including a power transistor, in terms of improving the reliability and electrical property thereof or the like, a heat dissipation property is desired to be further improved.

Other problems and novel features of the present invention will become apparent from a statement in the present specification and the accompanying drawings.

An electronic device in an embodiment includes a first sealing body and a second sealing body. The first sealing body includes a first semiconductor chip having a first power transistor, a first metal plate electrically coupled to a first electrode of the first semiconductor chip, and a second metal plate electrically coupled to a second electrode of the first semiconductor chip. The first metal plate has a first surface facing and electrically coupled to the first electrode and a second surface opposite to the first surface. The second surface is exposed from the first sealing body. The second metal plate of the first sealing body has a third surface facing and electrically coupled to the second electrode and a fourth surface opposite to the third surface. The fourth surface is exposed from the second sealing body. The second sealing body includes a second semiconductor chip having a second power transistor, a third metal plate electrically coupled to a third electrode of the second semiconductor chip, and a fourth metal plate electrically coupled to a fourth electrode of the second semiconductor chip. The third metal plate has a fifth surface facing and electrically coupled to the third electrode and a sixth surface opposite to the fifth surface. The sixth surface is exposed from the second sealing body. The fourth metal plate has a seventh surface facing and electrically coupled to the fourth electrode and an eighth surface opposite to the seventh surface. The eighth surface is exposed from the second sealing body. The second surface of the first metal plate of the first sealing body is electrically coupled to a first terminal via a first conductor layer. The eighth surface of the fourth metal plate of the second sealing body is electrically coupled to a second terminal via a second conductor layer. The fourth surface of the second metal plate of the first sealing body and the sixth surface of the third metal plate of the second sealing body are electrically coupled to an output terminal via a third conductor layer. An area of the first terminal in plan view is larger than an area of the first metal plate in plan view. An area of the second terminal in plan view is larger than an area of the fourth metal plate in plan view. An area of the output terminal in plan view is larger than an area of the second metal plate in plan view or an area of the third metal plate in plan view.

The embodiment allows an improvement in the heat dissipation property of the electronic device including the power transistors.

BRIEF DESCRIPTION OF THE DRAWINGS

The left side of FIG. 1 shows a plan view of a package containing a power transistor included in a three-phase inverter circuit studied by the present inventors, while the right side of FIG. 1 shows a plan view of the opposite surface of the package on the left side of FIG. 1;

FIG. 2 is a transparent plan view of the package in FIG. 1;

Figure 6:
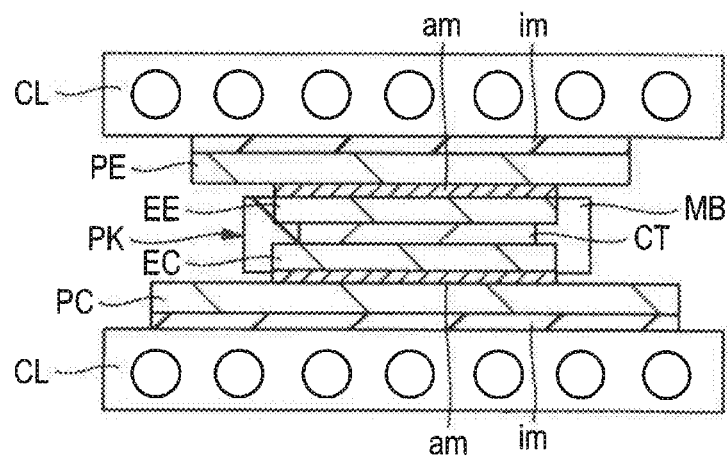
FIG. 6 is a schematic cross-sectional view along the line II-II in FIG. 5.
Figure 7:
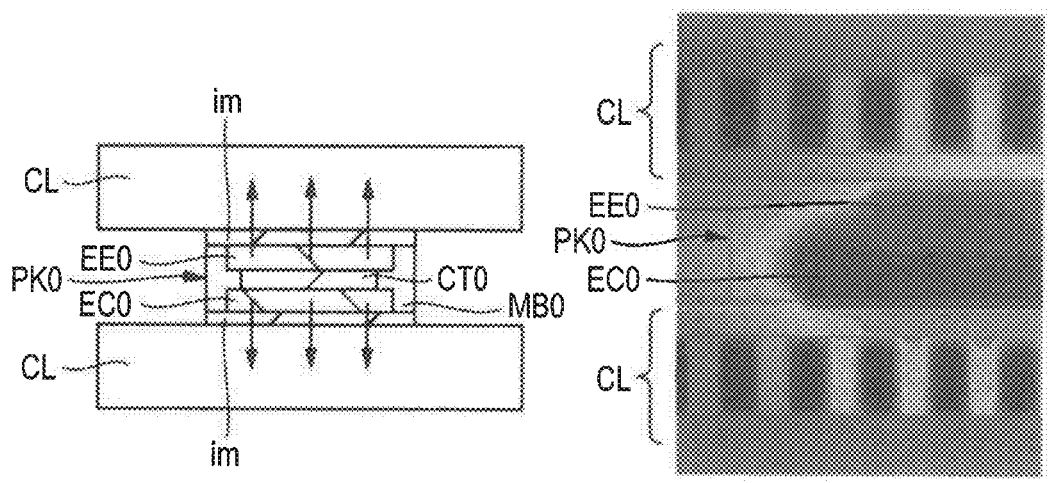
Figure 8:
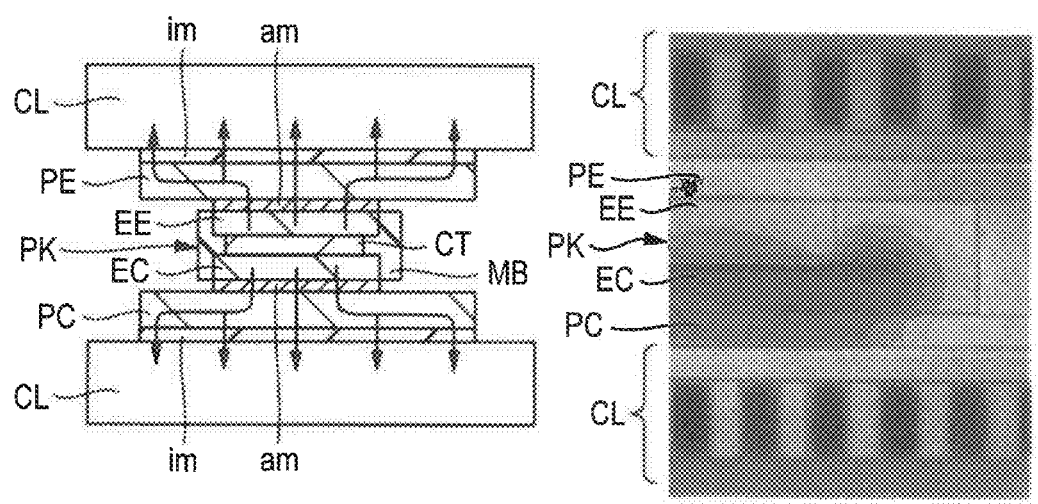
Figure 9:
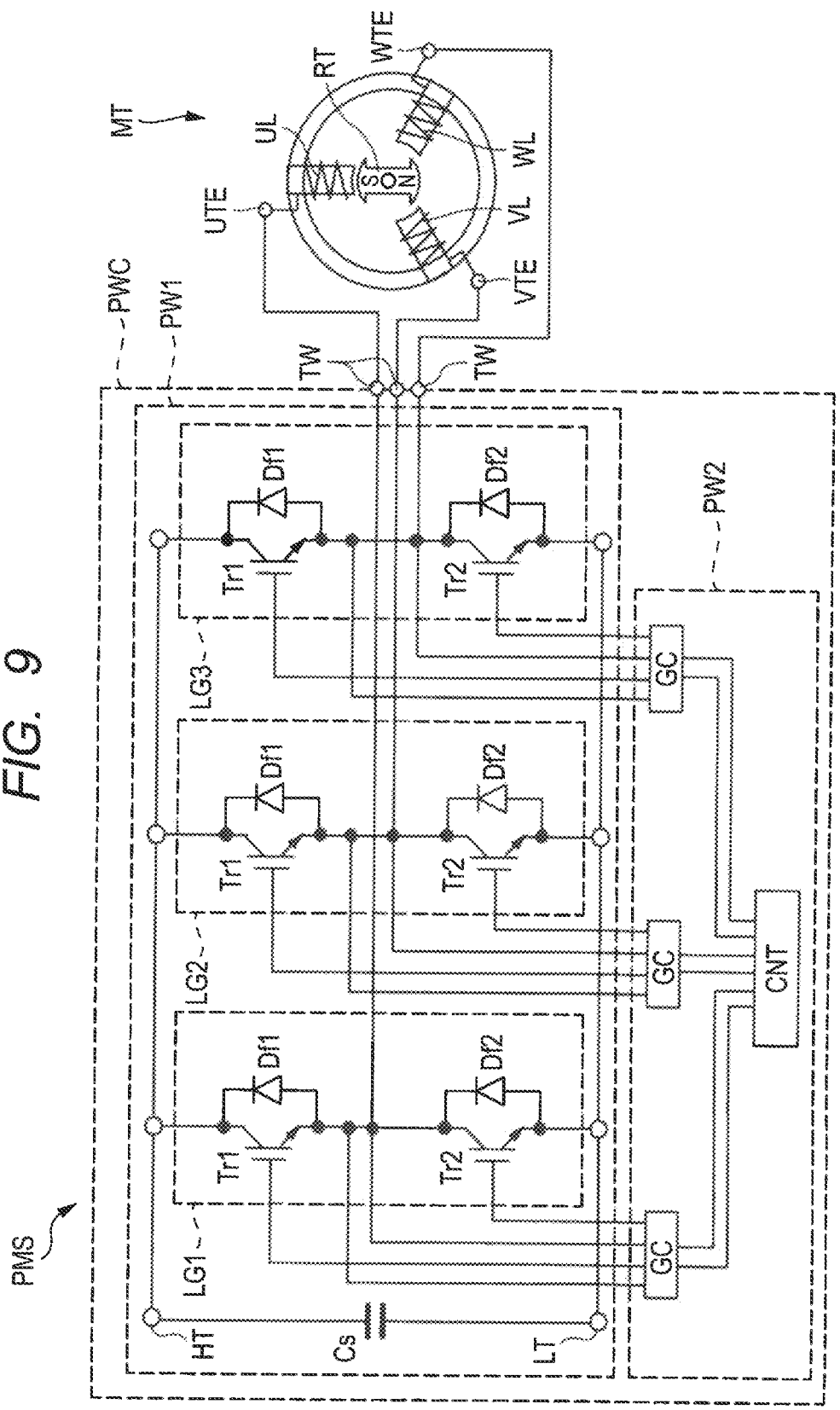
Figure 10:
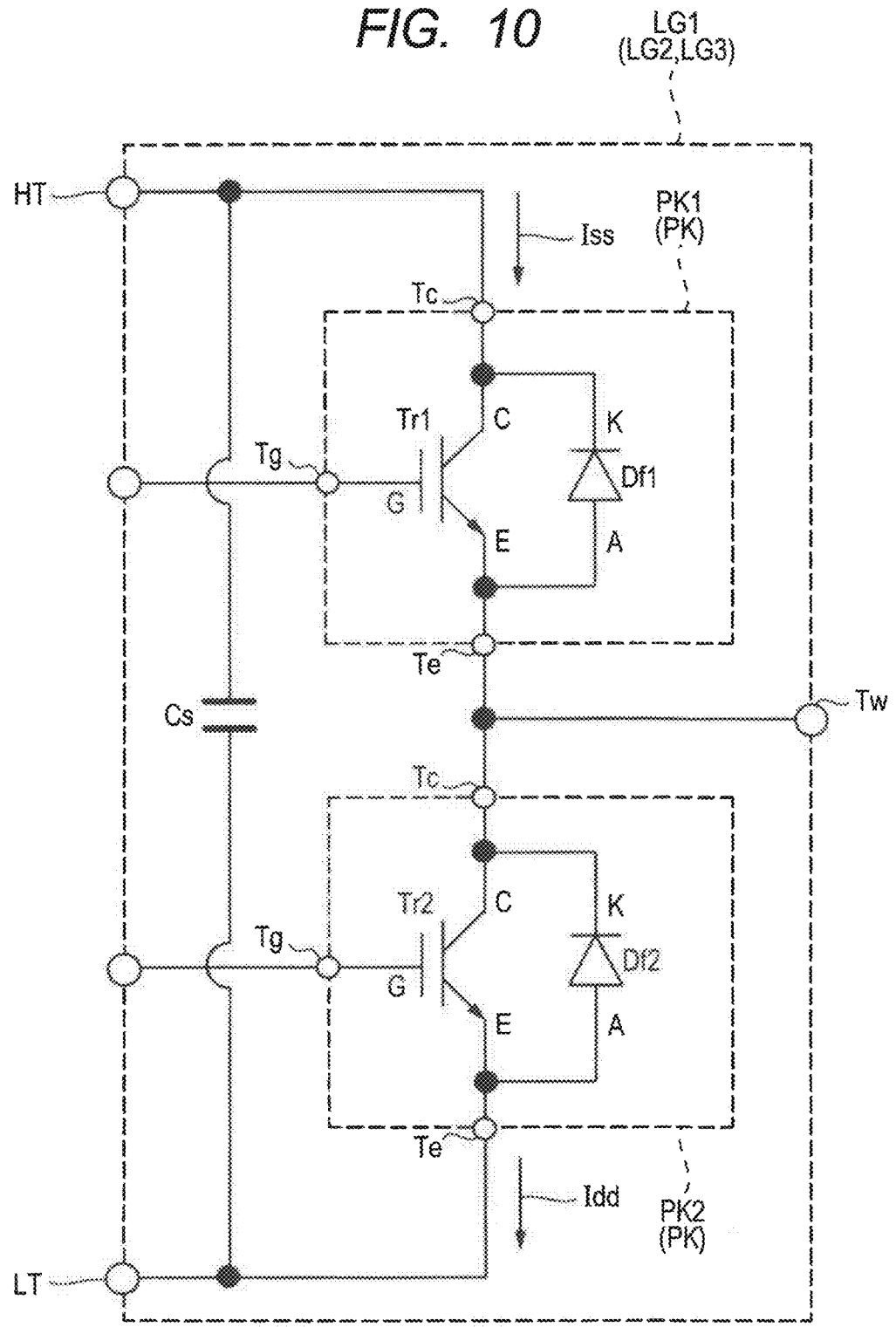
Figure 11:
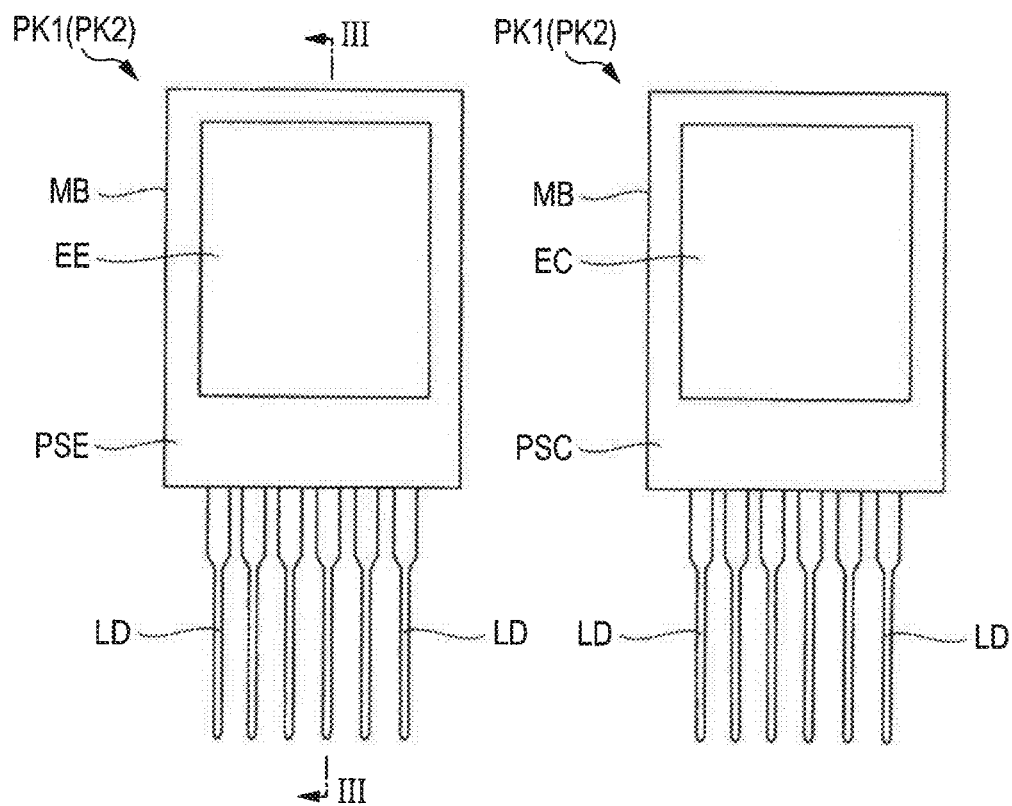
Figure 12:
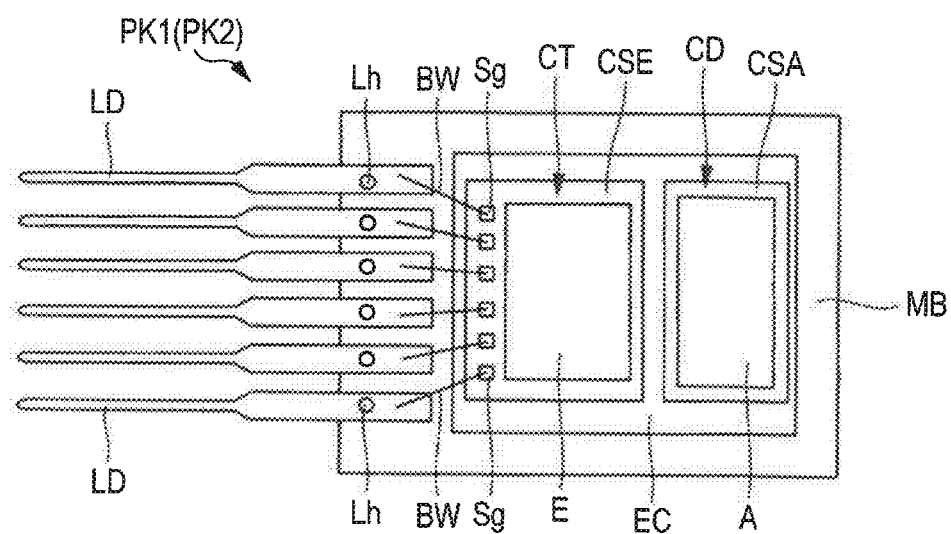
Figure 13:
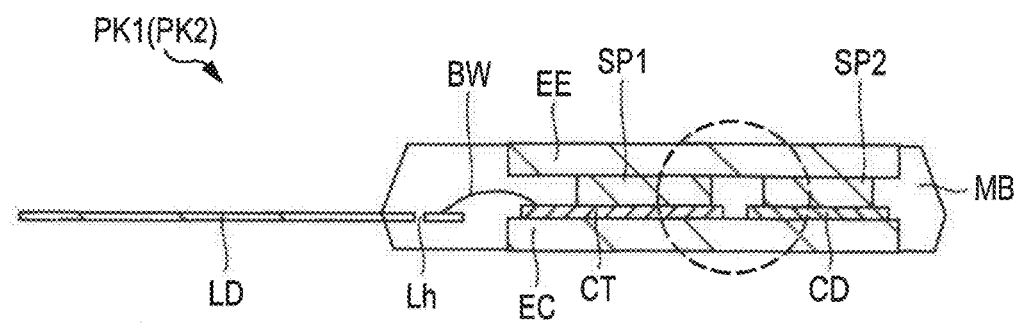
Figure 14:
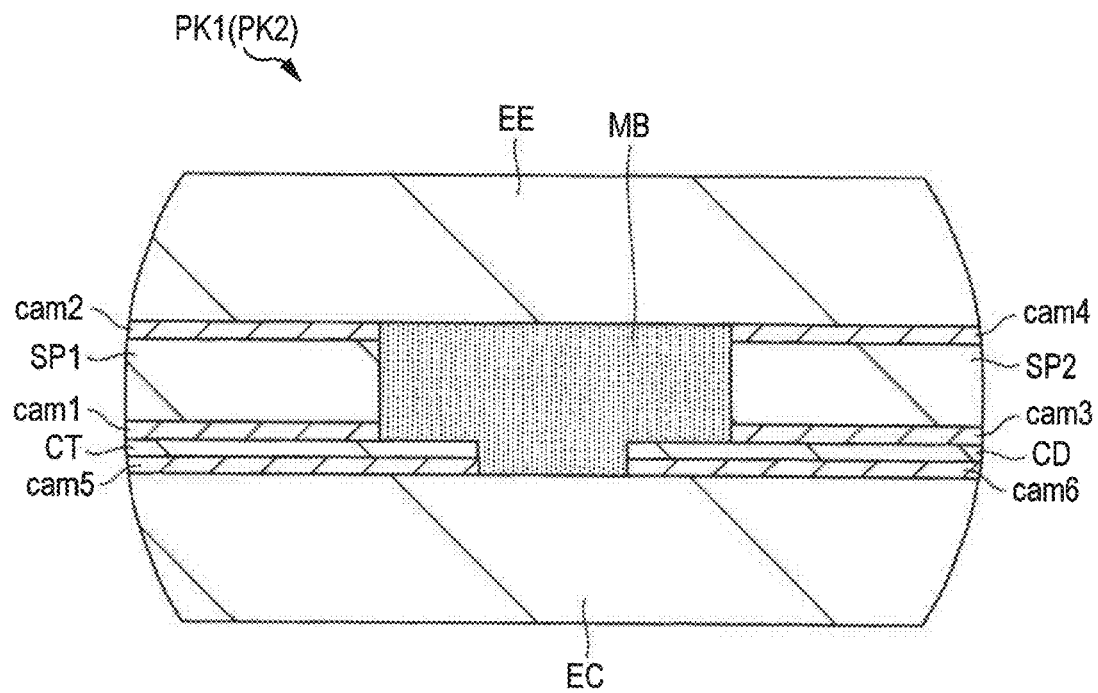
Figure 15:
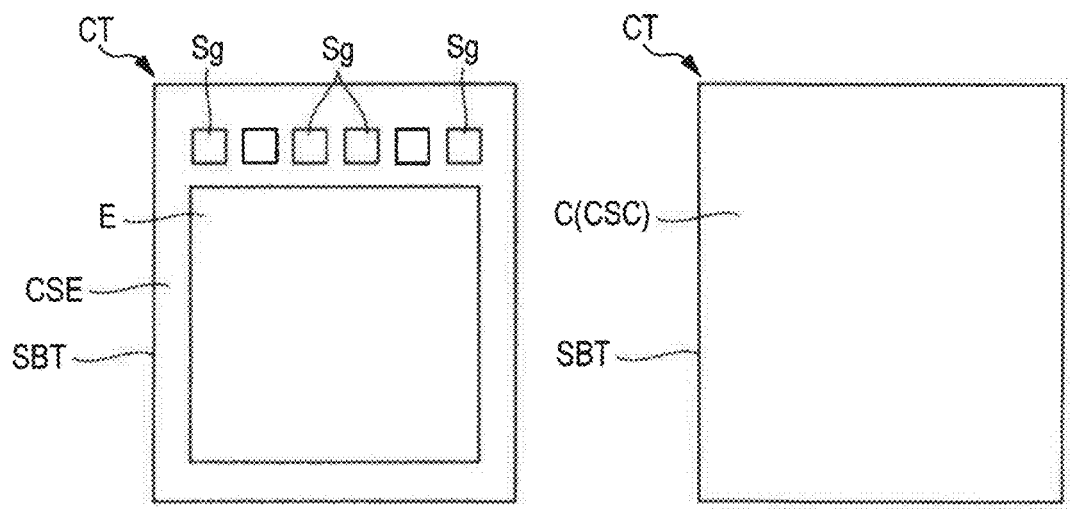
Figure 16:
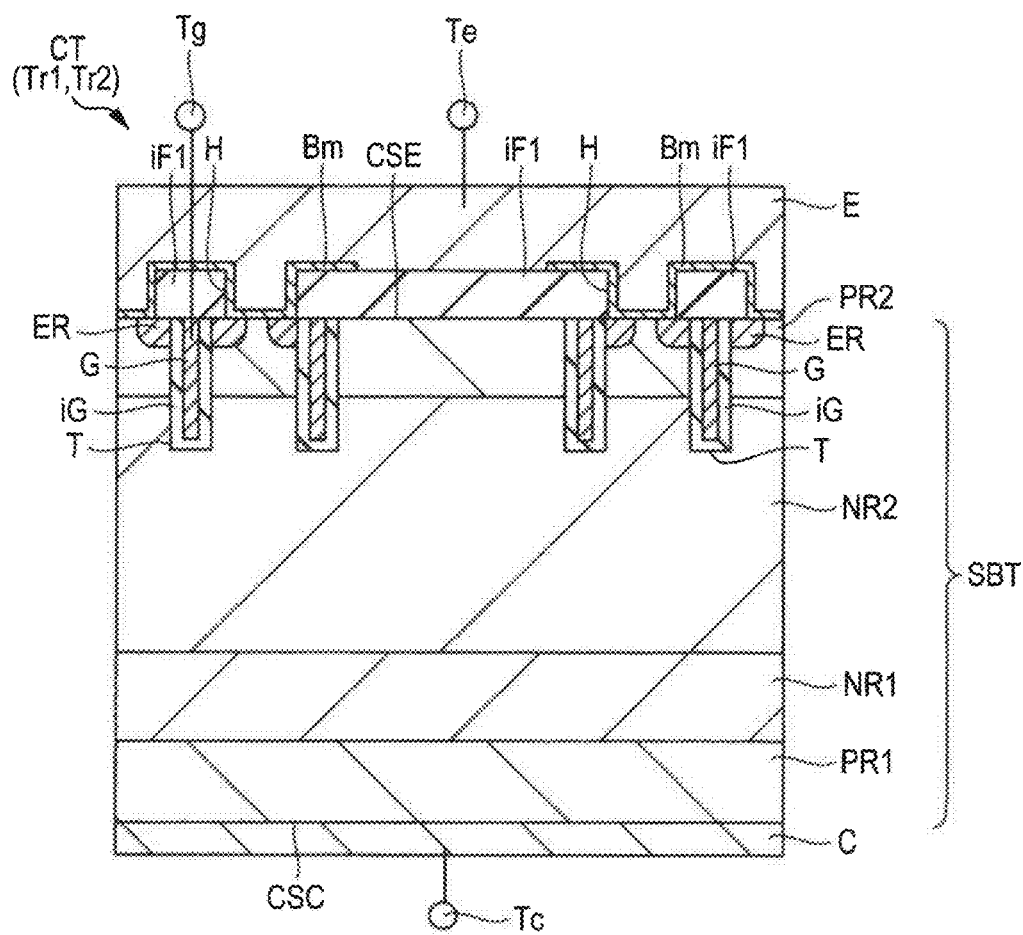
Figure 17:
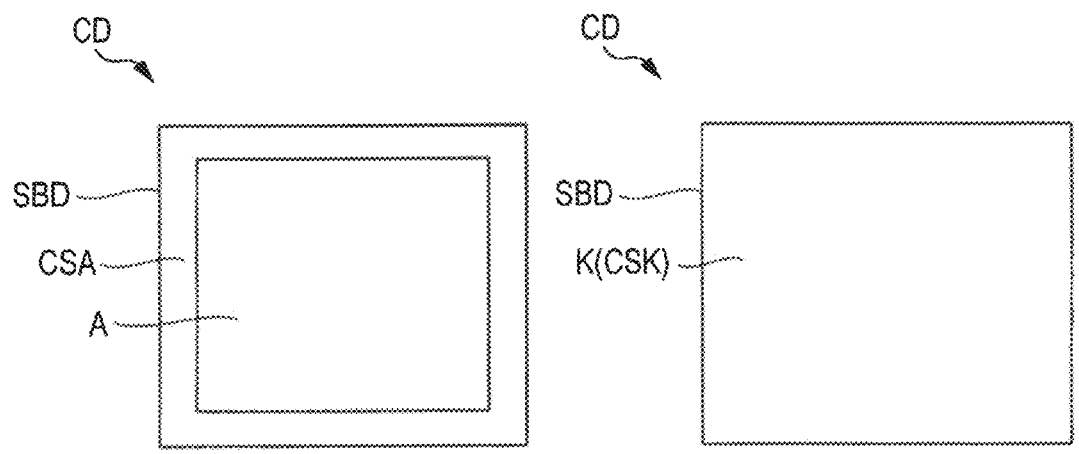
Figure 18:
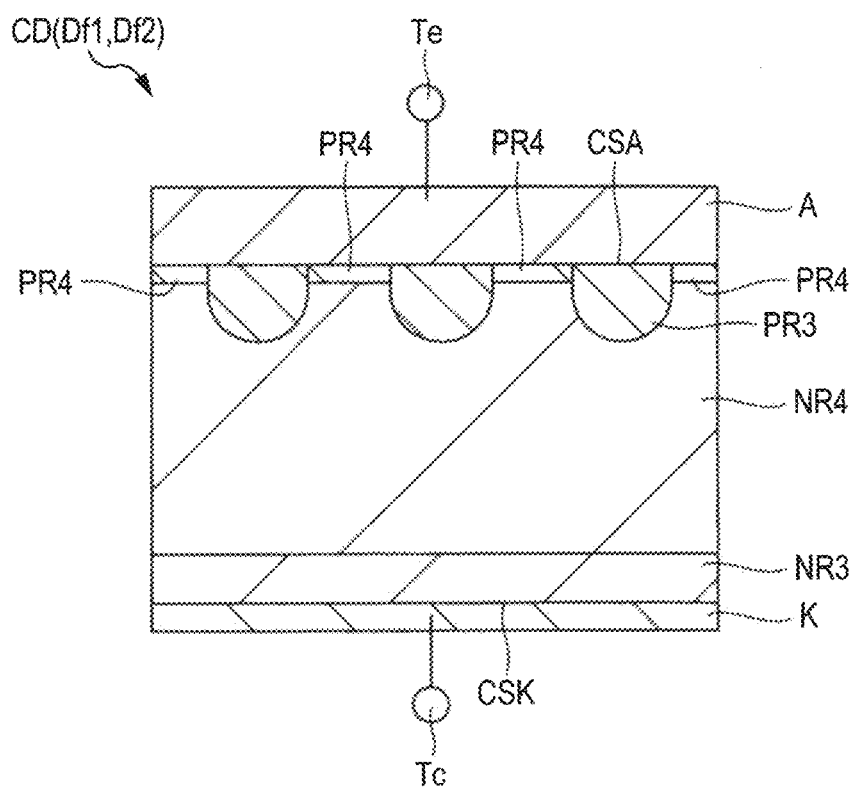
Figure 19:
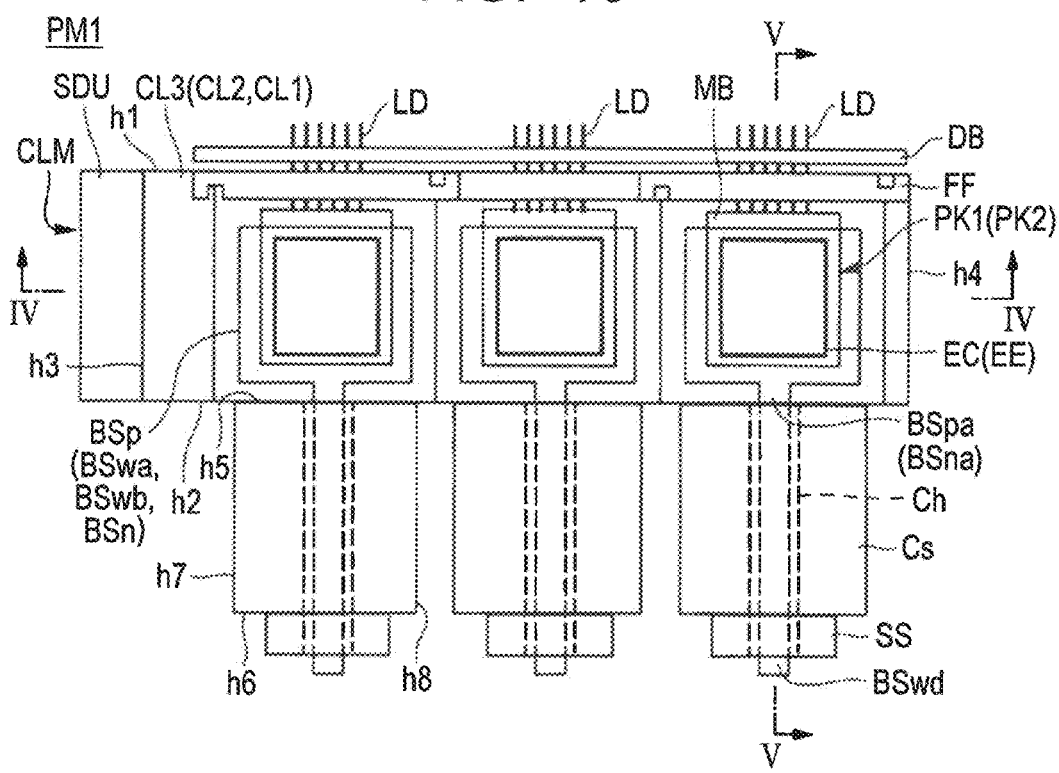
Figure 20:
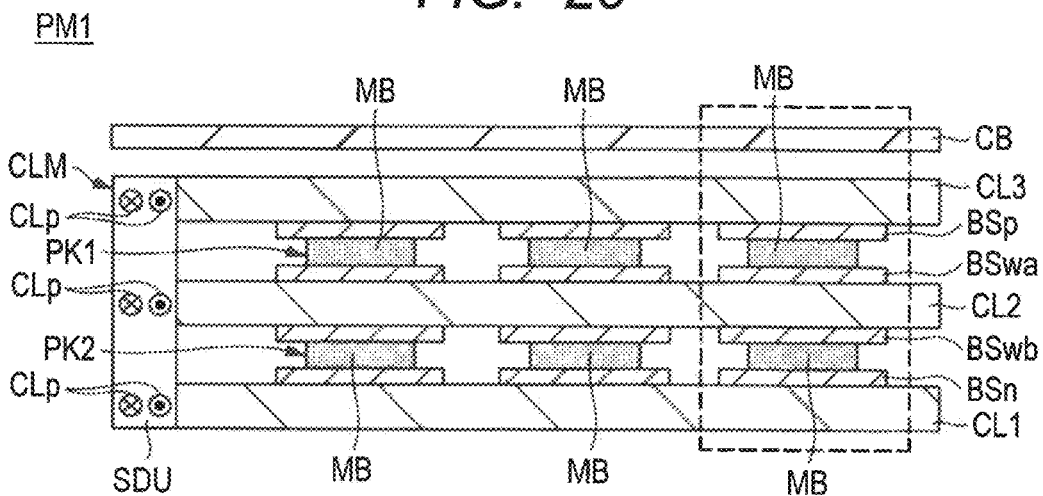
Figure 21:
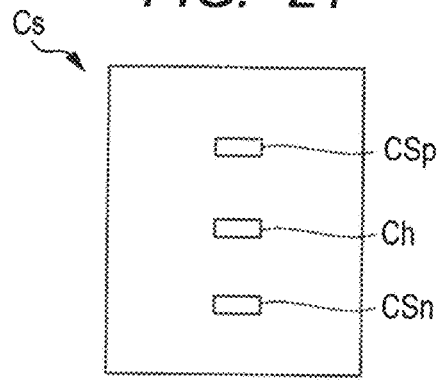
Figure 22:
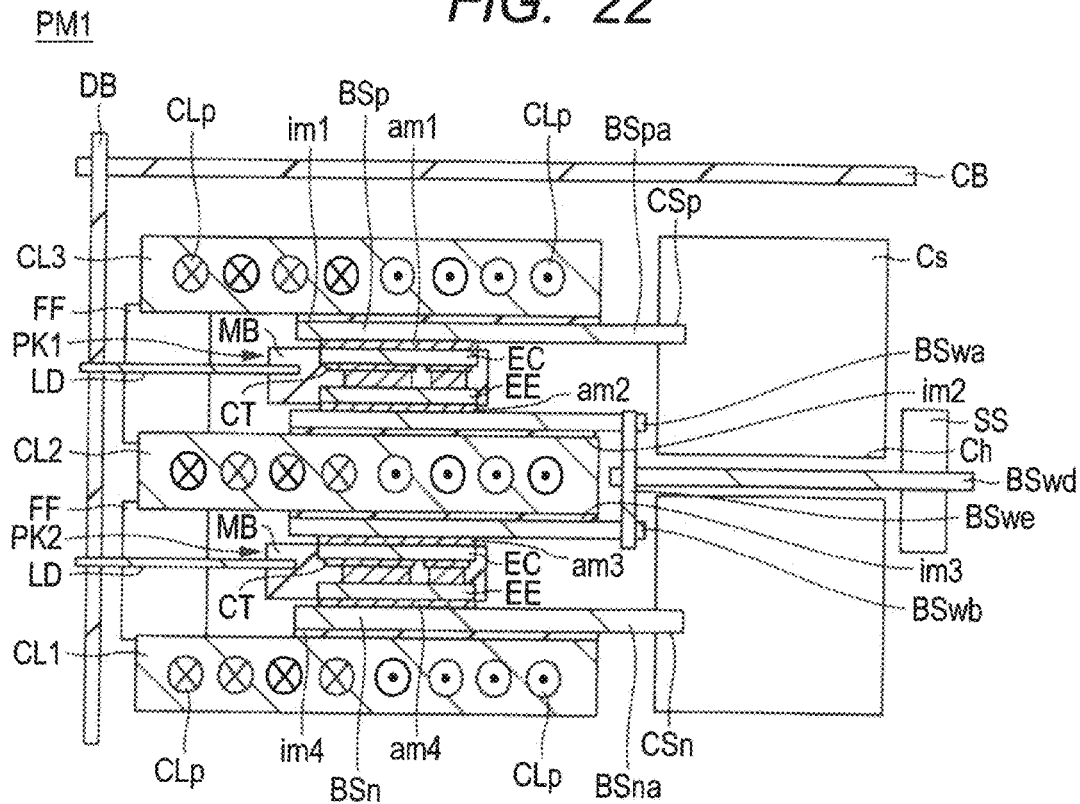
Figure 23:
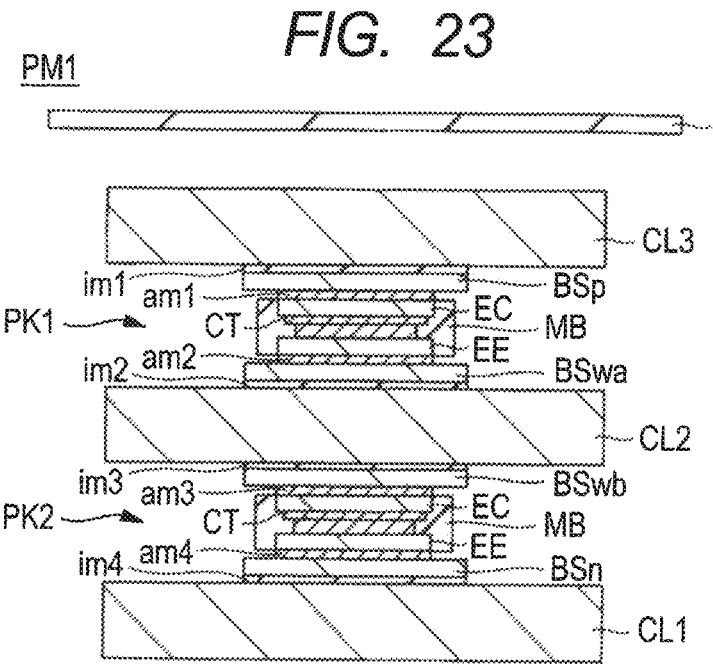
Figure 24:
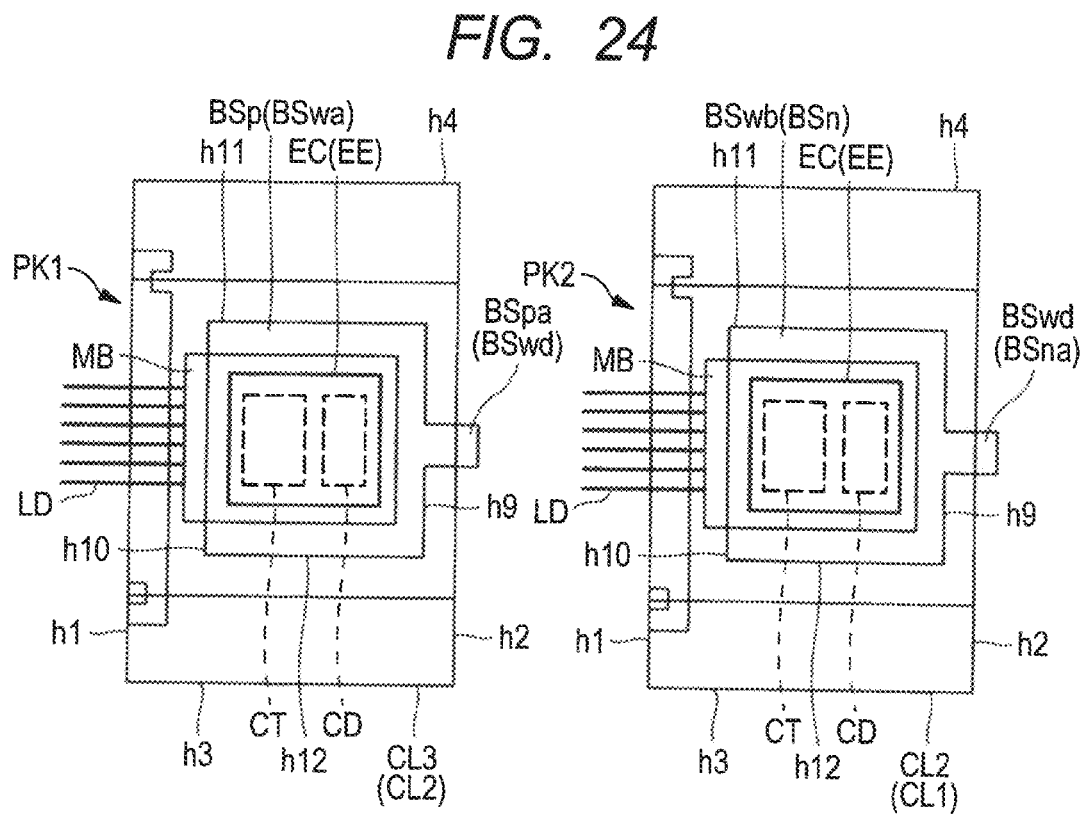
Figure 25:
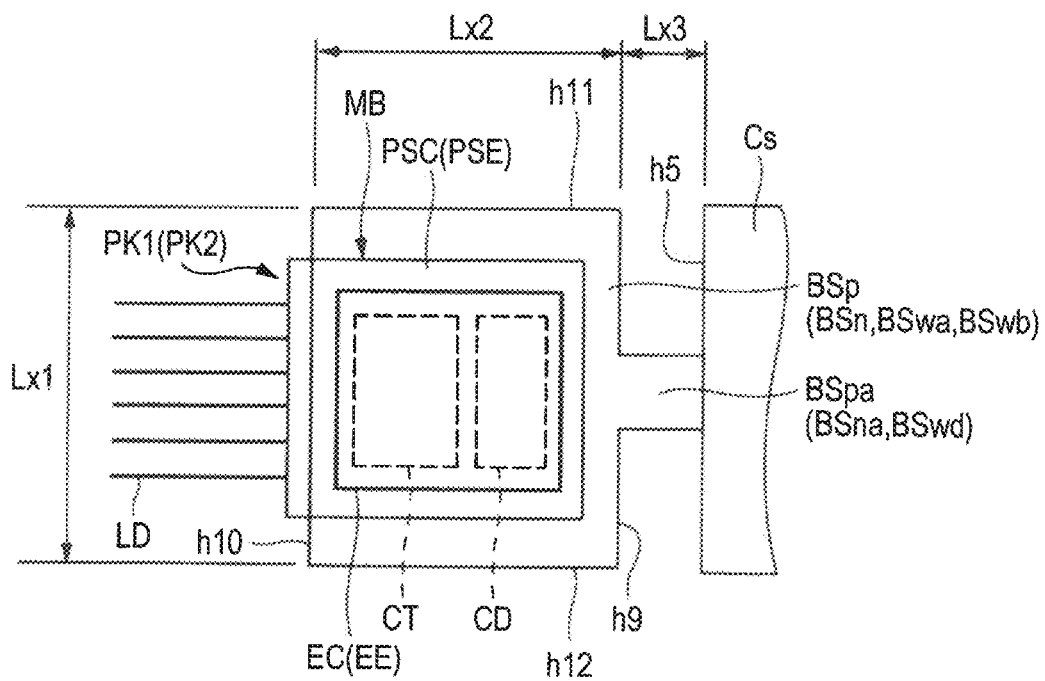
Figure 26:
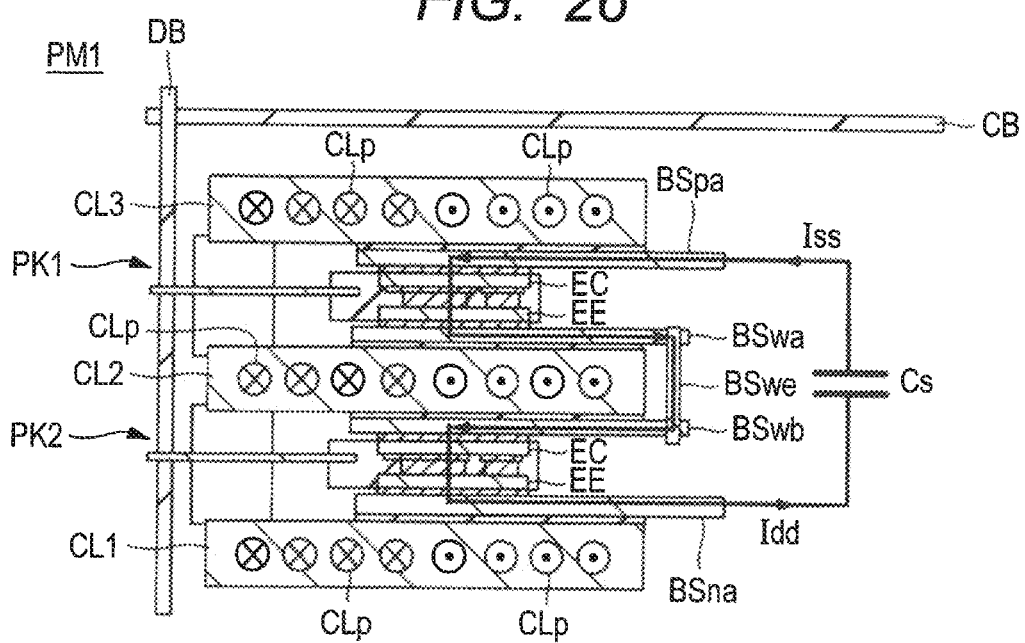
Figure 27:
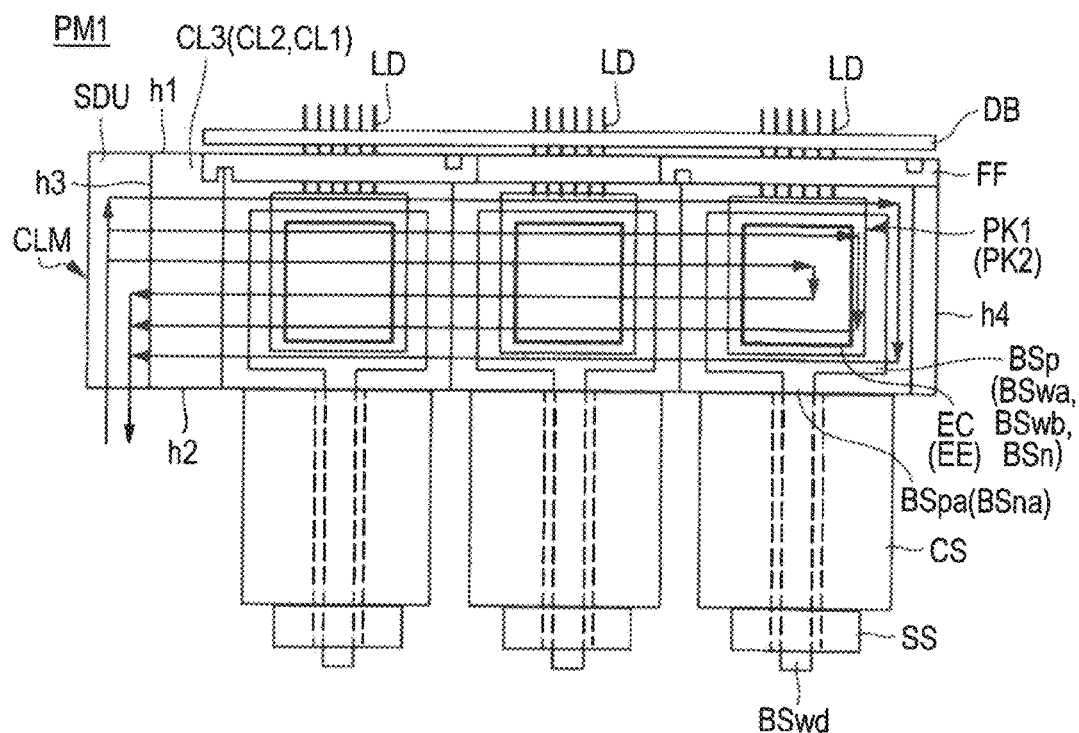
Figure 28:
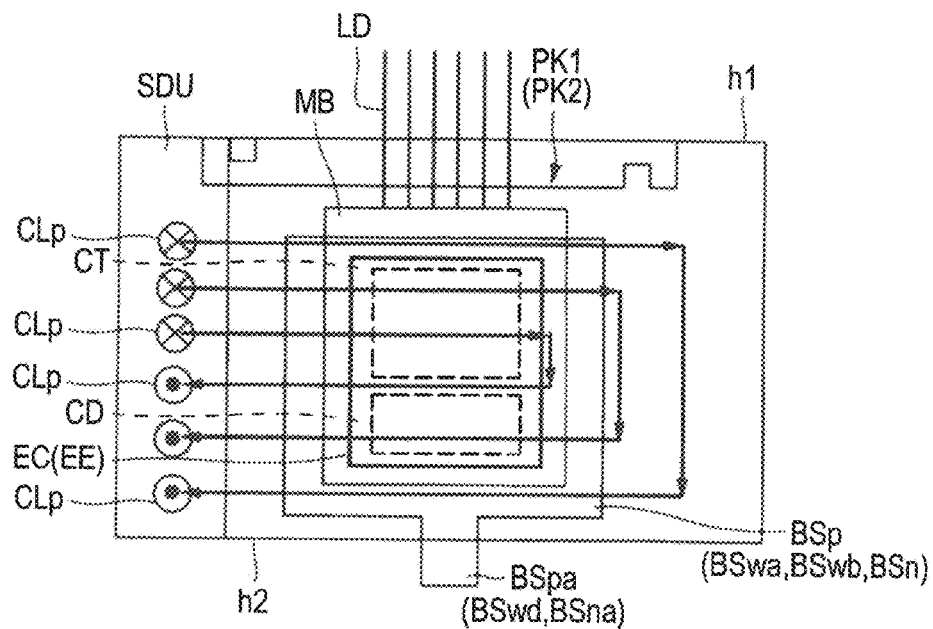
Figure 29:
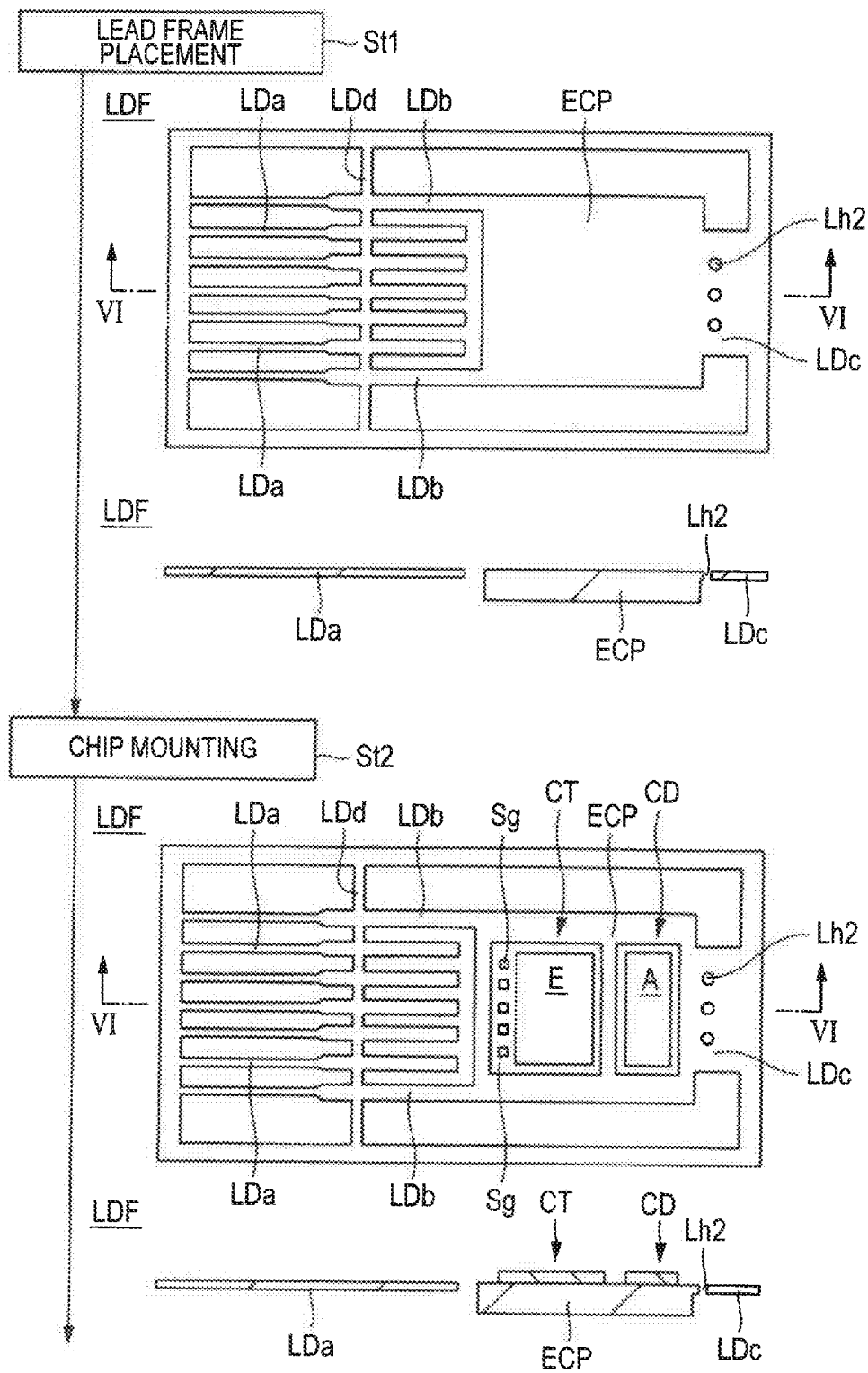
Figure 30:
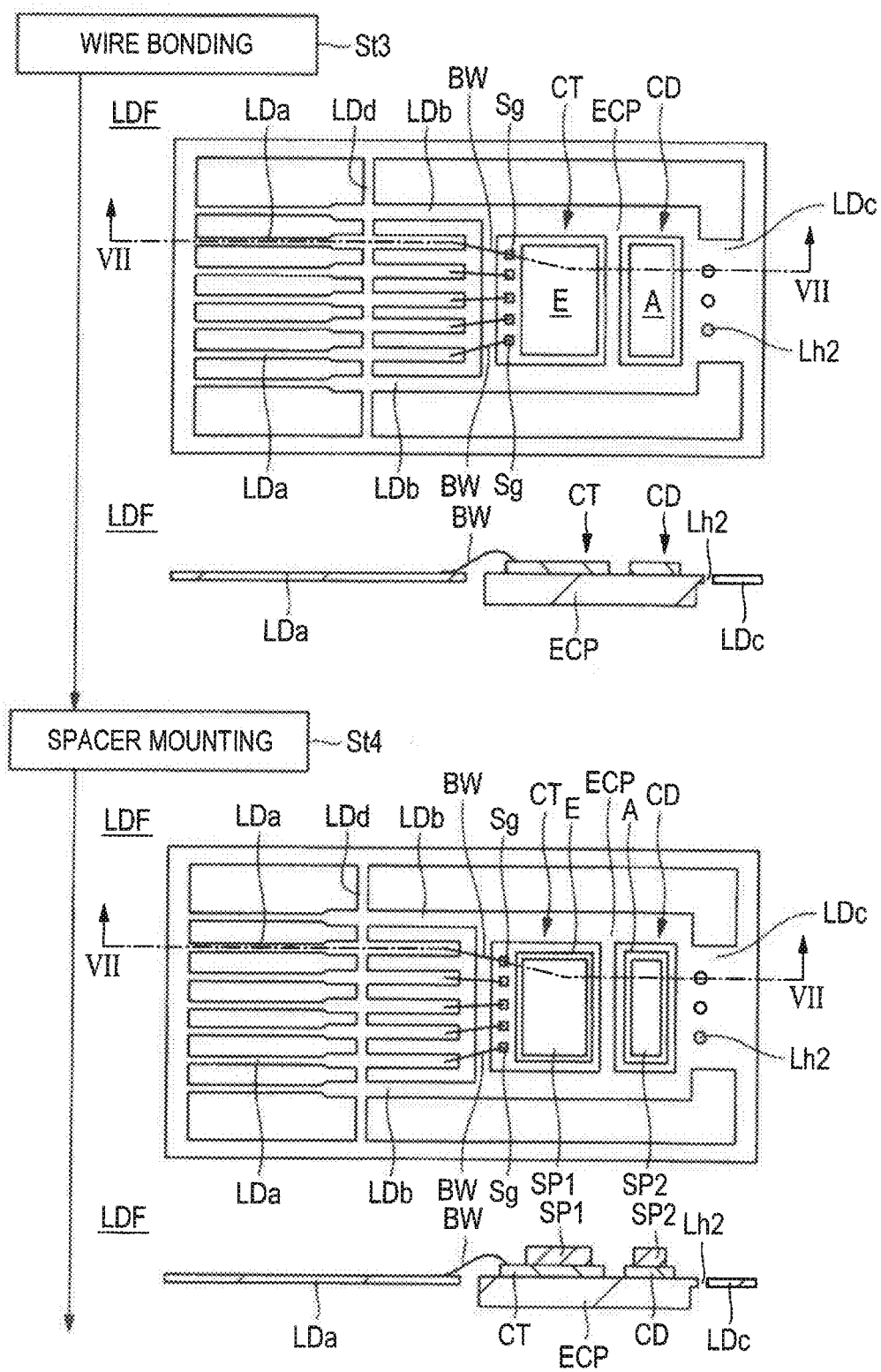
Figure 31:
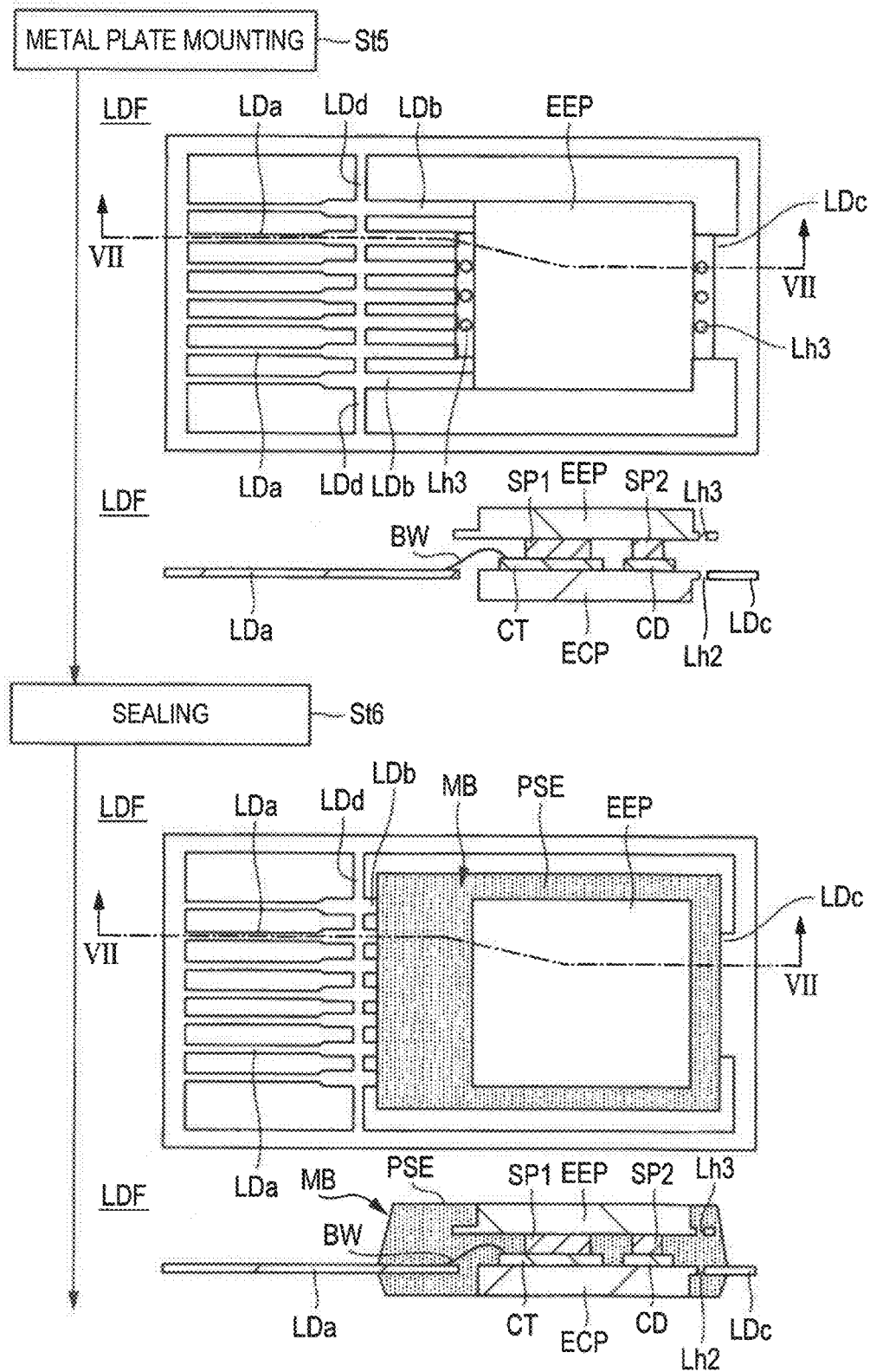
Figure 32:
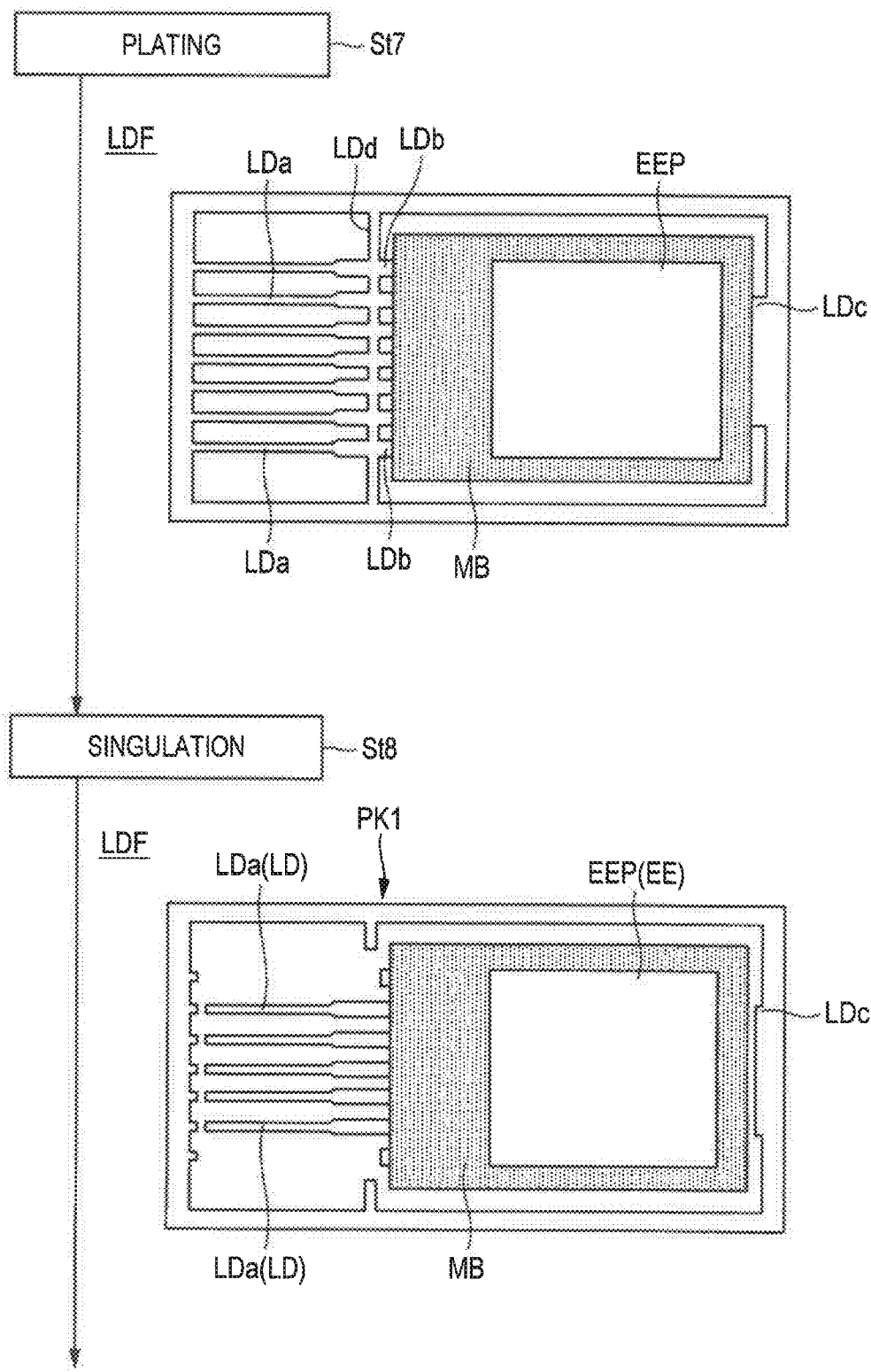
Figure 33:
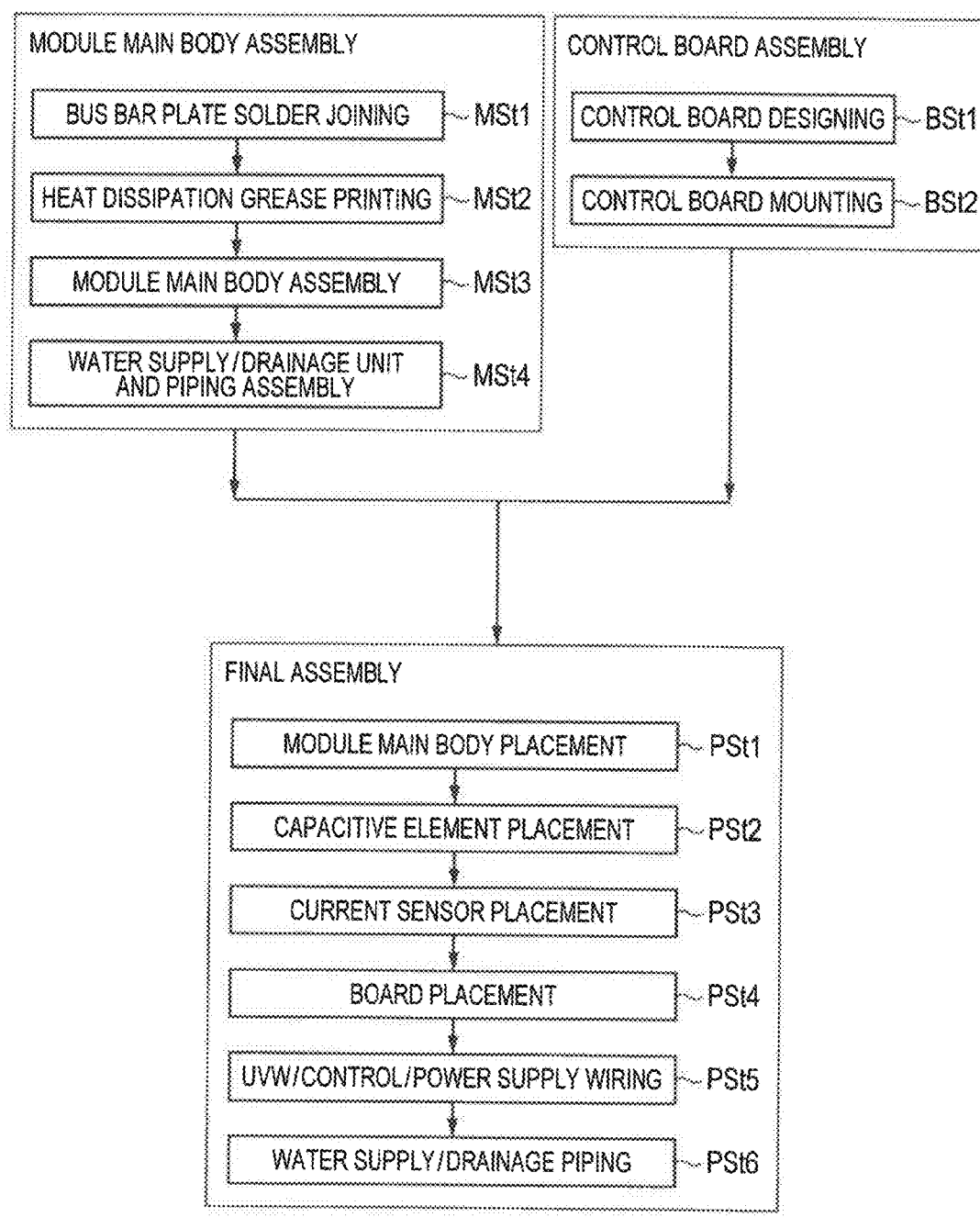
Figure 34:
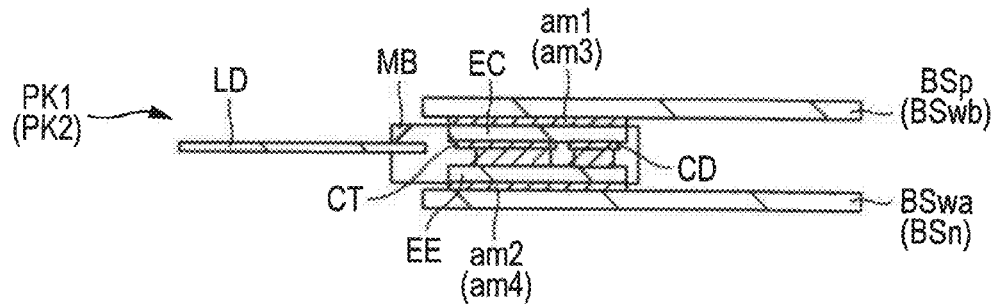
Figure 35:
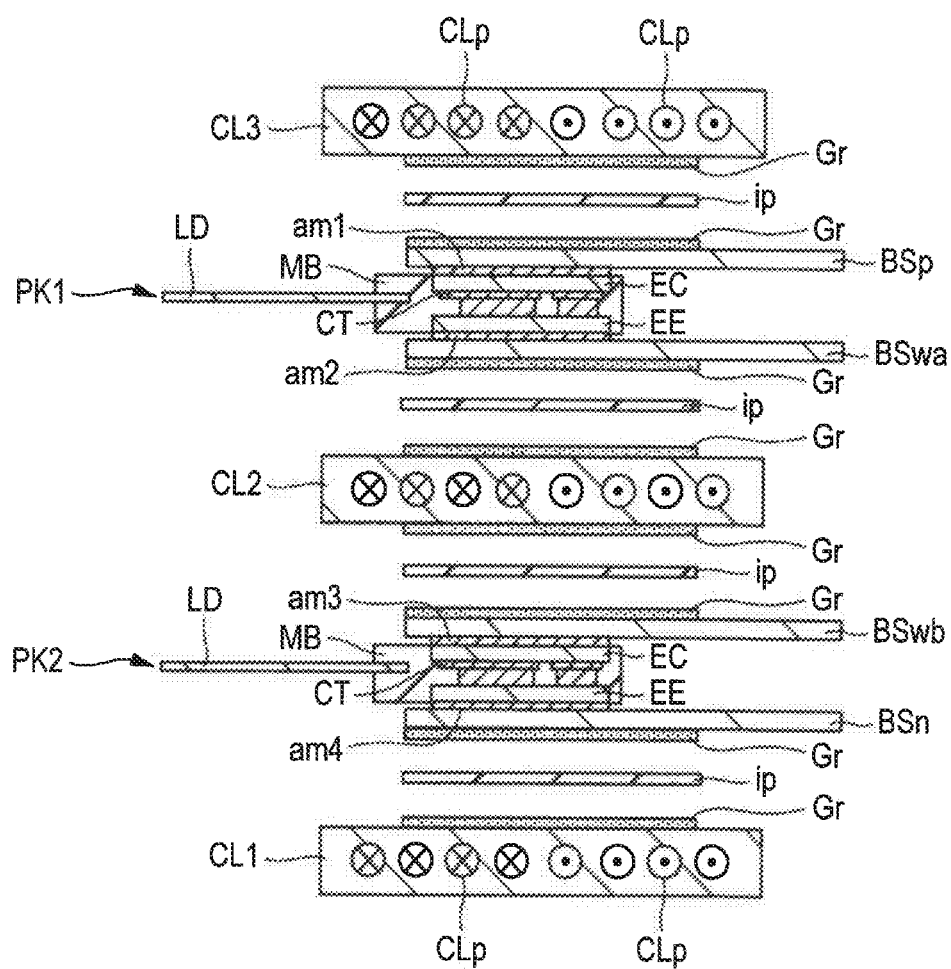
Figure 36:
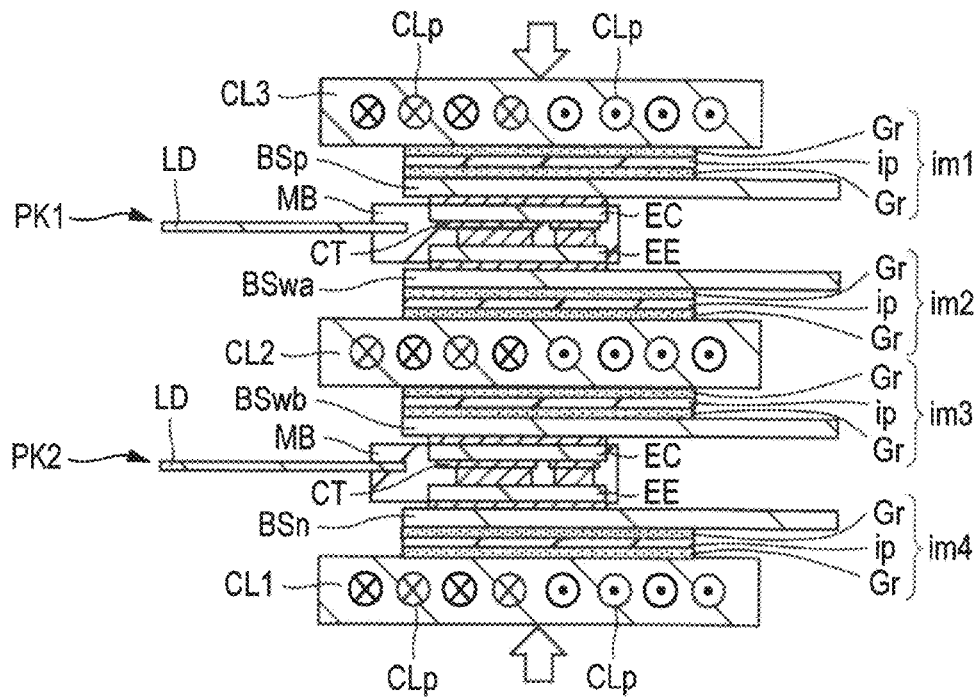
Figure 37:
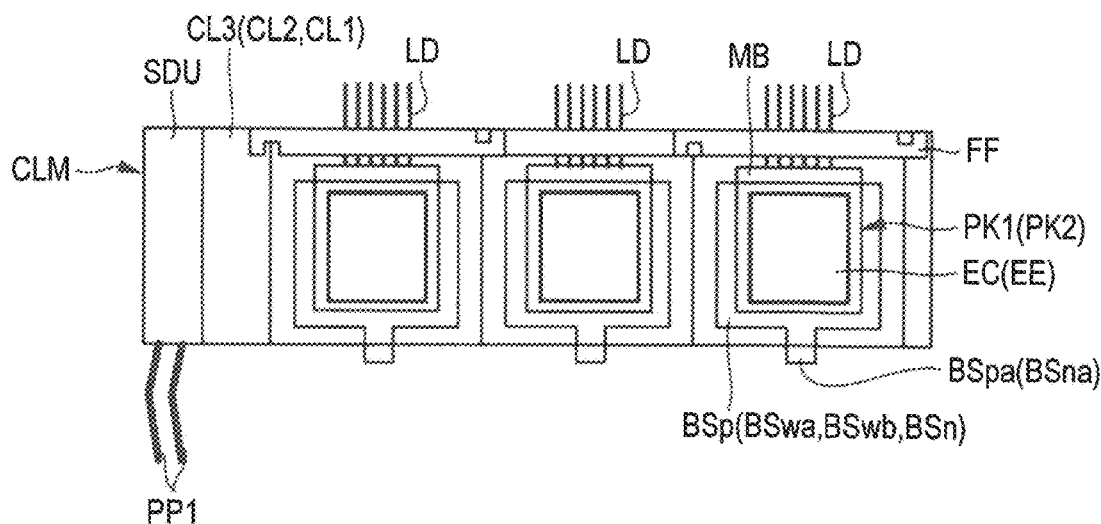
Figure 38:
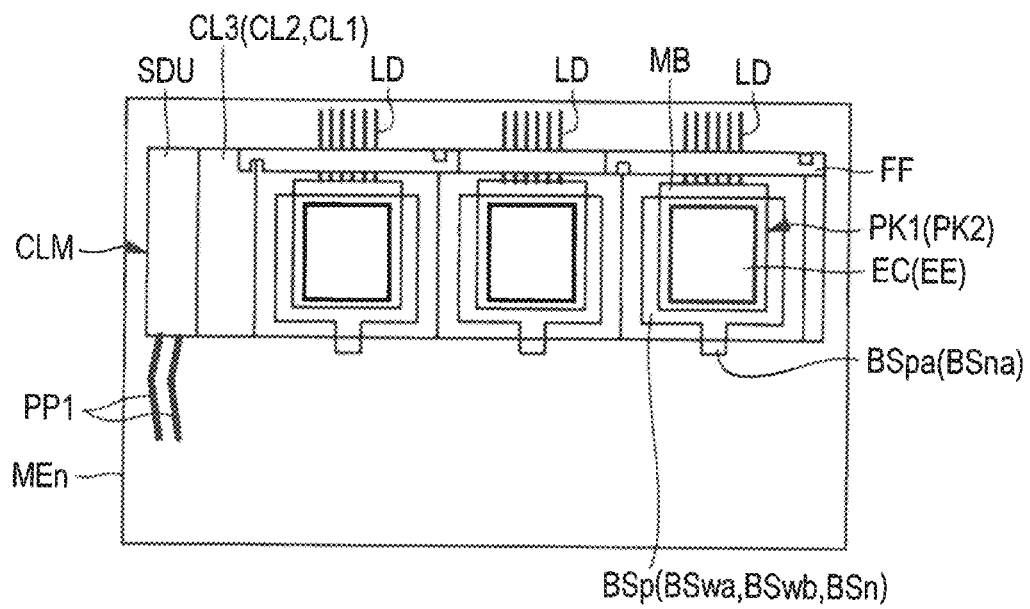
Figure 39:
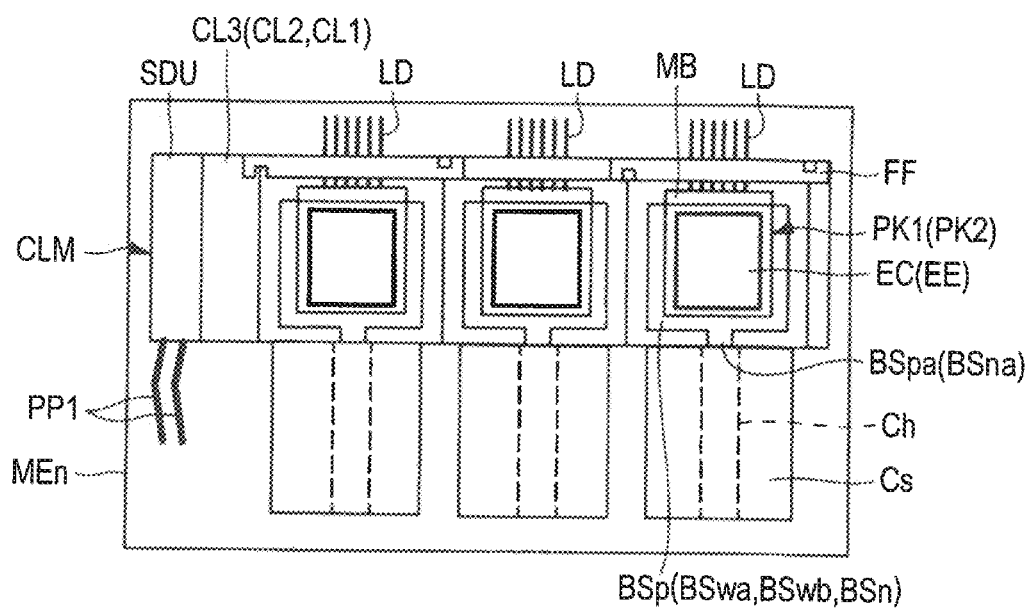
Figure 40:
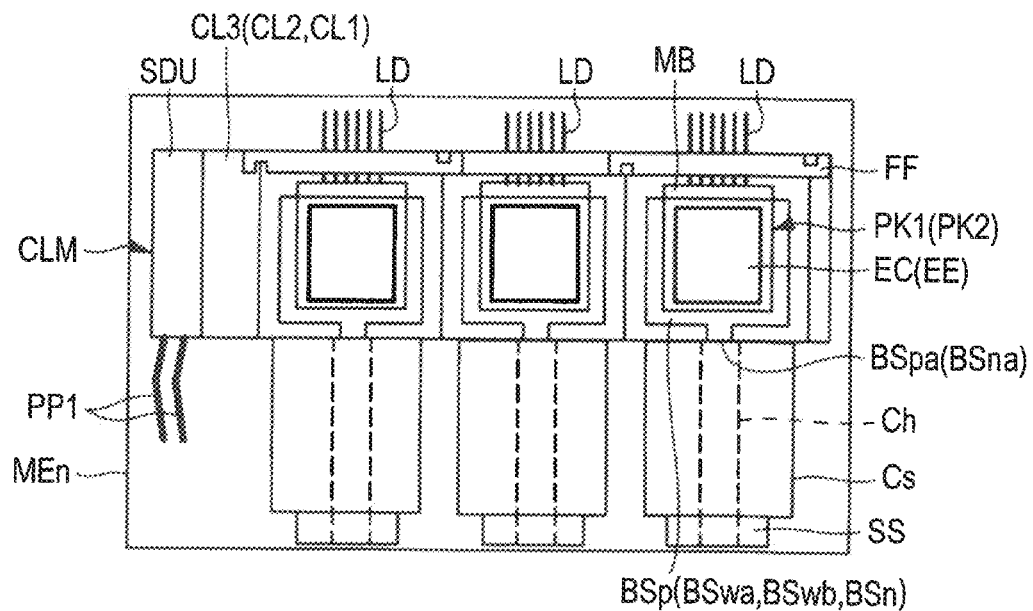
Figure 41:
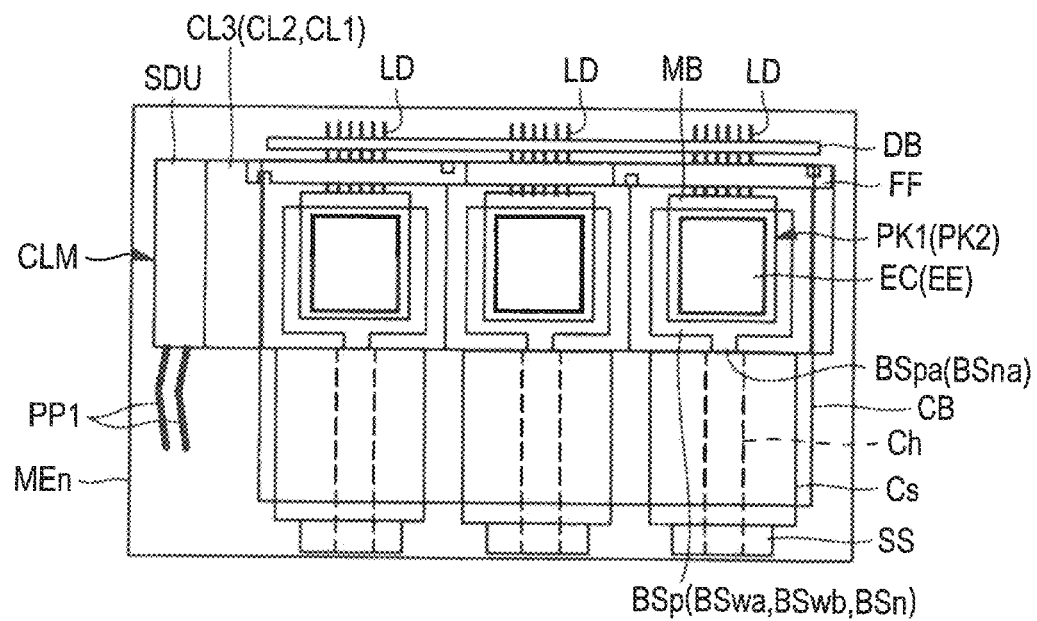
Figure 42:
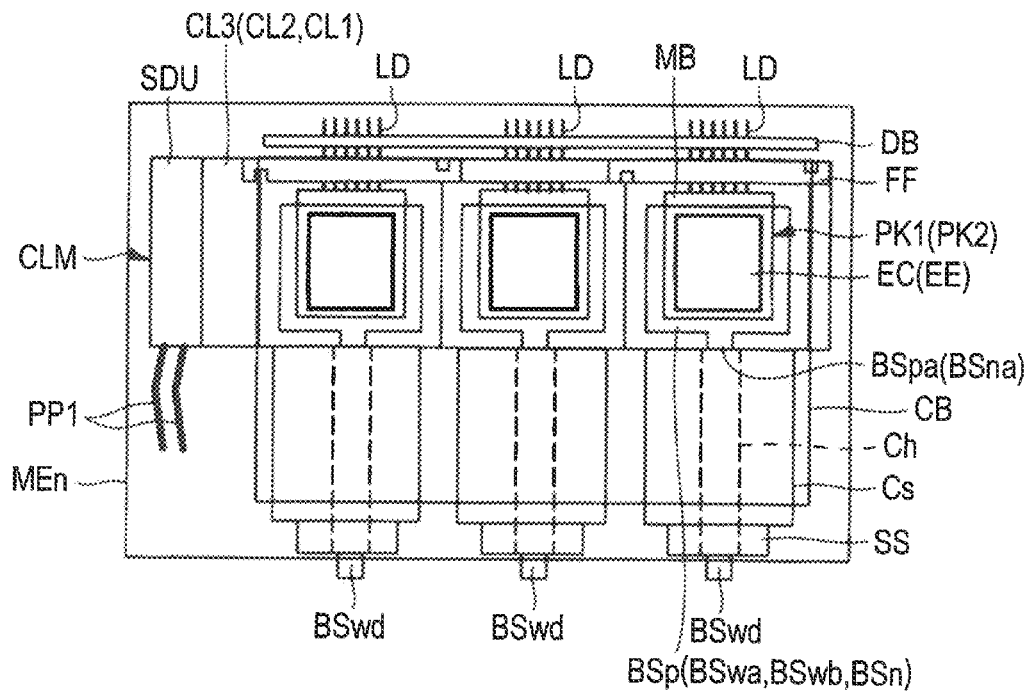
Figure 43:
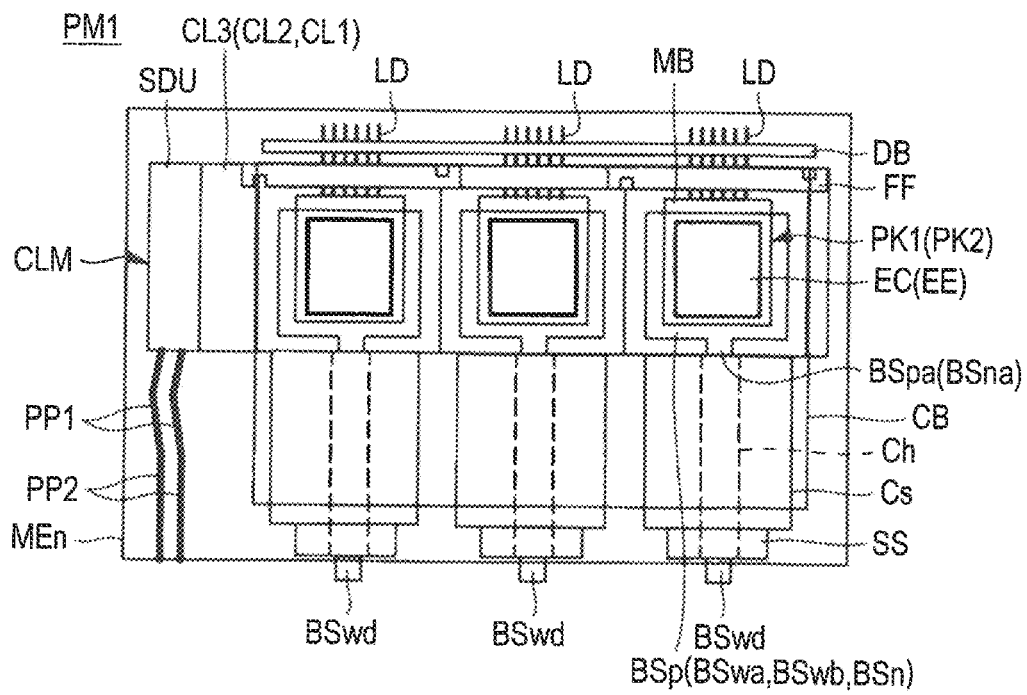
Figure 44:
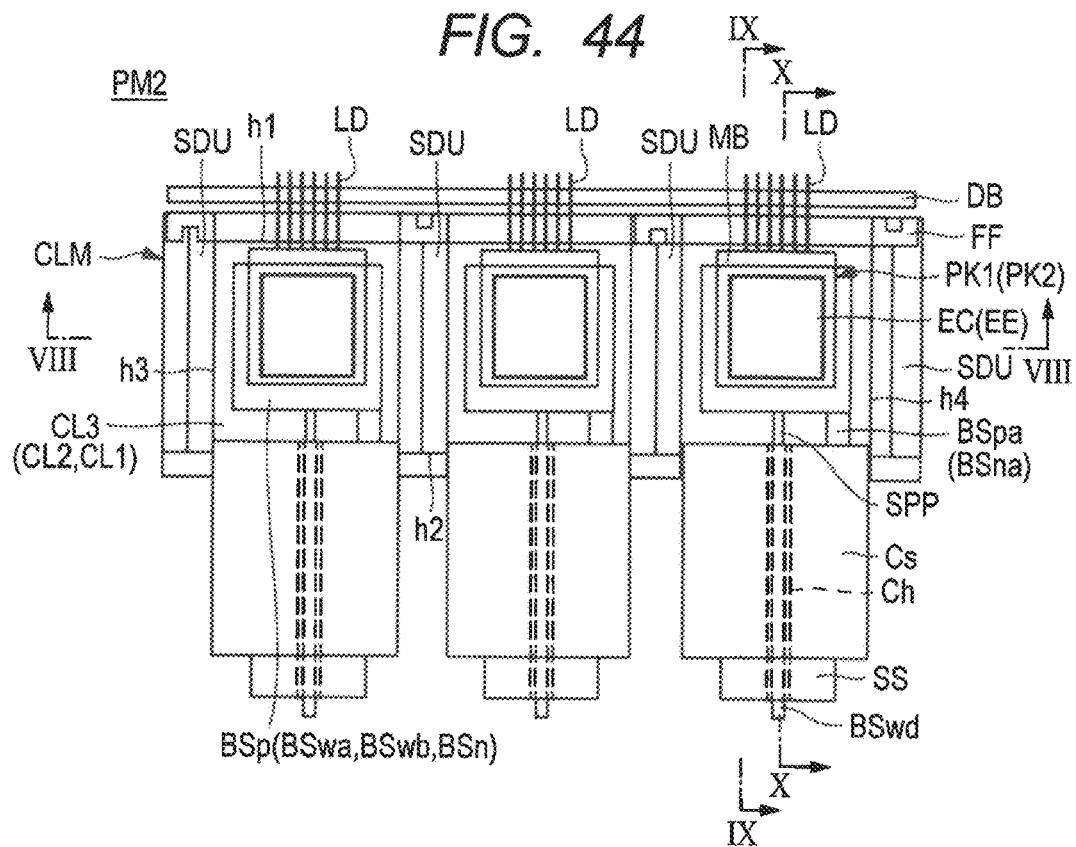
Figure 45:
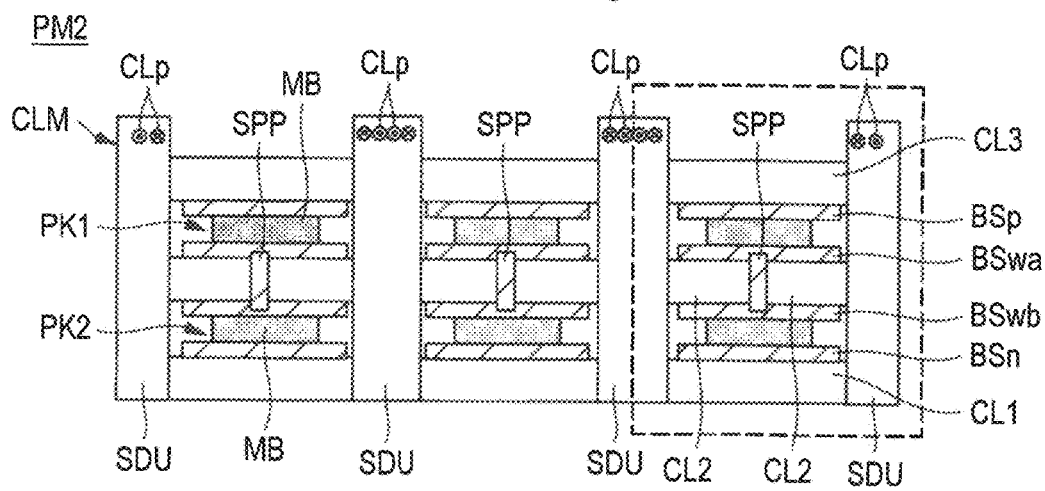
Figure 46:
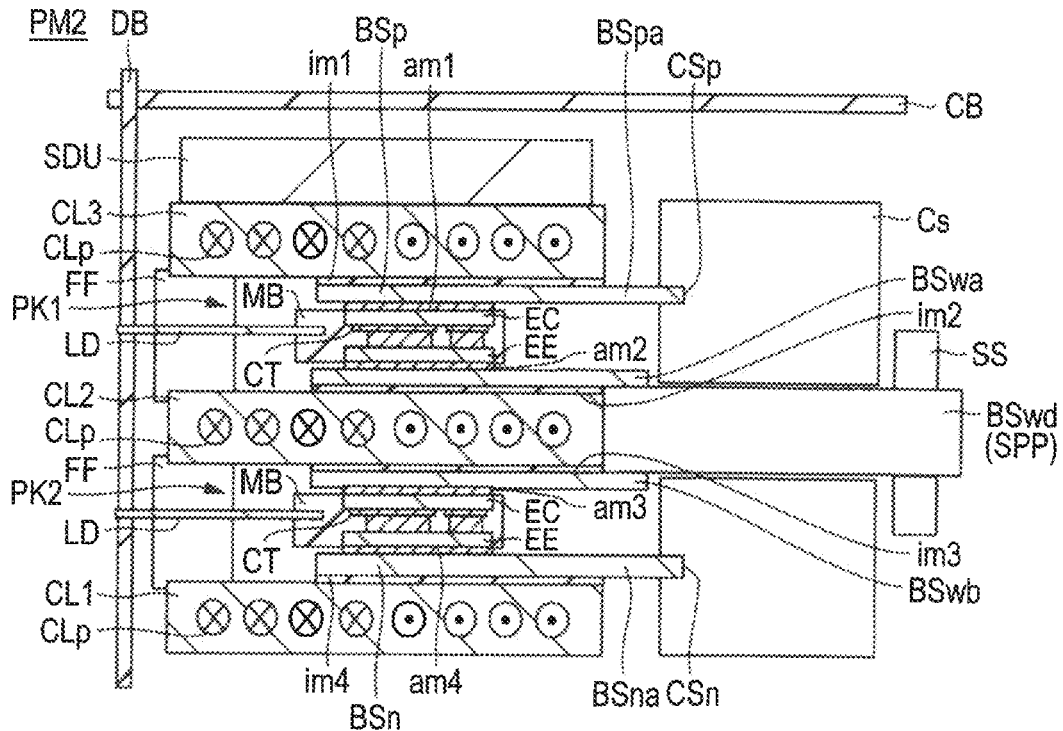
Figure 47:
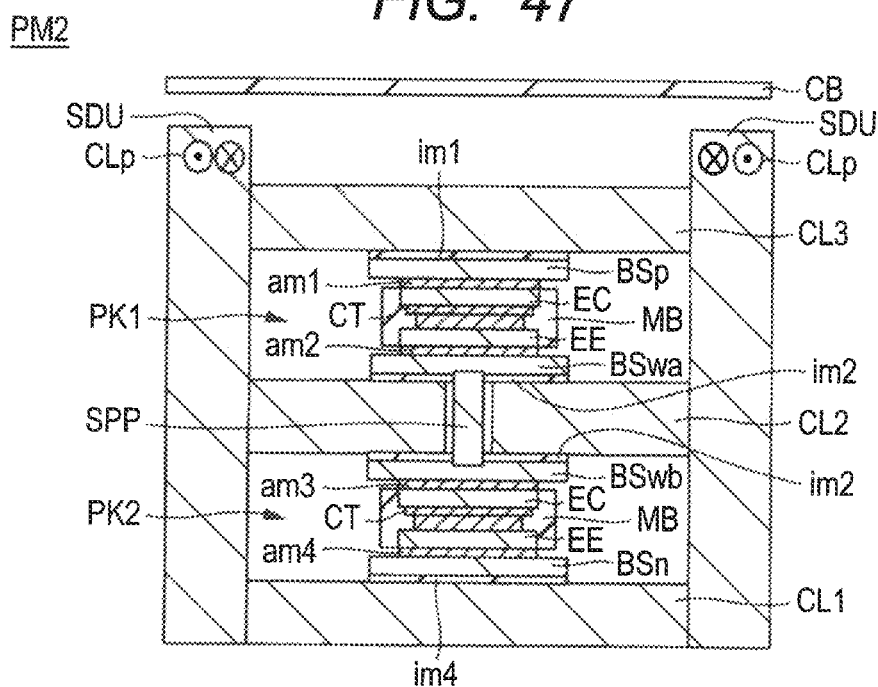
Figure 48:
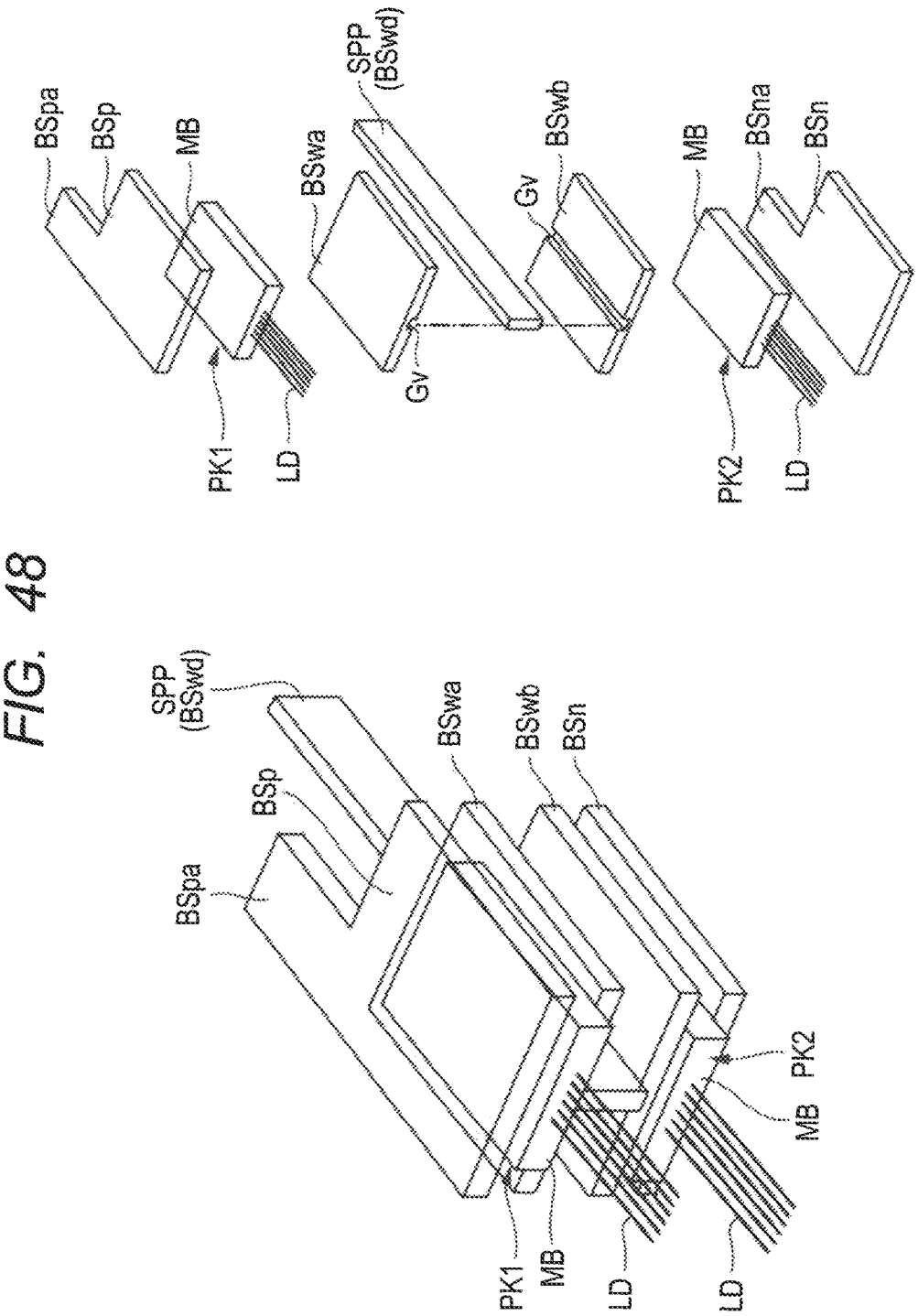
Figure 49:
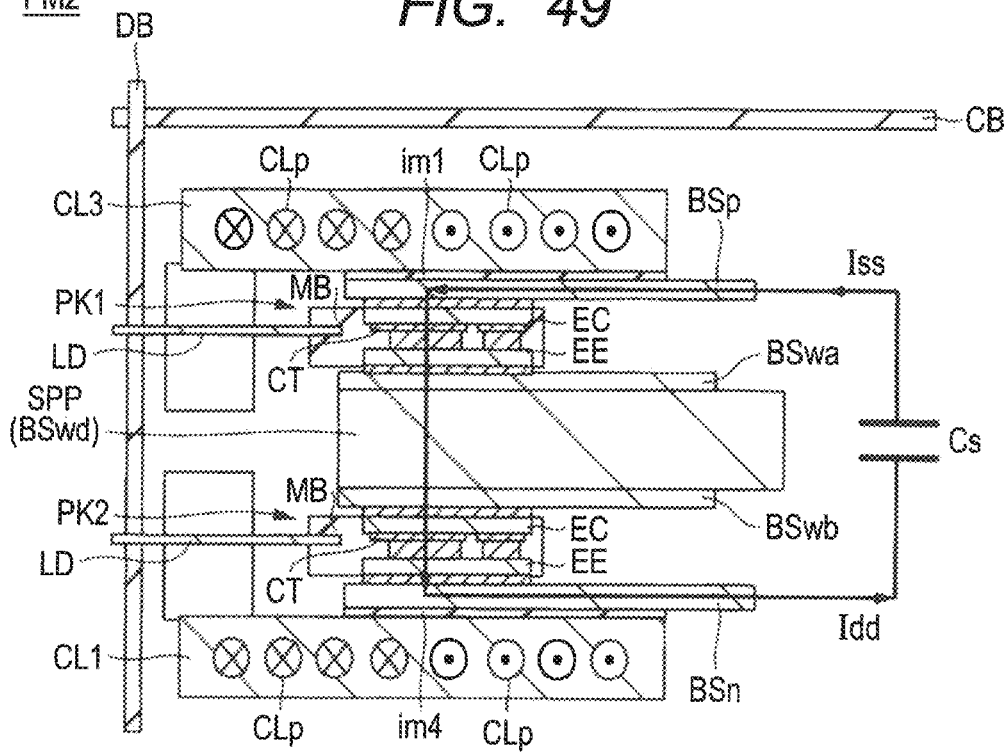
Figure 50:
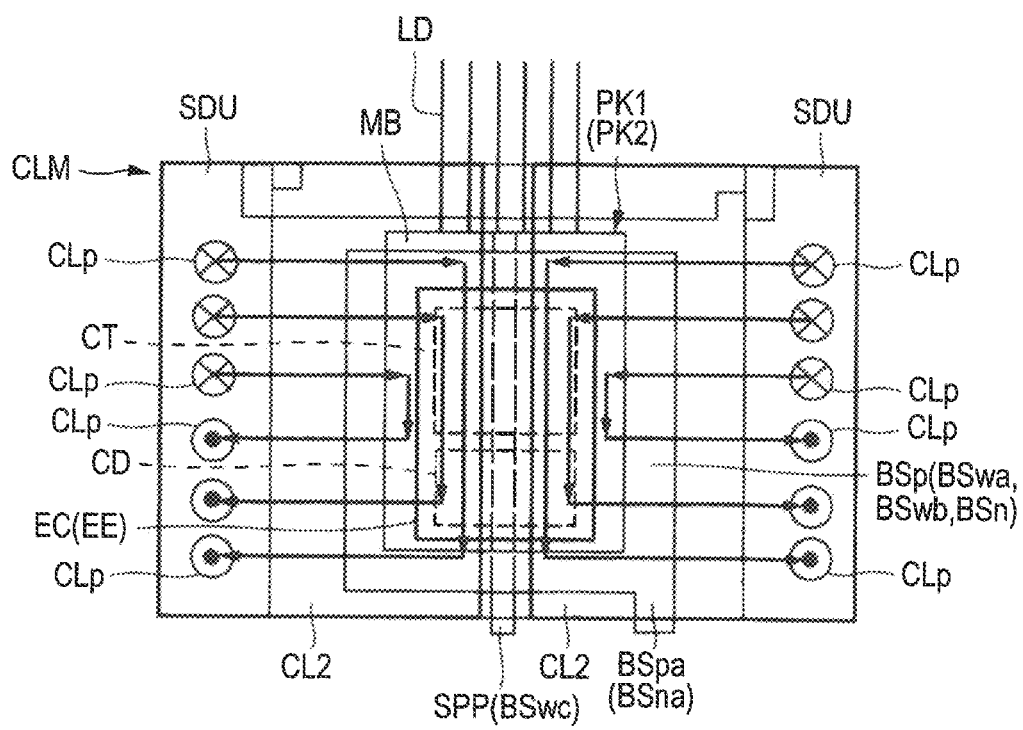
Figure 51:
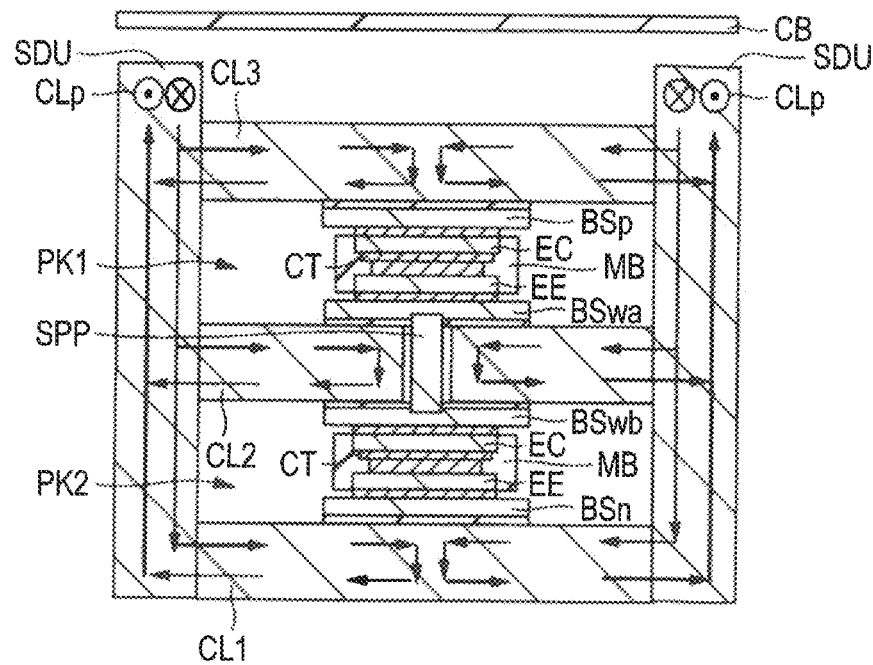
Figure 52:
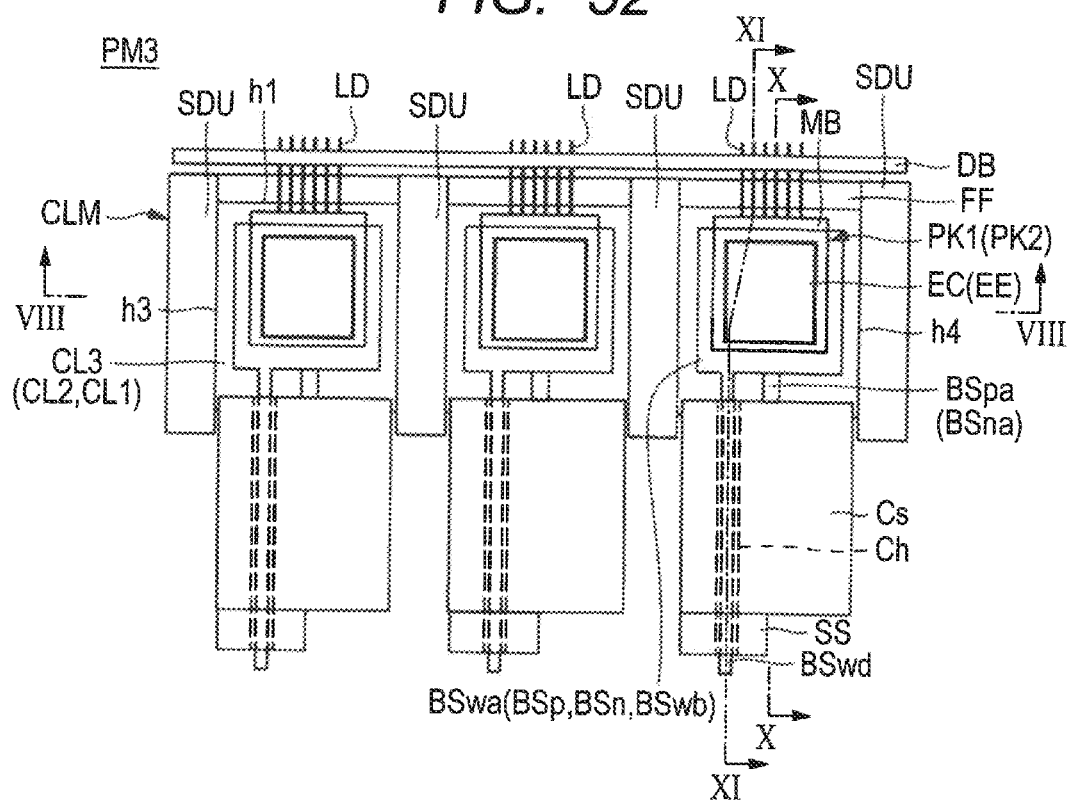
Figure 53:
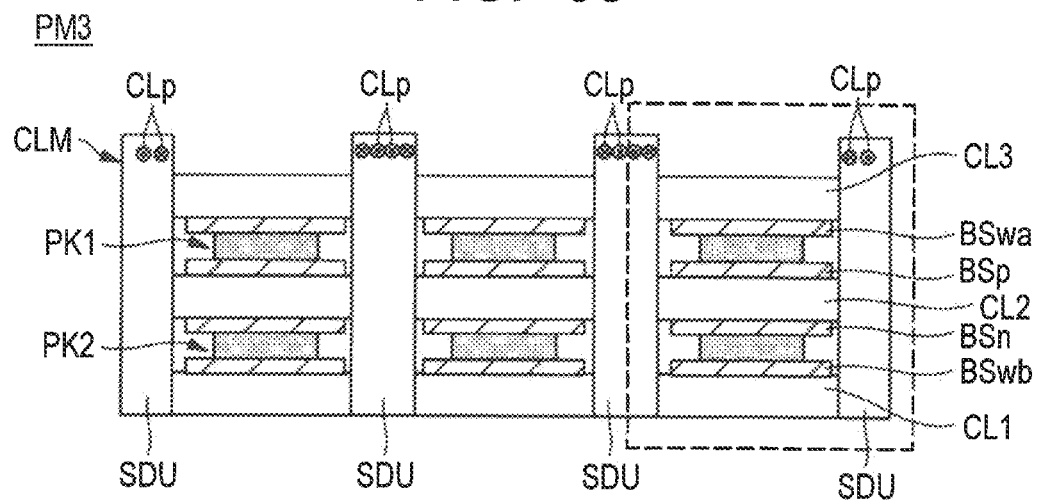
Figure 54:
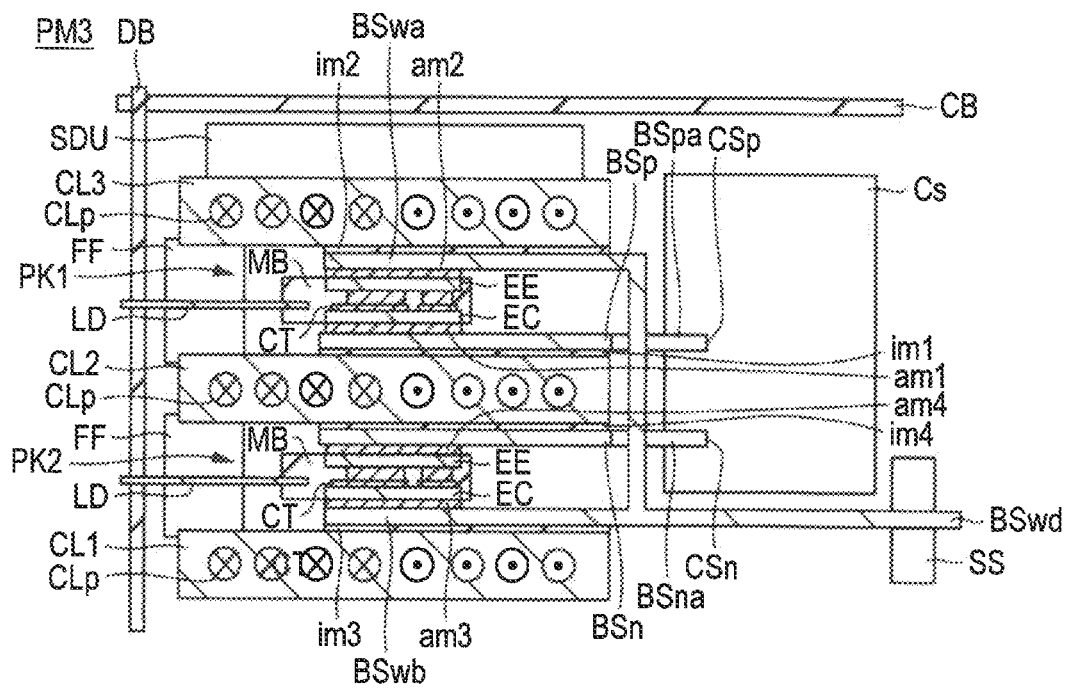
Figure 55:
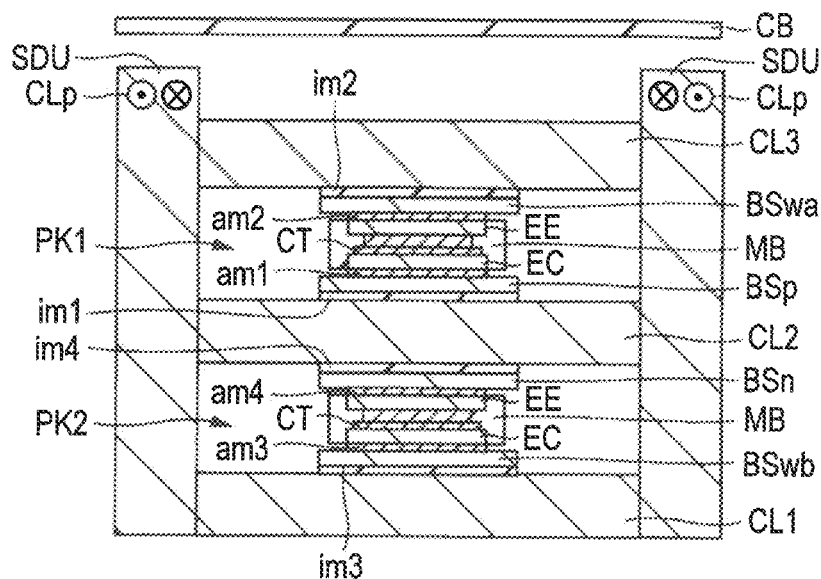
Figure 56:
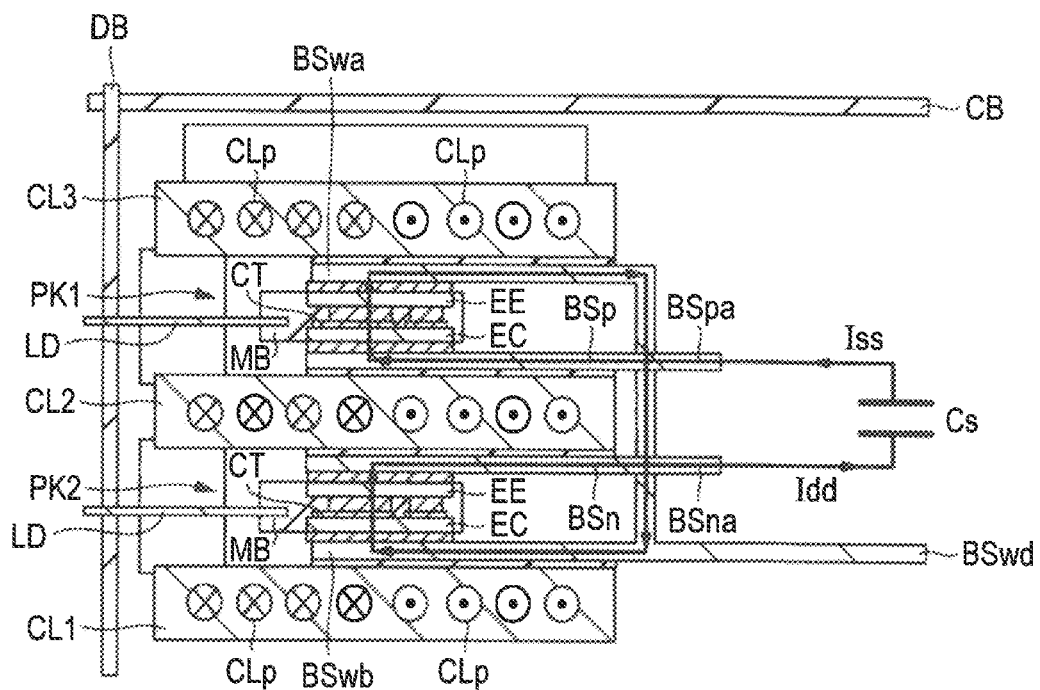
Figure 57:
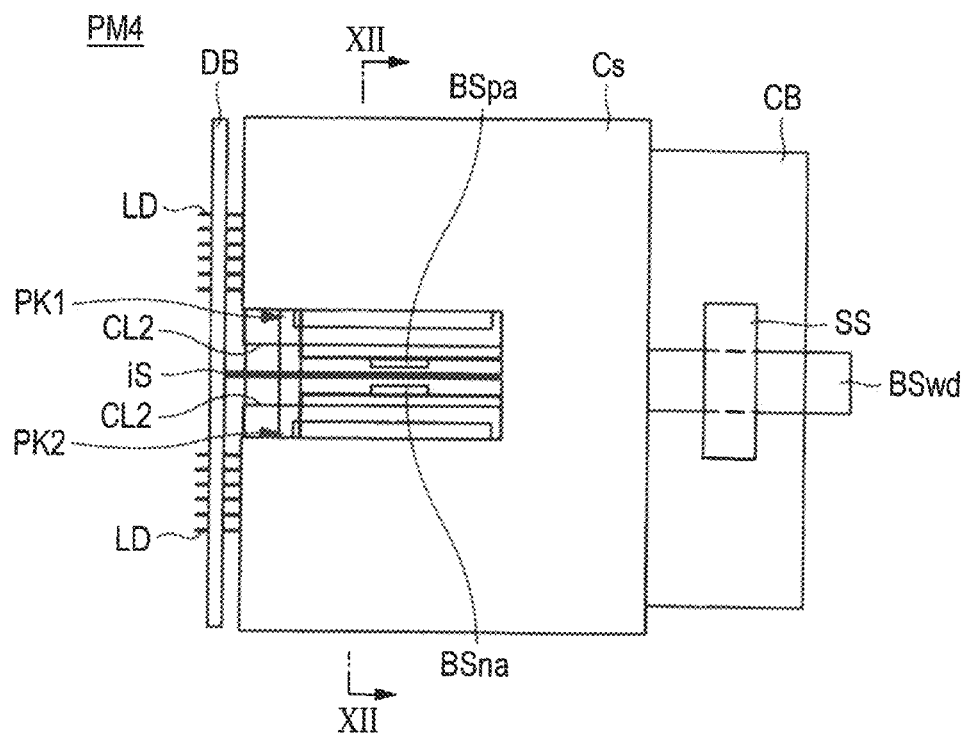
Figure 58:
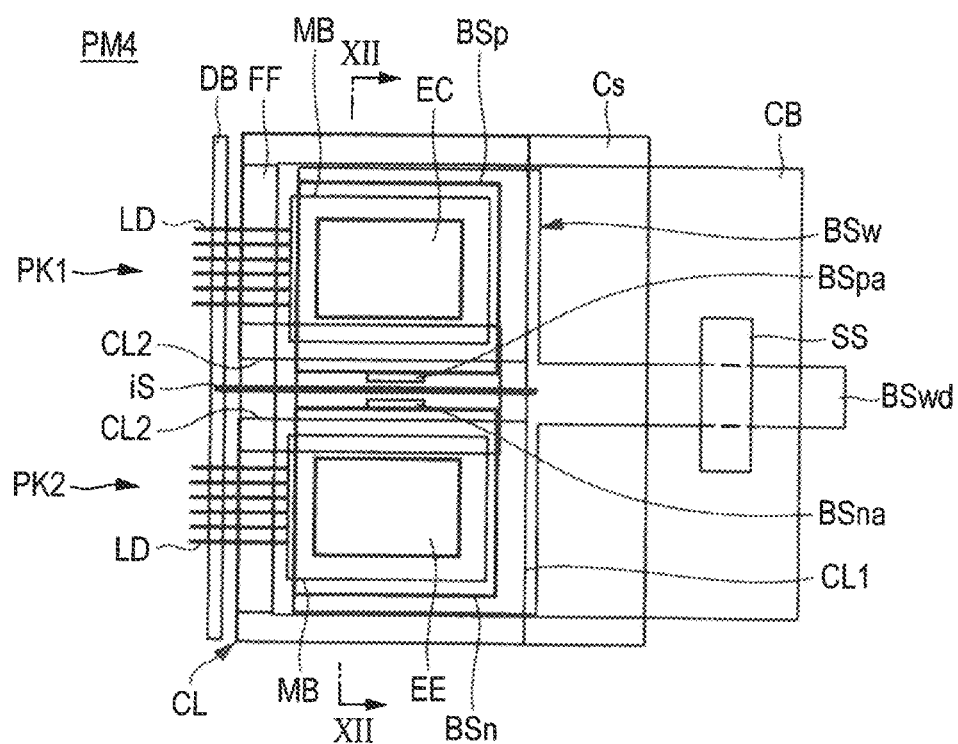
Figure 59:
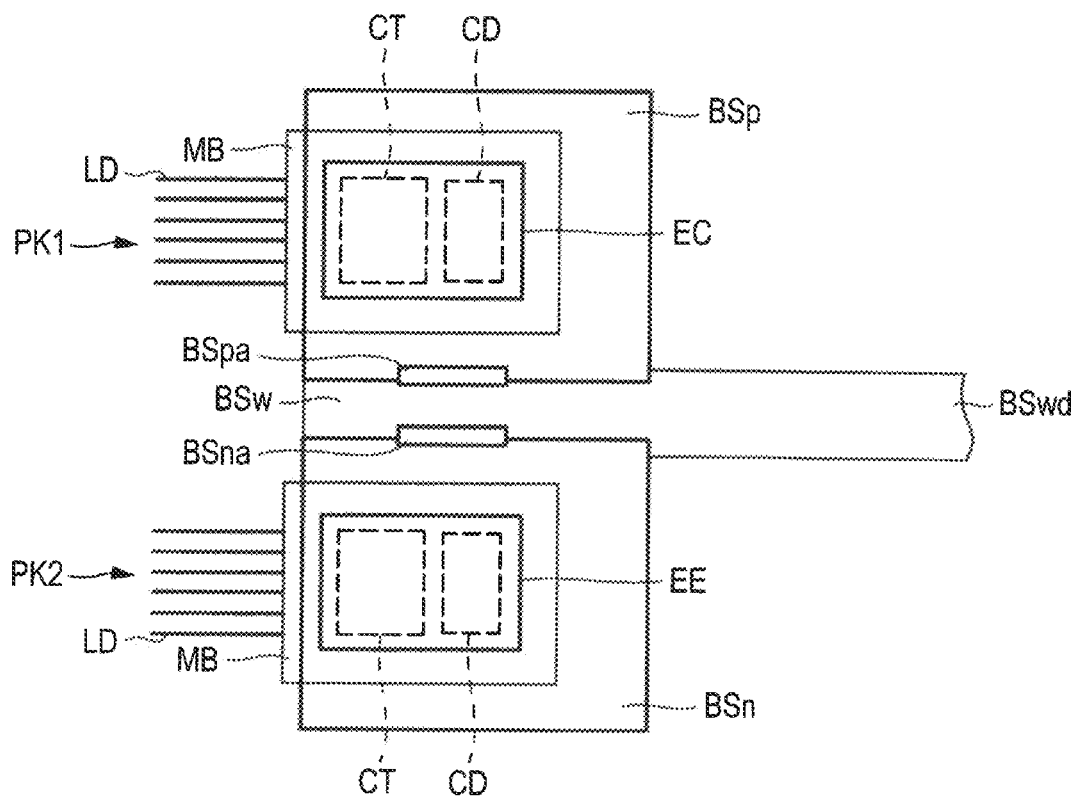
Figure 60:
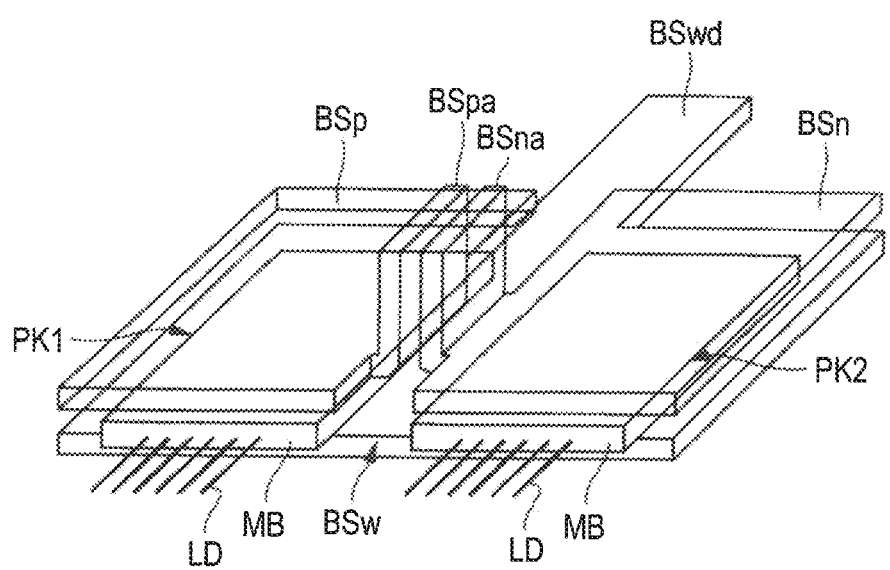
Figure 61:
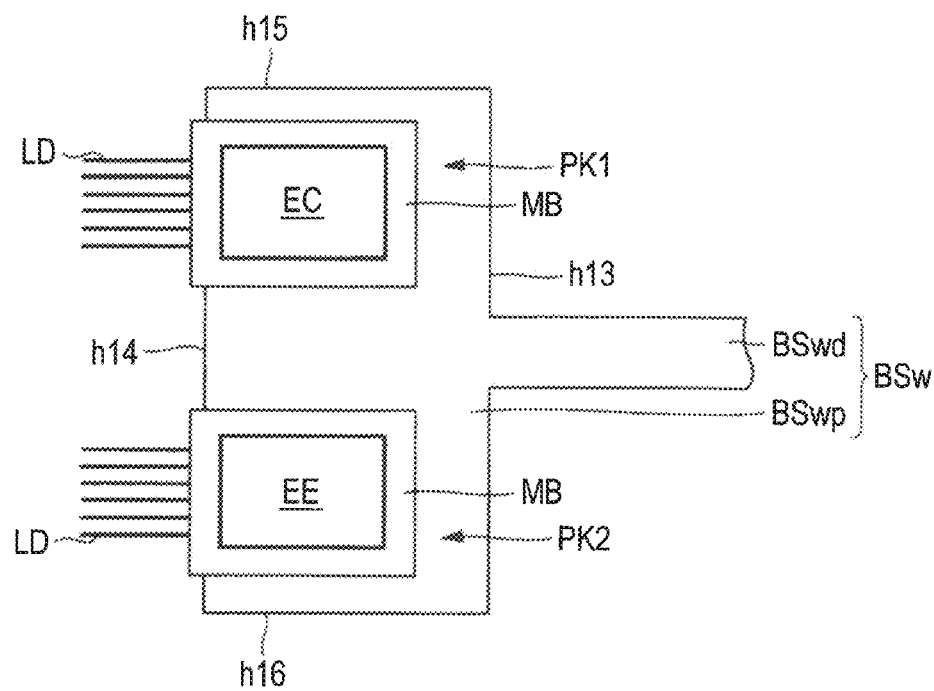
Figure 62:
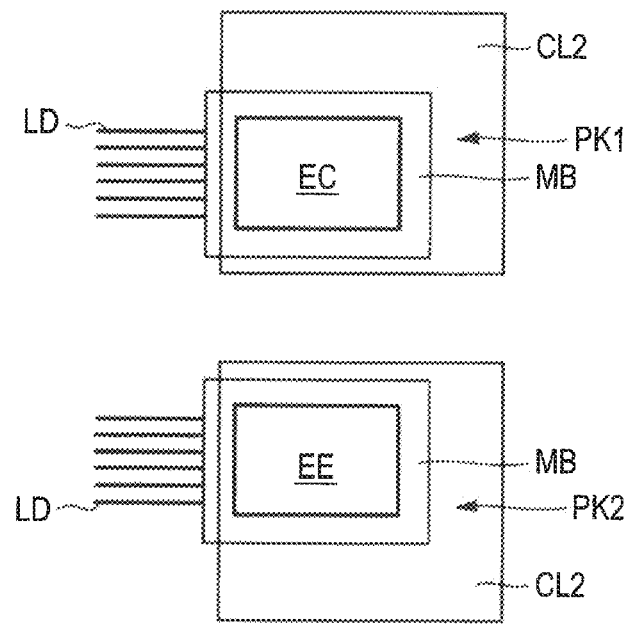
Figure 63:
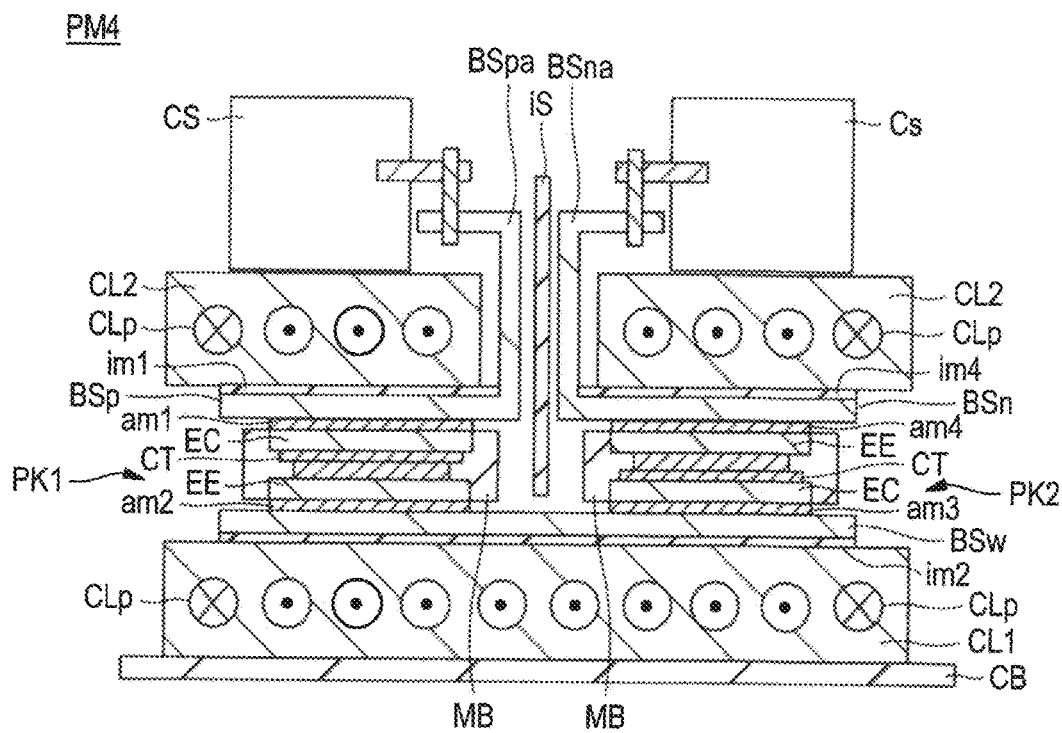
Figure 64:
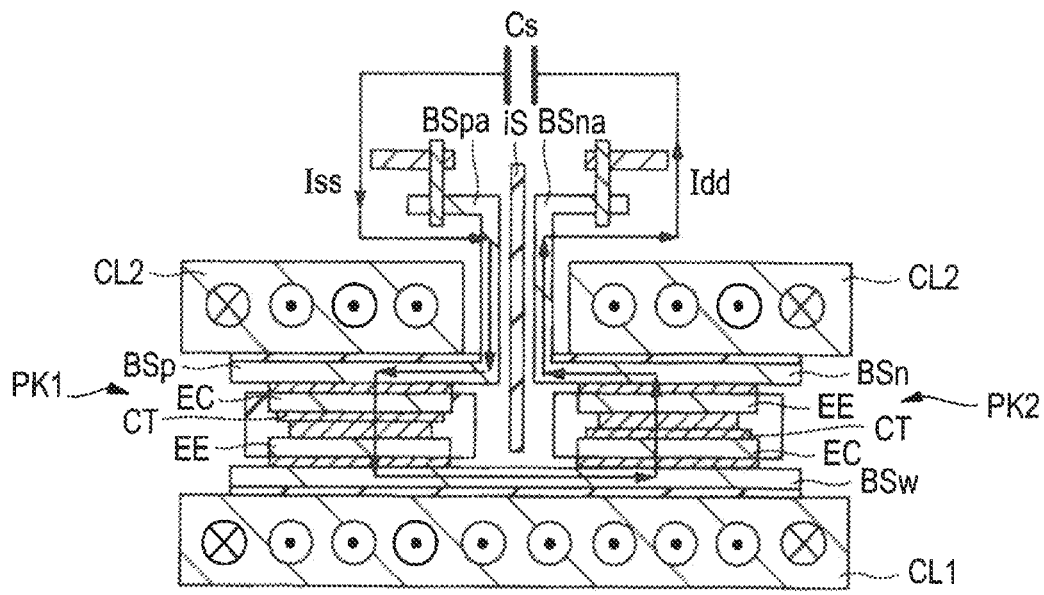
Figure 65:
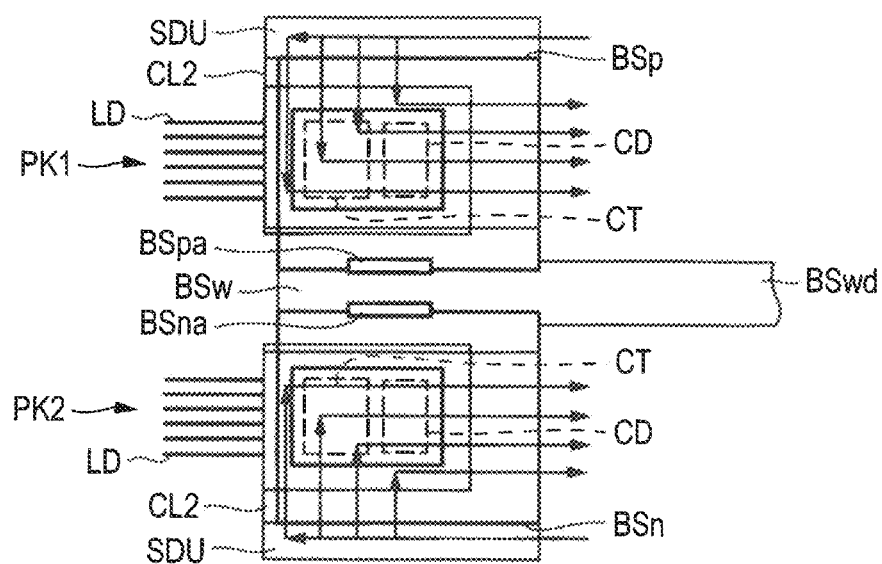
Figure 66:
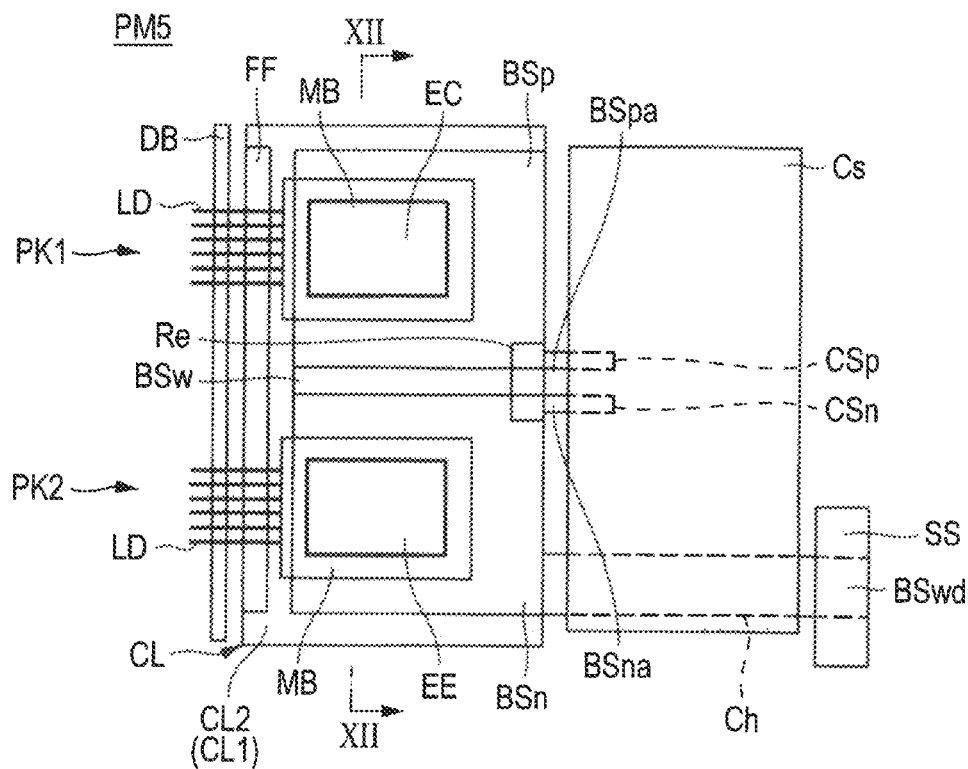
Figure 67:
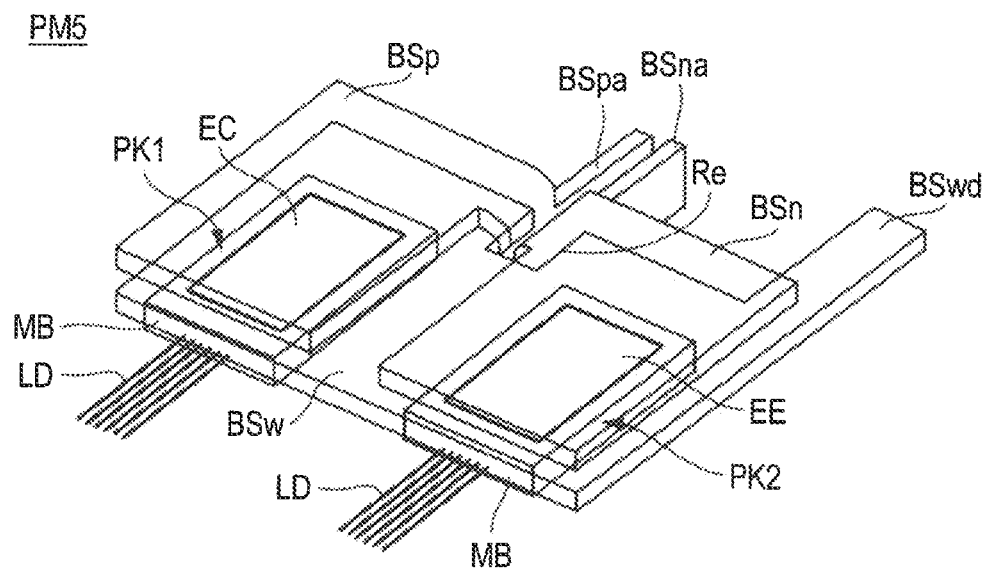
Figure 68:
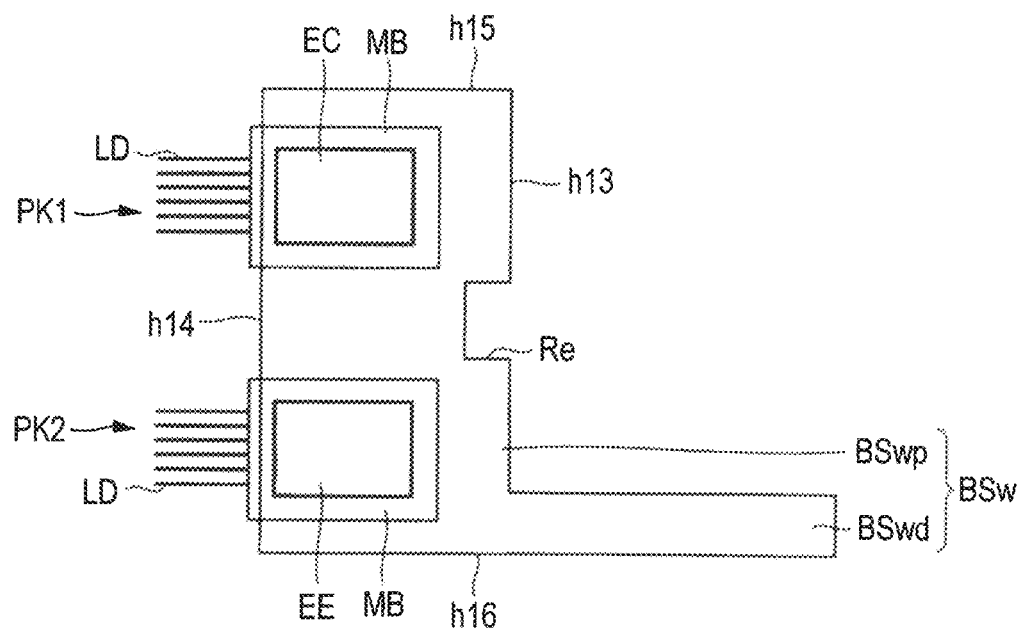
Figure 69:
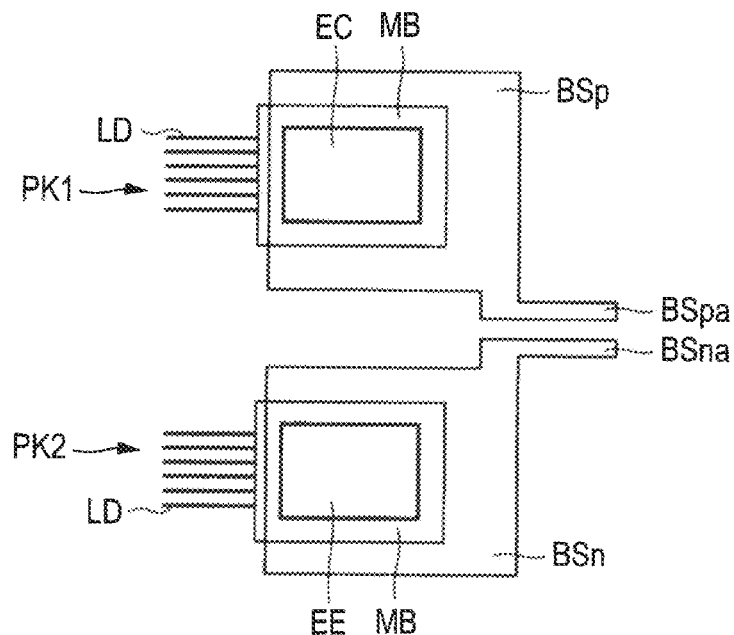
Figure 70:
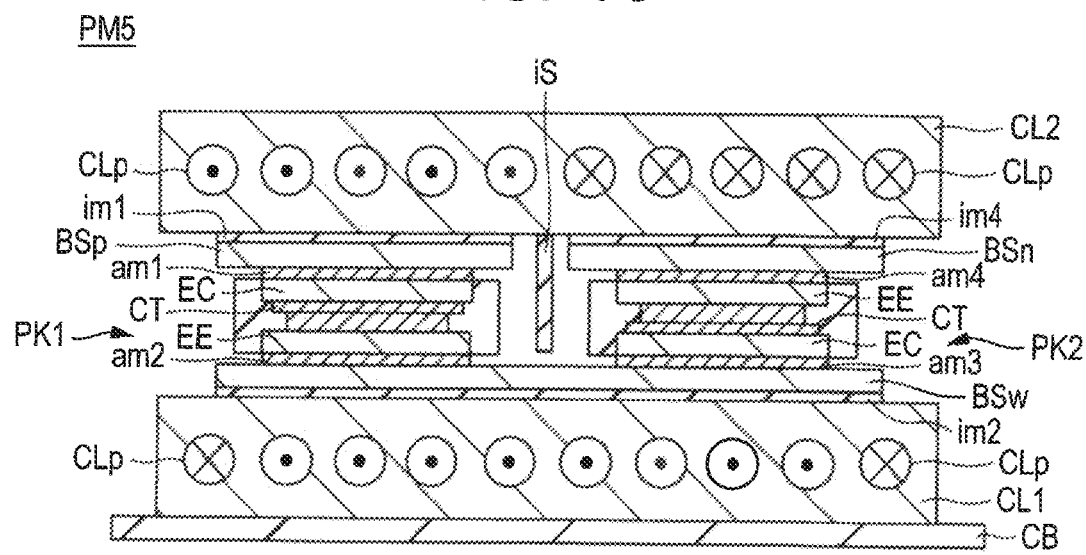
Figure 71:
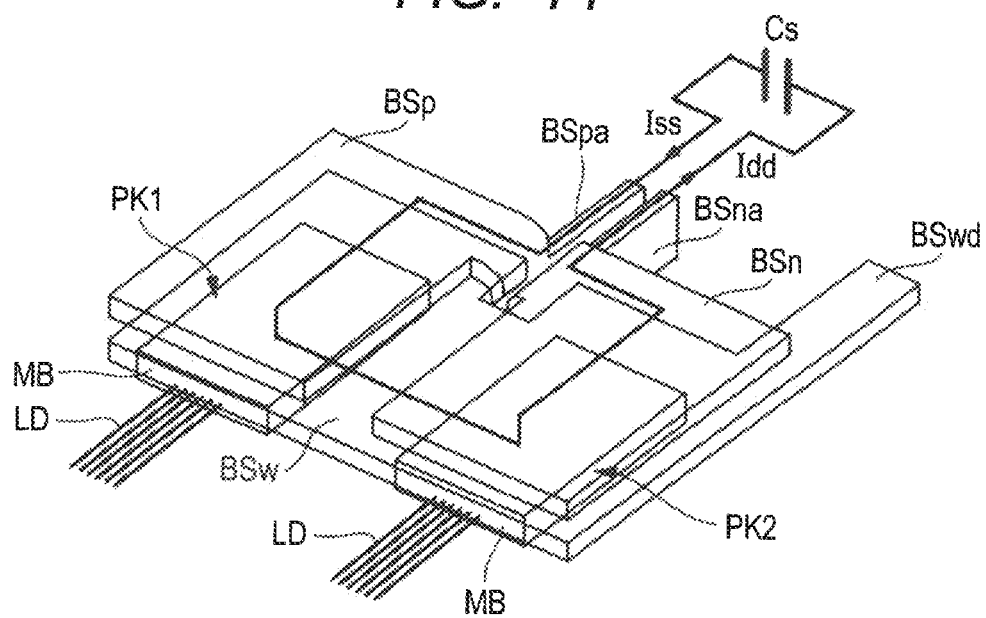

The left side of FIG. 7 shows an illustrative view of a heat dissipation state in the heat dissipation structure studied by the present inventors, while the right side of FIG. 7 shows a view of a heat distribution in the heat dissipation structure on the left side of FIG. 7;

The left side of FIG. 8 shows an illustrative view of a heat dissipation state in the heat dissipation structure in FIG. 6, while the right side of FIG. 8 shows a view of a heat distribution in the heat dissipation structure on the left side of FIG. 8;

FIG. 9 is a main-portion circuit diagram of a motor drive system having a semiconductor module in a first embodiment;

FIG. 10 is a circuit diagram of a half-bridge circuit included in a three-phase inverter circuit in the motor drive system in FIG. 9;

The left side of FIG. 11 shows a plan view of a package according to the first embodiment, while the right side of FIG. 11 shows a plan view of the opposite surface of the package on the left side of FIG. 11;

FIG. 12 is a transparent plan view of the package in FIG. 11;

FIG. 13 is a cross-sectional view along the line III-III on the left side of FIG. 11;

FIG. 14 is an enlarged cross-sectional view of the region enclosed in the broken line in FIG. 13;

The left side of FIG. 15 shows a plan view of the main surface of a semiconductor chip in which a transistor is formed, while the right side of FIG. 15 shows a plan view of the main surface of the semiconductor chip opposite to the main surface thereof on the left side of FIG. 15;

FIG. 16 is a main-portion cross-sectional view of the semiconductor chip in FIG. 15;

The left side of FIG. 17 shows a plan view of the main surface of a semiconductor chip in which a diode is formed, while the right side of FIG. 17 shows a plan view of the main surface of the semiconductor chip opposite to the main surface thereof on the left side of FIG. 17;

FIG. 18 is a main-portion cross-sectional view of the semiconductor chip in FIG. 17;

FIG. 19 is a plan view of the semiconductor module in the first embodiment;

FIG. 20 is a cross-sectional view along the line IV-IV in FIG. 19;

FIG. 21 is a front view of a capacitive element included in the semiconductor module in FIG. 19;

FIG. 22 is a cross-sectional view along the line V-V in FIG. 19;

FIG. 23 is an enlarged cross-sectional view of the region enclosed in the broken line in FIG. 20;

The left and right sides of FIG. 24 show main-portion plan views of each the unit structures of the semiconductor module in FIG. 19;

FIG. 25 is a main-portion enlarged plan view of the unit structure of the semiconductor module in FIG. 19;

FIG. 26 is a schematic main-portion cross-sectional view along the line V-V in FIG. 19;

FIG. 27 is a plan view showing an example of the circulation of cooling water in the semiconductor module in FIG. 19;

FIG. 28 is a main-portion enlarged plan view of each of the unit structures of the semiconductor module in FIG. 27;

FIG. 29 is an illustrative view showing the flow of the manufacturing process of the package included in the semiconductor module in FIG. 19;

FIG. 30 is an illustrative view showing the flow of the manufacturing process of the package after the step in FIG. 29;

FIG. 31 is an illustrative view showing the flow of the manufacturing process of the package after the step in FIG. 30;

FIG. 32 is an illustrative view showing the flow of the manufacturing process of the package after the step in FIG. 31;

FIG. 33 is an illustrative view showing an assembly flow for the semiconductor module in FIG. 19;

FIG. 34 is a main-portion cross-sectional view of the semiconductor module in FIG. 19 during the assembly process thereof;

FIG. 35 is a main-portion cross-sectional view of the semiconductor module after the step in FIG. 34 during the assembly process thereof;

FIG. 36 is a main-portion cross-sectional view of the semiconductor module after the step in FIG. 35 during the assembly process thereof;

FIG. 37 is a plan view of the semiconductor module after the step in FIG. 36 during the assembly process thereof;

FIG. 38 is a plan view of the semiconductor module after the step in FIG. 37 during the assembly process thereof;

FIG. 39 is a plan view of the semiconductor module after the step in FIG. 38 during the assembly process thereof;

FIG. 40 is a plan view of the semiconductor module after the step in FIG. 39 during the assembly process thereof;

FIG. 41 is a plan view of the semiconductor module after the step in FIG. 40 during the assembly process thereof;

FIG. 42 is a plan view of the semiconductor module after the step in FIG. 41 during the assembly process thereof;

FIG. 43 is a plan view of the semiconductor module after the step in FIG. 42 during the assembly process thereof;

FIG. 44 is a plan view of a semiconductor module in a first modification of the first embodiment;

FIG. 45 is a cross-sectional view along the line VIII-VIII in FIG. 44;

FIG. 46 is a cross-sectional view along the line IX-IX in FIG. 44;

FIG. 47 is an enlarged cross-sectional view of the region enclosed in the broken line in FIG. 45;

The left side of FIG. 48 shows a main-portion perspective view of each of the unit structures of the semiconductor module in FIG. 44, while the right side of FIG. 48 shows a main-portion exploded perspective view of the unit structure of the semiconductor module on the left side of FIG. 48;

FIG. 49 is a schematic main-portion cross-sectional view along the line X-X in FIG. 44;

FIG. 50 is a main-portion enlarged plan view of the unit structure of the semiconductor module in FIG. 44, which shows an example of the circulation of cooling water in the semiconductor module;

FIG. 51 is a main-portion enlarged cross-sectional view of the unit structure of the semiconductor module in FIG. 44, which shows an example of the circulation of cooling water in the semiconductor module;

FIG. 52 is a plan view of a semiconductor module in a second modification of the first embodiment;

FIG. 53 is a cross-sectional view along the line VIII-VIII in FIG. 52;

FIG. 54 is a cross-sectional view along the line XI-XI in FIG. 52;

FIG. 55 is an enlarged cross-sectional view of the region enclosed in the broken line in FIG. 53;

FIG. 56 is a schematic main-portion cross-sectional view along the line X-X in FIG. 52;

FIG. 57 is a plan view of each of the unit structures of a semiconductor module according to a second embodiment;

FIG. 58 is a transparent plan view of the unit structure of the semiconductor module in FIG. 57;

FIG. 59 is a main-portion enlarged plan view of the semiconductor module in FIG. 58;

FIG. 60 is a schematic perspective view of the semiconductor module in FIG. 59;

FIG. 61 is a main-portion plan view showing packages and an output-terminal bus bar plate which are included in the semiconductor module in FIG. 57 in an extracted manner;

FIG. 62 is a main-portion plan view showing the packages and an upper cooling plate which are included in the semiconductor module in FIG. 57 in an extracted manner;

FIG. 63 is a cross-sectional view along the line XII-XII in FIGS. 57 and 58;

FIG. 64 is a schematic main-portion cross-sectional view along the line XII-XII in FIGS. 57 and 58;

FIG. 65 is a main-portion plan view of the unit structure of the semiconductor module shown in FIG. 57, which shows an example of the circulation of cooling water in the semiconductor module;

FIG. 66 is a plan view of each of the unit structures of a semiconductor module according to a first modification of the second embodiment;

FIG. 67 is a main-portion perspective view of the semiconductor module in FIG. 66;

FIG. 68 is a main-portion plan view showing packages and an output-terminal bus bar plate which are included in the semiconductor module in FIG. 66 in an extracted manner;

FIG. 69 is a main-portion plan view showing the packages, a P-terminal bus bar plate, and an N-terminal bus bar plate which are included in the semiconductor module in FIG. 66 in an extracted manner;

FIG. 70 is a cross-sectional view along the line XII-XII in FIG. 66; and FIG. 71 is a schematic main-portion perspective view of the semiconductor module in FIG. 66.

DETAILED DESCRIPTION

Explanation of Description Form, Basic Terminology, and Use Thereof in Present Invention In the present invention, if necessary for the sake of convenience, an embodiment will be described by being divided into a plurality of sections or the like. However, they are by no means independent of or distinct from each other unless particularly explicitly described otherwise, and one of the individual parts of a single example is details, modifications, and so forth of part or the whole of the others irrespective the order in which they are described. In principle, a repetitive description of like parts will be omitted. Also, each component in the embodiment is not indispensable unless particularly explicitly described otherwise, unless the component is theoretically limited to a specific number, or unless it is obvious from the context that the component is indispensable.

Likewise, even when such wording as "X comprised of B" is used in association with a material, a composition, or the like in the description of the embodiments or the like, it is not intended to exclude a material, a composition, or the like which contains an element other than "B" unless particularly explicitly described otherwise or unless it is obvious from the context that it excludes such a material, a composition, or the like. For example, when a component is mentioned, the wording means "X containing B as a main component" or the like. It will be appreciated that, even when, e.g., a "silicon member" or the like is mentioned, it is not limited to pure silicon, and a member containing a SiGe (silicon germanium) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as a main component unless it is particularly explicitly described otherwise.

Further, when a specific numerical value or numerical amount is mentioned, it may be either more or less than the specific numerical value or numerical amount unless particularly explicitly described otherwise, unless the numerical value or numerical amount is theoretically limited to the number, or unless it is obvious from the context that the numeral value or numerical amount is limited to the number.

In the individual drawings for the embodiments, the same or like parts are designated by the same or similar symbols or reference numerals, and the description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even when a hole is two-dimensionally closed, the background outline thereof may be omitted when it is obvious from the description or the like that the hole is two-dimensionally closed, and so forth. On the other hand, even though not shown in a cross section, a portion other than a vacant space may be hatched with lines or dots to clearly show that the hatched portion is not a vacant space or clearly show the boundary of a region.

In the present specification, an "electronic component" means a component using electrons. In particular, a component using electrons in a semiconductor is a "semiconductor component". Examples of the "semiconductor component" include a semiconductor chip. Accordingly, the term "semiconductor component" includes the "semiconductor chip", and a higher-level concept of the "semiconductor component" is the "electronic component".

Also, in the present specification, a "semiconductor device" means a structure which includes a semiconductor component and an external coupling terminal electrically coupled to the semiconductor component and in which the semiconductor component is covered with a sealing body. In particular, the "semiconductor device" is configured to be electrically coupleable to an external device via the external coupling terminal.

Also, in the present specification, a "power transistor" means a collection of a plurality of (e.g., several to tens of thousands of) unit transistors (cell transistors) which are coupled in parallel to each other to implement the function of each of the unit transistors even with a current larger than a maximum allowable current for the unit transistor. For example, when the unit transistor functions as a switching element, the "power transistor" serves as a switching element which can be used appropriately even with a current larger than the maximum allowable current for the unit transistor. Examples of the "power transistor" included in the switching element include an IGBT (Insulated Gate Bipolar Transistor), a power MOSFET (Metal Oxide Semiconductor Field Effect Transistor), and a bipolar transistor. In the present specification, the term "power transistor" is used to show an upper-level concept including, e.g., the "power MOSFET", the "IGBT", and the "bipolar transistor". A semiconductor chip including a power transistor may be referred to also as a power semiconductor chip.

<Study by Present Inventors>

In an electric vehicle, a hybrid electric vehicle, a plug-in hybrid electric vehicle, or the like (hereinafter referred to as an electric vehicle or the like), a motor is used as a power source when the electric vehicle or the like is running. To this motor, e.g., a three-phase inverter circuit is electrically coupled to control the operation of the motor. That is, by more finely controlling the voltage and frequency of three-phase AC power supplied to the motor using the three-phase inverter circuit, improvements are achieved in the running property and energy efficiency of the electric vehicle or the like.

Figure 3:
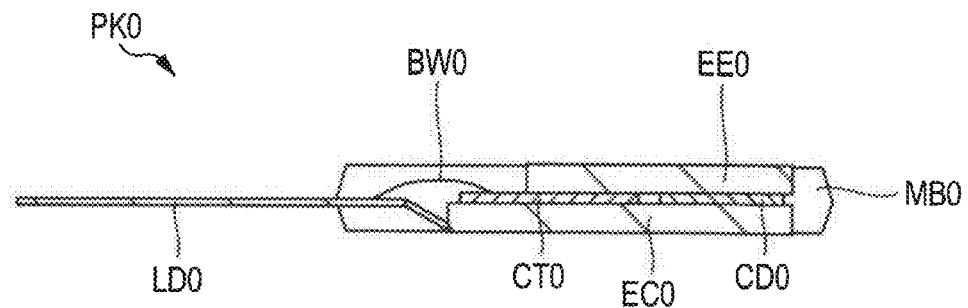
FIG. 3 is a cross-sectional view along the line I-I in FIG. 1.

The left side of FIG. 1 shows a plan view of a package containing a power transistor included in the three-phase inverter circuit studied by the present inventors, while the right side of FIG. 1 shows a plan view of the opposite surface of the package on the left side of FIG. 1. FIG. 2 is a transparent plan view of the package in FIG. 1. FIG. 3 is a cross-sectional view along the line I-I in FIG. 1.

As shown in FIG. 1, a package PK0 has a double-side-electrode structure. That is, over the both surfaces of a sealing body MB0 forming the package PK0 which cross the thickness direction of the sealing body MB0, metal electrodes EC0 and EE0 are respectively disposed in an exposed state. Each of the metal electrodes EC0 and EE0 is formed to have a quadrilateral shape in plan view, but the plane area of the metal electrode EC0 is larger than the plane area of the metal electrode EE0. From one side surface of the sealing body MB0 of the package PK0 which corresponds to a shorter side, a plurality of external terminals LD0 protrude substantially perpendicularly to the side surface.

As shown in FIGS. 2 and 3, in the sealing body MB0 of the package PK0, two semiconductor chips CT0 and CD0 are laterally arranged. The two semiconductor chips CT0 and CD0 are contained in the sealing body MB0, while being interposed between the two metal electrodes EE0 and EC0. In the semiconductor chip CT0 as one of the semiconductor chips CT0 and CD0, e.g., an IGBT is formed while, in the semiconductor chip CD0 as the other of the semiconductor chips CT0 and CD0, e.g., a freewheel diode is formed.

The collector electrode of the semiconductor chip CT0 in which the IGBT is formed and the cathode electrode of the semiconductor chip CD0 in which the freewheel diode is formed are joined to the larger-area metal electrode EC0 via a conductive adhesion layer and are electrically coupled to each other through the metal electrode EC0. On the other hand, the emitter electrode of the semiconductor chip CT0 in which the IGBT is formed and the anode electrode of the semiconductor chip CD0 in which the freewheel diode is formed are joined to the smaller-area metal electrode EE0 via a conductive adhesion layer and are electrically coupled to each other through the metal electrode EE0.

The collector electrode of the semiconductor chip CT0 in which the IGBT is formed is electrically coupled to the external terminals LD0 through the larger-area metal electrode EC0. The emitter electrode of the semiconductor chip CT0 in which the IGBT is formed is electrically coupled to another external terminal LD0 through a bonding wire BW0. The gate electrode of the semiconductor chip CT0 in which the IGBT is formed is electrically coupled to still another external terminal LD0 through the bonding wire BW0.

Figure 4:
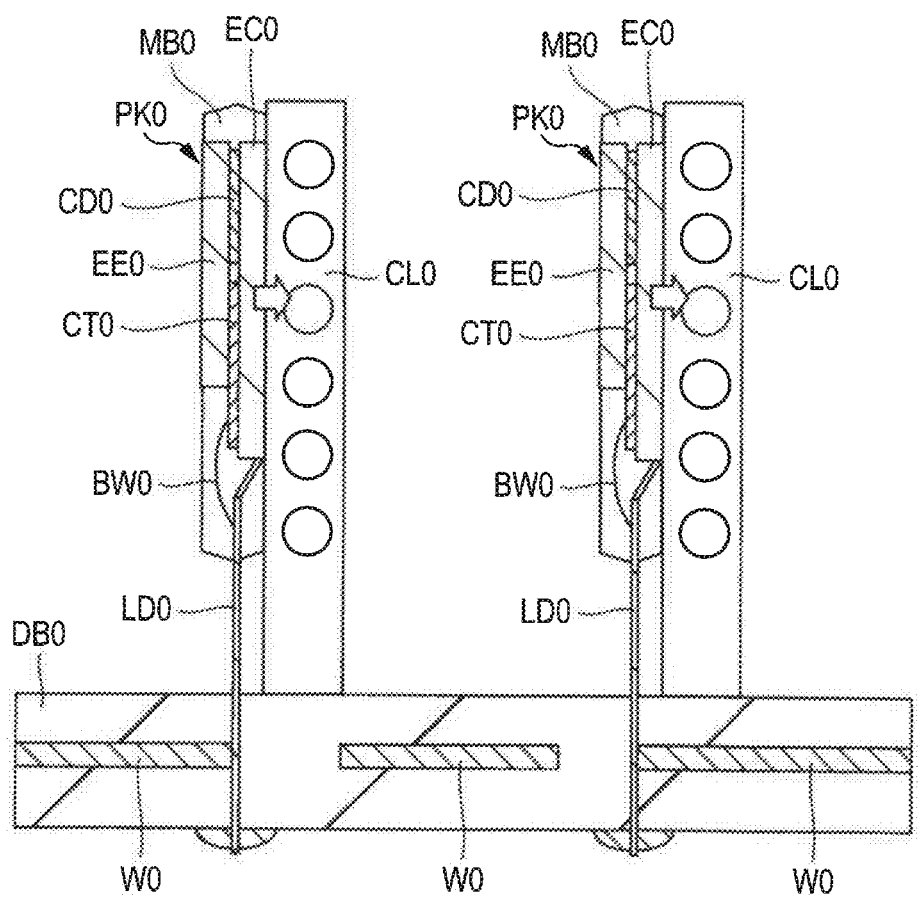
FIG. 4 is a cross-sectional view of an example of a heat dissipation structure in a semiconductor module including the package in FIGS. 1 to 3.

The present inventors have studied a heat dissipation structure in a semiconductor module (electronic device) including the package PK0 described above. FIG. 4 is a cross-sectional view of an example of the heat dissipation structure in the semiconductor module including the package in FIGS. 1 to 3. As an example of the semiconductor module, the two packages PK0 included in a half-bridge circuit (i.e., an inverter circuit corresponding to one unit) as a portion of the foregoing three-phase inverter circuit are shown herein. One of the packages PK0 is for the high side of the inverter circuit, while the other package PK0 is for the low side of the inverter circuit.

Over the package mounting surface of a driver board DB0, e.g., cooling plates CL0 as water-cooling members are disposed substantially perpendicularly to the package mounting surface. The two packages PK0 are mounted over the cooling plates CL0 such that the respective larger-area metal electrodes EC0 thereof face the cooling plates CL0. Between the metal electrodes EC0 of the packages PK0 and the cooling plates CL0, insulating members (not shown) such as, e.g., an insulating die bonding material are interposed to provide insulation therebetween. The heat generated from the semiconductor chips CT0 and CD0 in the respective packages PK0 is transmitted to the cooling plates CL0 mainly through the larger-area metal electrodes EC0 to be dissipated. Note that the respective external terminals LD0 of the individual packages PK0 are inserted in the through holes of the driver board DB0 and electrically coupled to wires W0 of the driver board DB0.

In the foregoing inverter circuit, in terms of improving the reliability and electrical property thereof or the like, a heat dissipation property is desired to be further improved. In the heat dissipation structure in FIG. 4, between the metal electrodes EC0 of the packages PK0 and the cooling plates CL0, the insulating members having a relatively high thermal resistance are interposed. Accordingly, to further enhance the heat dissipation property, it is necessary to increase a heat dissipation area and increase the size of the semiconductor module having the inverter circuits. However, in the electric vehicle or the like, it is required to reduce the weight of the entire vehicle body in terms of improving fuel efficiency performance or the like, and it is also required to reduce the size of a semiconductor module which controls the operation of a motor as a power source. In view of this, the present inventors have noticed that, to satisfy these conflicting requirements, it is necessary to improve the heat dissipation property from a new perspective.

Figure 5:
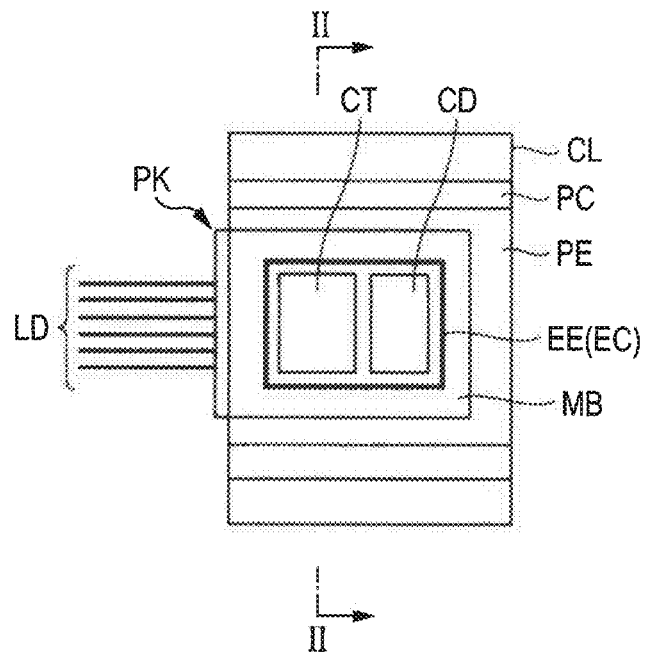
FIG. 5 is a transparent plan view of a package in an embodiment.

As an example of a configuration which solves the foregoing problem, a configuration can be shown in which, to the double-side electrodes (metal electrodes) of each of the packages, respective metal plates having areas larger than those of the double-side electrodes are joined. FIG. 5 is a transparent plan view of the package in the embodiment. FIG. 6 is a schematic cross-sectional view along the line II-II in FIG. 5.

As shown in FIGS. 5 and 6, over the both surfaces of a sealing body MB forming a package PK which cross the thickness direction of the sealing body MB, metal electrodes EC and EE are respectively disposed in an exposed state. The metal electrodes EC and EE are each formed in a quadrilateral shape in plan view and have substantially equal plane areas. From one side surface of the sealing body MB of the package PK which corresponds to a shorter side, a plurality of external terminals (a first control terminal and a second control terminal) LD protrude substantially perpendicularly to the side surface.

In the sealing body MB of the package PK, two semiconductor chips (hereinafter referred to simply as the chips) CT and CD are laterally arranged. The two chips CT and CD are contained in the sealing body MB, while being interposed between the two metal electrodes EC and EE. In the chip CT as one of the chips CT and CD, e.g., an IGBT is formed while, in the chip CD as the other of the chips CT and CD, e.g., a freewheel diode is formed.

The collector electrode of the chip CT in which the IGBT is formed and the cathode electrode of the chip CD in which the freewheel diode is formed are joined to the metal electrode EC via a conductive adhesion layer or the like and are electrically coupled to each other through the metal electrode EC. On the other hand, the emitter electrode of the chip CT in which the IGBT is formed and the anode electrode of the chip CD in which the freewheel diode is formed are joined to the metal electrode EE via a conductive adhesion layer or the like and are electrically coupled to each other through the metal electrode EE.

As shown in FIG. 6, the metal electrodes EC and EE of the package PK are joined to metal plates PC and PE via respective conductive adhesion layers (conductive members, coupling members, or joining material) am made of a solder or the like. As shown in FIGS. 5 and 6, the plane areas of the metal plates PC and PE are larger than the plane areas of the metal electrodes EC and EE. The metal plates PC and PE are disposed so as to include the metal electrodes EC and EE in plan view. As also shown in FIG. 6, the metal plates PC and PE are joined to respective cooling plates CL of a cooling member (heat sink) via respective insulating members im such as, e.g., ceramic plates. As shown in FIGS. 5 and 6, the respective plane areas of the cooling plates CL are larger than the respective plane areas of the metal plates PC and PE. The cooling plates CL are disposed so as to include the metal plates PC and PE. That is, between the package PK and the cooling plates CL, the metal plates PC and PE having the plane areas larger than the plane areas of the metal electrodes EC and EE and smaller than the plane areas of the cooling plates CL are interposed.

The left side of FIG. 7 shows an illustrative view of a heat dissipation state in the heat dissipation structure studied by the present inventors, while the right side of FIG. 7 shows a view of a heat distribution in the heat dissipation structure on the left side of FIG. 7. The left side of FIG. 8 shows an illustrative view of a heat dissipation state in the heat dissipation structure in FIG. 6, while the right side of FIG. 8 shows a view of a heat distribution in the heat dissipation structure on the left side of FIG. 8. Note that the arrows on the left side of FIG. 7 and on the left side of FIG. 8 show the states of heat diffusion. On the right side of FIG. 7 and on the right side of FIG. 8, a deeper-color portion in the package PK shows a higher temperature in the package PK. An ambient temperature is, e.g., 85° C. A cooling medium temperature is, e.g., 65° C. The flow rate of cooling water (cooling medium) is, e.g., 1 L/m.

As shown in FIG. 7, the metal electrodes EC0 and EE0 of the package PK0 are joined to the respective cooling plates CL via the respective insulating members im such as a ceramic. In this case, the heat generated in the chips CT0 and CD0 is dissipated to the cooling plates CL through the planes of the large-area metal electrodes EC0 and EE. The junction temperature (junction portion temperature) of the IGBT in this case is, e.g., 121.3° C.

By contrast, as shown in FIG. 8, in the case of using the heat dissipation structure of the package PK in FIG. 6, the heat generated in the chips CT and CD is dissipated from the large-area metal electrodes EC and EE via the metal plates PC and PE having areas larger than those of the metal electrodes EC and EE to the cooling plates CL. This can enhance heat diffusion compared to that in the case in FIG. 7. The junction temperature (junction portion temperature) of the IGBT in this case is, e.g., 110.4° C., which means that the junction temperature can be reduced by 10° C. from that in the case in FIG. 7. Accordingly, it is possible to improve the heat dissipation property without increasing the size of the semiconductor module. In particular, the heat dissipation structure of the semiconductor module in FIGS. 5, 6, and 8 is configured such that, e.g., the one package PK is interposed between the two cooling plates CL. This can further improve the heat dissipation property. The following will describe a specific example of the configuration of the semiconductor module (electronic device) in each of the embodiments of the present invention.

First Embodiment

An electronic device in the present first embodiment is a semiconductor module including an inverter circuit (power conversion circuit) which controls, e.g., the operation of a motor as a power source when an electronic vehicle or the like is running. The inverter circuit converts DC power to AC power. For example, when a DC power supply alternately produces a positive output and a negative output, the direction of a current is consequently inverted. In this case, since the direction of the current is alternately inverted, the outputs can be considered as AC power.

The AC power mentioned herein comes in various forms represented by single-phase AC power and three-phase AC power. In the present first embodiment, a three-phase inverter circuit which converts DC power to three-phase AC power is shown by way of example. However, the technical idea of the present first embodiment is not only applicable to the three-phase inverter circuit, but also widely applicable to various inverter circuits such as, e.g., a single-phase inverter circuit.

<Example of Configuration of Three-Phase Inverter Circuit>

FIG. 9 is a main-portion circuit diagram of a motor drive system having the semiconductor module in the present first embodiment. FIG. 10 is a circuit diagram of a half-bridge circuit included in the three-phase inverter circuit in the motor drive system in FIG. 9.

As shown in FIG. 9, a motor drive system PMS includes, e.g., a motor MT used as a power source when an electric vehicle or the like is running and a motor drive circuit PWC which controls the operation of the motor MT.

The motor MT is a three-phase induction motor driven by an AC current in three phases (U-phase, V-phase, and W-phase) which are 120 degree shifted from each other. The motor MT includes a rotor RT formed of a conductor and three types of coils (U-phase coil UL, V-phase coil VL, and W-phase coil WL) disposed around the rotor RT. In the motor MT, an AC current having the phases 120 degree shifted from each other is allowed to flow in the U-phase coil VL, the V-phase coil VL, and the W-phase coil WL in this order to rotate a magnetic field around the rotor RT (generate a rotating magnetic field around the rotor RT). As a result, the direction of a magnetic flux traversing the rotor RT rotates so that an induction current flows in the rotor RT by electromagnetic induction. That is, since the current flows in the magnetic field, due to the interaction between the rotating magnetic field and the current flowing in the rotor RT, an electromagnetic force acts on the rotor RT so that the rotor RT rotates in the same direction as the rotating direction of the rotating magnetic field. Note that a terminal UTE shows a U-phase terminal electrically coupled to the U-phase coil UL, a terminal VTE shows a V-phase terminal electrically coupled to the V-phase coil VL, and a terminal WTE shows a W-phase terminal electrically coupled to the W-phase coil WL. The reference marks N and S in the rotor RT show an N-pole and an S-pole, respectively.

The motor drive circuit PWC supplies the generated three-phase AC power to the motor MT and controls the operation of the motor MT. The motor drive circuit PWC has a three-phase inverter circuit portion (semiconductor module or electronic device) PW1 and a control portion PW2.

The three-phase inverter circuit portion PW1 is an output circuit portion which generates the three-phase AC power and supplies the three-phase AC power to the motor MT. The three-phase inverter circuit portion PW1 includes three inverter legs (hereinafter referred to simply as legs) LG1, LG2, and LG3 corresponding to the three phases.

As shown in FIGS. 9 and 10, each of the legs LG1, GL2, and LG3 is, e.g., an inverter circuit corresponding to one unit (one phase) forming the half-bridge circuit in the 3-phase inverter circuit. The legs LG1, LG2, and LG3 are coupled in parallel between terminals HT and LT. The terminal HT is a relatively-high-potential terminal (e.g., a positive-potential terminal to which a positive potential is supplied). The terminal LT is a relatively-low-potential terminal (e.g., a negative-potential terminal to which a negative potential is supplied).

In the upper arm of each of the legs LG1, LG2, and LG3, a high-side package (semiconductor device) PK1 (PK) is disposed while, in the lower arm of each of the legs LG1, LG2, and LG3, a low-side package (semiconductor device) PK2 (PK) is disposed. In the high-side package PK1, a transistor (first power transistor) Tr1 and a diode Df1 are disposed while, in the low-side package PK2, a transistor (second power transistor) Tr2 and a diode Df2 are disposed. The packages PK1 and PK2 have the same structure.

The transistors Tr1 and Tr2 in each of the legs LG1, LG2, and LG3 are power transistors operating as switching elements and are formed of, e.g., IGBTs. Instead of the IGBTs, e.g., power MOSFETs, bipolar transistors, or GTOs (Gate Turn Off Thyristors) can also be used. The transistors Tr1 and Tr2 are coupled in series between the terminals HT and LT. The transistors Tr1 and Tr2 form the inverter circuit corresponding to one unit. Note that, in FIG. 10, the reference mark C denotes the collector electrodes (first electrode and third electrode) of the transistors Tr1 and Tr2, while the reference mark E denotes the emitter electrodes (second electrode and fourth electrode) of the transistors Tr1 and Tr2. Also, the reference mark G denotes the gate electrodes (first control electrode and second control electrode) of the transistors Tr1 and Tr2, while the reference mark Tg denotes the gate terminals of the packages PK1 and PK2. Also, the reference mark Te denotes the emitter terminals of the packages PK1 and PK2, while the reference mark Tc denotes the collector terminals of the packages PK1 and PK2.

Respective output terminals (common nodes, wire connection portions, or outputs) Tw of the transistors Tr1 and Tr2 in each of the legs LG1, LG2, and LG3 are electrically coupled to the U-phase terminal UTE, the V-phase terminal VTE, and the W-phase terminal WTE of the foregoing motor MT. That is, for each one of the phases, the two transistors Tr1 and Tr2 and the two diodes Df1 and Df2 are provided. Accordingly, the six transistors and the six diodes are provided for three phases.

The diodes Df1 and Df2 in each of the legs LG1, LG2, and LG3 are freewheel diodes for allowing the back-flow current stored in the inductance of the motor MT to flow. The diodes Df1 and Df2 are coupled in antiparallel to the transistors Tr1 and Tr2, respectively. Note that, in FIG. 10, the reference mark K denotes the cathode electrodes of the diodes Df1 and Df2, while the reference mark A denotes the anode electrodes of the diodes Df1 and Df2. When the load coupled to the output of the three-phase inverter circuit portion PW1 is a resistor including no inductance, there is no back-flow energy so that the diodes Df1 and Df2 are unnecessary. However, when the load includes an inductance such as a motor, a load current flows in a direction opposite to the direction in which a current flows in the ON-state switch. That is, when the load includes an inductance, energy may return from the inductance of the load to the three-phase inverter circuit portion PW1 (current may flow backward).

In the motor drive circuit PWC, when the transistors Tr1 and Tr2 are turned OFF, the energy ($\frac{1}{2}LI^2$) stored in the inductance of the motor MT should necessarily be released. However, since each of the transistors Tr1 and Tr2 alone does not have the function of allowing a back-flow current to flow, the energy released from the inductance of the motor MT cannot be released. Accordingly, by respectively coupling the diodes Df1 and Df2 in antiparallel to the transistors Tr1 and Tr2 for the switching elements, the electrical energy stored in the inductance of the motor MT is allowed to flow backward. For the reason described above, in the motor drive circuit PWC, the diodes Df1 and Df2 are coupled in antiparallel to the transistors Tr1 and Tr2, respectively.

Between the terminals HT and LT, a capacitive element Cs is electrically coupled. The capacitive element Cs is a smoothing capacitor and has the function of achieving a reduction in a surge voltage in the inverter circuit, stabilization of a system voltage, or the like. As will be described later, the capacitive element Cs is provided for each of the legs LG1, LG2, and LG3.

In such an inverter circuit (half-bridge circuit) as shown in FIG. 10, an output voltage is controlled by causing the upper and lower transistors Tr1 and Tr2 to be alternately conductive and changing the ON periods thereof. For example, when the high-side transistor Tr1 is turned ON and the low-side transistor Tr2 is turned OFF, a current Iss flows from the terminal HT to the output terminal Tw through the transistor Tr1 and to the motor MT. Then, when the transistors Tr1 and Tr2 are turned OFF, the current flows to the terminal LT, the diode Df2, the output terminal Tw, and the motor MT. Then, when the high-side transistor Tr1 is turned OFF and the low-side transistor Tr2 is turned ON, a current Idd flows to the motor MT, the output terminal Tw, the transistor Tr2, and the terminal LT. Then, when the transistors Tr1 and Tr2 are turned OFF, the current flows to the motor MT, the output terminal Tw, the diode Df1, and the terminal HT.

The control unit PW2 of the motor drive circuit PWC is a circuit portion which controls the operations of the transistors Tr1 and Tr2 of the three-phase inverter circuit portion PW1. As shown in FIG. 9, the motor drive circuit PWC includes gate drive circuits GC and a control circuit CNT.

The gate drive circuits GC control the switching operations of the transistors Tr1 and Tr2 in the individual legs LG1, LG2, and LG3. The gate drive circuits GC include high-side drive circuits which drive and control the high-side transistors Tr1 and low-side drive circuits which drive and control the low-side transistors Tr2. The respective high-side drive circuits of the individual gate drive circuits GC are electrically coupled to respective gate electrodes G (see FIG. 10) of the high-side transistors Tr1 in the individual legs LG1, LG2, and LG3. The respective low-side drive circuits of the individual gate drive circuits GC are electrically coupled to the respective gate electrodes G (see FIG. 10) of the low-side transistors Tr2 in the individual legs LG1, LG2, and LG3. Specifically, by controlling the switching operations of the transistors Tr1 and Tr2 in the individual legs LG1, LG2, and LG3 using the gate drive circuits GC, the DC power is converted to the three-phase AC power, and the three-phase AC power is supplied to the motor MT. The gate drive circuits GC are disposed herein for the individual legs LG1, LG2, and LG3 on a one-to-one basis. In other words, the one gate drive circuit GC controls the operation of the inverter circuit corresponding to one unit. However, in a modification, it may also be possible that the one gate drive circuit GC controls the operations of the six transistors Tr1 and Tr2. Alternatively, it may also be possible that the six gate drive circuits GC control the respective operations of the sixth transistors Tr1 and Tr2.

The control circuit CNT controls the operation of each of the high-side drive circuits and the low-side drive circuits which are included in the individual gate drive circuits GC. The control circuit CNT has a control function and an arithmetic function. Note that the control unit PW2 may also include various control circuits which control the operation of the motor drive circuit PWC in addition to the circuits described above, though the depiction thereof is omitted in FIG. 9. For example, a noise filter circuit which reduces noise on gate drive signals output from the gate drive circuits GC, signals input to the gate drive circuits GC, and the like may also be provided. Alternatively, for example, a circuit which measures the temperatures of the electronic components included in the three-phase inverter circuit portion PW1 or the like and performs noise filtering or amplification of measured electric signals may also be provided.

<Example of Configuration of Package (Semiconductor Device)>

Next, a description will be given of an example of the structures of the packages PK1 and PK2 included in the three-phase inverter circuit portion PW1 in FIG. 9. Note that, since the high-side package PK1 and the low-side package PK2 have the same configuration, the both packages PK1 (and PK2) will be simultaneously described.

The left side of FIG. 11 shows the plan view of a package according to the present first embodiment, while the right view of FIG. 11 shows a plan view of the opposite surface of the package on the left side of FIG. 11. FIG. 12 is a transparent plan view of the package in FIG. 11. Note that the wording "in plan view" means viewing an object in a direction perpendicular to the main surfaces of the chips. The term "main component" indicates the material component included in a largest amount in a member among the constituent materials of the member. For example, the wording "material containing copper as a main component" means that the content of copper in a member is highest among those of the materials of the member. The use of the term "main component" in the present specification is intended to show that, e.g., the member is basically formed of copper, but not to preclude the case where the member contains another impurity in addition to copper.

In the package PK1 (PK2) in the present first embodiment, the one transistor Tr1 (Tr2) and the one diode Df1 (Df2) which are included in each of the arms of each of the foregoing legs (inverter circuits) are sealed in the one sealing body (a first sealing body in PK1 or a second sealing body in PK2) MB. The sealing body MB is made of a thermosetting resin containing, e.g., an epoxy-based resin as a main component. The outer shape of the sealing body MB is formed of a thin plate defined by a main surface PSE, a main surface PSC opposite to the main surface PSE, and fourth side surfaces located between the main surfaces PSE and PSC so as to cross the main surfaces PSE and PSC. Note that the length of a longer side of the sealing body MB is, e.g., about 31 mm, the length of a shorter side thereof is, e.g., about 21 mm, and the thickness thereof is, e.g., about 4.3 mm.

At the main surface PSE of the sealing body MB, one surface of the metal electrode (a second metal plate in the package PK1 or a fourth metal plate in the package PK2) EE is exposed. The metal electrode EE is the member forming the emitter terminal of the package PK1 (PK2). The metal electrode EE has one exposed surface (a fourth surface in the package PK1 or an eighth surface in the package PK2) and the other sealed surface (a third surface in the package PK1 or a seventh surface in the package PK2) opposite thereto.

At the other main surface PSC of the sealing body MB opposite to the main surface PSE, one surface of the metal electrode (a first metal plate in the package PK1 or a third metal plate in the package PK2) EC is exposed. The metal electrode EC is the member forming the collector terminal of the package PK1 (PK2). The metal electrode EC has one exposed surface (a second surface in the package PK1 or a sixth surface in the package PK2) and the other sealed surface (a first surface in the package PK1 or a fifth surface in the package PK2) opposite thereto.

These metal electrodes EE and EC are formed of metal plates containing, e.g., copper (Cu) having a high thermal conductivity and a high electrical conductivity as a main component. The exposed surfaces of the metal electrodes EE and EC are formed in quadrilateral shapes in plan view, and the respective plane areas thereof are substantially equal.

As shown in FIG. 12, in the sealing body MB, the two chips CT and CD, a portion of the metal electrode EC, a portion of the metal electrode EE (see the left side of FIG. 11), respective portions of the plurality of external terminals LD, and a plurality of bonding wires (hereinafter referred to simply as wires) BW are sealed.

In the chip (a first semiconductor chip in the package PK1 or a second semiconductor chip in the package PK2) CT, the transistor Tr1 (see FIG. 9, etc.) described above is formed while, in the chip CD, the diode Df1 (see FIG. 9, etc.) is formed. Over the one main surface CSE of the chip CT, the emitter electrode E of the transistor Tr1 (Tr2) and a plurality of signal electrodes (a first control electrode in the package PK1 or a second control electrode in the package PK2) Sg are disposed. Over the other main surface CSE of the chip CT opposite to the one main surface CSE, the collector electrode (not shown in FIG. 12) of the transistor Tr1 (Tr2) is disposed. The plurality of signal electrodes (first control electrode or the second control electrode) Sg include the gate electrode of the transistor Tr1 (Tr2). The signal electrodes Sg are electrically coupled to the external terminals LD through the wires BW.

Over the one main surface CSA of the other chip CD, the anode electrode A of the diode Df1 (Df2) is disposed. Over the other main surface of the chip CD opposite to the one main surface CSA, the cathode electrode (not shown in FIG. 12) of the diode Df1 (Df2) is disposed.

The chips CT and CD and the external terminals LD are disposed to be arranged along the extending direction of the external terminals LD. The chip LD is disposed between the external terminals LD and the chip CD. The chip CT is disposed such that the signal electrodes Sg thereof are located between the emitter electrode E and the external terminals LD. Such dispositions allow a reduction in the length of each of the wires BW coupling the signal electrodes Sg of the chip CT to the external terminals LD.

Over the metal electrode EC described above, the chips CT and CD described above are mounted such that the collector electrode of the transistor Tr1 (Tr2) and the cathode electrode of the diode Df1 (Df2) face the metal electrode EC. That is, the metal electrode EC serves also as a die pad portion (chip mounting portion or tab) mounting the two chips CT and CD. The collector electrode of the transistor Tr1 (Tr2) of the chip CT is electrically coupled to the metal electrode EC, while the cathode electrode of the diode Df1 (Df2) of the chip CD is electrically coupled to the metal electrode EC. As a result, the collector electrode of the transistor Tr1 (Tr2) of the chip CT and the cathode electrode of the diode Df1 (Df2) are electrically coupled to each other through the metal electrode EC (collector terminal).

The metal electrode EE (see FIG. 11) described above is disposed such that the one surface thereof (surface opposite to the exposed surface) faces the emitter electrode E of the chip CT and the anode electrode A of the chip CD. The emitter electrode E of the transistor Tr1 (Tr2) of the chip CT is electrically coupled to the metal electrode EE, while the anode electrode A of the diode Df1 of the chip CD is also electrically coupled to the metal electrode EE. Thus, the emitter electrode E of the transistor Tr1 (Tr2) of the chip CT and the anode electrode A of the diode Df1 (Df2) are electrically coupled to each other through the metal electrode EE (emitter terminal).

Each of the metal electrodes EC and EE is formed such that the exposed surface thereof has a large rectangular shape including the two chips CT and CT in plan view. In other words, the plane area (exposure area) of each of the metal electrodes EC and EE is larger than the total plane area of the chips CT and CD. Accordingly, it is possible to ensure a large plane area (exposure area) for the collector terminal formed of the metal electrode EC and a large plane area (exposure area) for the emitter terminal formed of the metal electrode EE.

Since a large current flows in each of the metal electrodes EC and EE of the package PK1 (PK2), it is preferable to minimize a resistance component and an inductance component. In addition, since each of the metal electrodes EC and EE of the package PK1 (PK2) serves as a heat dissipation path which dissipates the heat generated in the chips CT and CD, it is also preferable to minimize a thermal resistance. In view of this, the present first embodiment allows a large exposure area to be ensured for each of the metal electrodes EC and EE of the package PK1 and PK2, as described above. This can increase the cross-sectional area of a transmission path and thus reduce the resistance component and the inductance component of the transmission path. In addition, since the heat dissipation area can be increased, it is possible to improve the property of dissipating the heat generated in the chips CT and CD. In particular, the thicknesses of the metal electrodes EE and EC are larger than the thicknesses of the external terminals LD. Accordingly, it is possible to increase the heat capacity of each of the metal electrodes EE and EC and improve the heat dissipation efficiency of a heat dissipation path extending via the metal electrodes EE and EC. Therefore, it is possible to improve the reliability of the operation of each of the packages PK1 and PK2 (i.e., the half-bridge circuits, the legs LG1 to LG3, and the three-phase inverter circuit portion PW1).

Each of the external terminals LD described above is made of a metal containing, e.g., copper as a main component and formed to extend in a direction substantially perpendicular to one side surface of the sealing body MB. Of the external terminal LD, the portion exposed from the sealing body MB is an outer lead portion and the portion covered with the sealing body MB is an inner lead portion. The inner lead portion of the external terminal LD has a through hole Lh which is formed closer to the tip thereof to allow the resin of the sealing body MB to enter the through hole Lh. The through hole Lh is intended to prevent the external terminal LD from easily coming out of the sealing body MB.

The external terminals LD are intended mainly to transmit signals. Among the external terminals LD, the predetermined external terminal LD is electrically coupled to the signal electrode Sg (gate electrode) of the transistor Tr1 (Tr2) of the chip CT through the wire BW to serve as the gate terminal Tg (see FIG. 10). Note that the gate terminal Tg is electrically coupled to the gate drive circuit GC shown in FIG. 9. That is, a signal from the gate drive circuit GC is applied to the gate electrode of the transistor Tr1 (Tr2) via the gate terminal Tg to allow the switching operation of the transistor Tr1 (Tr2) to be controlled.

Also, among the external terminals LD, the predetermined external terminal LD is electrically coupled to an emitter sensing electrode for monitoring the operating state of the package PK1 through the wire BW to serve as an inspection signal terminal. The inspection signal terminal can be used as an inspection terminal which measures a voltage at the emitter electrode E in an inspection which causes a large current to flow in the transistor Tr1 (Tr2) of the chip CT. The inspection signal terminal is coupled to a monitoring terminal to transmit the detected signal to the outside. Note that the end surface of the external terminal LD has a relatively small area compared to the exposure area of each of the metal electrodes EC and EE. Accordingly, even when the number of signals (the number of the external terminals LD) is increased, the size of the package PK1 is not significantly increased.

Each of the wires BW is made of a conductive member containing, e.g., gold, copper, or aluminum as a main component and disposed in the sealing body MB. By thus providing the wires BW which are particularly susceptible to deformation or damage in the sealing body MB, it is possible to improve the handling property of the package PK1 during the mounting thereof and thus improve the assembling efficiency of the semiconductor module.

The respective exposed surfaces of the metal electrodes EC and EE and the external terminals LD are covered with metal films. The metal films are formed of a solder material such as, e.g., tin. The metal films are formed of, e.g., a plating film by a plating method. This allows defective joining due to the oxidation of copper forming the metal electrodes EC and EE and the external terminals LD to be avoided. In addition, when each of the metal electrodes EC and EE and the external terminals LD is joined to a joining target using a solder or the like, it is possible to improve wettability with respect to a solder or the like. Particularly when each of the metal electrodes EC and EE and the external terminals LD is formed of a metal material containing copper as a main component, by covering the metal electrodes EC and EE and the external terminals LD with the foregoing metal films, the wettability can significantly be improved.

Next, a description will be given of the cross-sectional structure of the package PK1 (PK2). FIG. 13 is a cross-sectional view along the line in FIG. 11. FIG. 14 is an enlarged cross-sectional view of the region enclosed in the broken line in FIG. 13.

Between the metal electrode EE and the chips CT and CD, spacers SP1 and SP2 are interposed. The spacers SP1 and SP2 are made of a metal containing, e.g., copper as a main component and formed of, e.g., thin plates each having a quadrilateral shape in plan view.

As shown in FIG. 14, one of the surfaces of the spacer SP1 is joined to the emitter electrode E (see FIG. 12) of the chip CT via a conductive adhesion layer (conductive member, coupling member, or joining material) cam1. The surface of the spacer SP1 opposite to the one surface is joined to the metal electrode EE via a conductive adhesion layer (conductive member, coupling member, or joining material) cam2. That is, the emitter electrode E of the chip CT is electrically coupled to the metal electrode EE through the spacer SP1.

On the other hand, one of the surfaces of the spacer SP2 is joined to the anode electrode A (see FIG. 12) of the chip CD via a conductive adhesion layer (conductive member, coupling member, or joining material) cam3. The surface of the spacer SP2 opposite to the one surface thereof is joined to the metal electrode EE via a conductive adhesion layer (conductive member, coupling member, or joining material) cam4. That is, the anode electrode A of the chip CD is electrically coupled to the metal electrode EE through the spacer SP2.

The spacers SP1 and SP2 are members for ensuring a loop height for each of the wires BW (wires coupling the external terminals LD to the signal electrodes Sg (gate electrode) of the chip CT). That is, over the main surface CSE (see FIG. 12) over which the emitter electrode E of the chip CT is formed, the signal electrodes Sg (such as the gate electrode) are disposed. Accordingly, when the metal electrode EE of the current size and the emitter electrode E of the chip CT are joined together without interposing the spacer SP1 therebetween, the metal electrode EE covers the signal electrode Sg and therefore the external terminals LD cannot be coupled to the signal electrodes Sg. As a result, when the spacer SP1 is not used, the metal electrode EE needs to be reduced in size so as to expose the signal electrodes Sg of the chip CT. This reduces the exposure area of the metal electrode EE and degrades the electrical and thermal effects described above. By contrast, by providing the spacer SP1 between the metal electrode EE and the emitter electrode E of the chip CT, it is possible to provide a space where the wires BW are to be placed between the metal electrode EE and the chip CT. Therefore, it is possible to electrically couple the external terminals LD to the signal electrodes of the chip CT without reducing the exposure area of the metal electrode EE. That is, it is possible to improve the electrical property and the heat dissipation property of the package PK1 without causing a problem in coupling the external terminals LD to the signal electrodes of the chip CT.

On the other hand, the metal electrode EC has the function of a chip mounting die pad portion. As described above, the plane area of the metal electrode EC is larger than the total area of the two chips CT and CD. This allows the two chips CT and CD to be mounted over the one metal electrode EC. In addition, the metal electrode EC is electrically coupled to the collector electrode of the chip CT and electrically coupled to the cathode electrode of the chip CD. That is, as shown in FIG. 14, the one surface (chip mounting surface) of the metal electrode EC is joined to the collector electrode of the chip CT via a conductive adhesion layer (die bonding material, conductive member, coupling member, or joining material) cam5. Also, the one surface (chip mounting surface) of the metal electrode EC is joined to the cathode electrode of the chip CD via a conductive adhesion layer (die bonding material, conductive member, coupling member, or joining material) cam6.

In terms of reducing the ON resistance of each of the packages PK1 and PK2, it is preferable to use a material having a high electrical conductivity for the conductive adhesion layers cam1 to cam6. As an example of the material having the high electrical conductivity, not only a solder, but also a conductive resin containing a plurality of (a large number of) conductive particles in a resin can be shown. It may also be possible to use a sintered metal film obtained by sintering a plurality of (a large number of) conductive particles such as, e.g., silver (Ag) particles.

Note that the packages PK1 and PK2 are mounted over a substrate after being completed as products. In this case, it is also preferable to use a material having a high electrical conductivity such as a solder or a conductive resin for a coupling member used to couple the packages PK1 and PK2 to the substrate. In this case, the conductive adhesion layers cam1 to cam6 need to have a resistance to heat at a processing temperature when the packages PK1 and PK2 are mounted.

For example, when the packages PK1 and PK2 are mounted using a solder, to melt the solder and achieve coupling, a heating (reflow) process is necessary. When the solder used to couple the packages PK1 and PK2 to the substrate is made of the same material (has the same melting point) as that of the solder used in the packages PK1 and PK2 described above, the solder in the packages PK1 and PK2 may be melted by the heating (reflow) process during the mounting of the packages PK1 and PK2. Accordingly, when a solder is used in the packages PK1 and PK2 and used during the mounting of the packages PK1 and PK2, a high-melting-point solder having a melting point higher than that of the solder used to mount the packages PK1 and PK2 is used preferably in the packages PK1 and PK2.

On the other hand, when a conductive resin is used during the mounting of the packages PK1 and PK2, a heating (cure-bake) process for curing the resin component of the conductive resin is necessary. However, a curing temperature for a resin is generally lower than the melting point of a solder. Accordingly, in this case, the conductive adhesion layers cam1 to cam6 may be made of either a solder or a conductive resin.

Even when a solder is used during the mounting of the packages PK1 and PK2, as long as an upper limit temperature for the resin is higher than the melting point of the solder, a conductive resin containing the resin as a base material can be used for the conductive adhesion layers cam1 to cam6.

<Example of Configuration of Chip>

Next, a description will be given of the chip CT shown in FIG. 9 in which the transistor Tr1 (Tr2) is formed. The left side of FIG. 15 shows a plan view of the main surface of the chip in which the transistor is formed, while the right side of FIG. 15 shows a plan view of the main surface of the chip opposite to the main surface thereof on the left side of FIG. 15. Since the chip CT in the high-side package PK1 and the chip CT in the low-side package PK2 have the same configuration, the both chips CT will be simultaneously described.

Each of the chips CT has a semiconductor substrate SBT containing, e.g., a silicon (Si) single crystal as a main component. The semiconductor substrate SBT of the chip CT has the main surface CSE (on the left side of FIG. 15) and a main surface CSC (on the right side of FIG. 15) opposite thereto. The chip CT is formed such that each of the main surfaces CSE and CSC has, e.g., a generally quadrilateral shape. The respective areas of the main surfaces CSE and CSC of the chip CT are, e.g., equal.

As shown on the left side of FIG. 15, over the main surface CSE of the chip CT, the emitter electrode (emitter electrode pad or surface electrode) E and the plurality of signal electrodes (signal electrode pads or surface electrodes) Sg are disposed in an exposed state. Each of the emitter electrode E and the signal electrodes Sg is made of a metal material containing, e.g., aluminum as a main component. The exposure area of the emitter electrode E is larger than the exposure area of the signal electrode Sg. That is, by increasing the exposure area of the emitter electrode E in which a large current flows, the impedance of the emitter electrode E can be reduced.

Among the plurality of signal electrodes Sg, the predetermined signal electrode Sg serves as the gate electrode. Also, among the plurality of signal electrodes Sg, the specified signal electrode Sg serves as a sensing electrode. The sensing electrode is formed integrally with the emitter electrode E. Through the sensing electrode, a voltage at the emitter electrode E or the like can be sensed. When, the opening through which the sensing electrode is exposed is spaced apart from the opening through which the emitter electrode E is exposed, a bleeding phenomenon in a conductive member for coupling the emitter electrode E to the sensing electrode can favorably be inhibited. However, there is also a modification in which the opening for the sensing electrode is not separate from the opening for the emitter electrode E.

As the signal electrodes Sg, in addition to those described above, an electrode for monitoring the operating state of the chip CT, such as an electrode for temperature detection, an electrode for voltage sensing, or an electrode for current sensing, or an electrode for transmitting a signal for inspecting the chip CT may also be provided.

As shown on the right side of FIG. 15, over the main surface CSC of the chip CT, the collector electrode (collector electrode pad or back-side electrode) C is disposed in an exposed state. The collector electrode C is made of a metal material containing, e.g., aluminum as a main component and formed so as to cover the entire region of the main surface CSC of the chip CT. As can be seen from a comparison between the left and right sides of FIG. 15, the exposure area of the collector current C is larger than the exposure area of the emitter electrode E. That is, by increasing the exposure area of the collector electrode C in which a large current flows, the impedance of the collector electrode C can be reduced.

FIG. 16 is a main-portion cross-sectional view of the chip in FIG. 15. In the chip CT, as the transistor Tr1 (Tr2), e.g., a trench-gate IGBT is formed. The IGBT has not only the high-speed switching property and the voltage-driven property of a power MOSFET, but also the low ON voltage property of a bipolar transistor. As described above, the transistor Tr1 (Tr2) may also be formed of a power MOSFET instead of the IGBT. However, when silicon is used as the material of the semiconductor substrate SBT, the IGBT can more reliably ensure a breakdown voltage for the transistor Tr1 (Tr2) in a state where the thickness of the semiconductor substrate SBT is reduced. In other words, the IGBT can more significantly reduce the ON resistance. However, when silicon carbide (SiC) is used as the material of the semiconductor substrate SBT, the power MOSFET can also ensure a breakdown voltage for the transistor Tr1 (Tr2) even when the thickness of the semiconductor substrate SBT is reduced and reduce the ON resistance.

In the semiconductor substrate SBT of the chip CT, a $p^+$-type semiconductor region PR1, an $p^+$-type semiconductor region NR1, an $n^-$-type semiconductor region NR2, and a p-type semiconductor region PR2 are formed in ascending order from the lowest layer in FIG. 16. The $p^+$-type semiconductor region PR1 serves as the collector region of the transistor Tr1. The $p^+$-type semiconductor region PR1 is electrically coupled to the collector electrode C. Note that the $p^+$-type semiconductor region NR1 is referred to as a buffer layer. The $p^+$-type semiconductor region NR1 has the function of preventing the occurrence of a punch-through phenomenon (phenomenon in which a depletion layer growing from the p-type semiconductor region PR2 into the $n^-$-type semiconductor region NR2 comes into contact with the $p^+$-type semiconductor region PR1) when the transistor TR1 has been turned OFF. The $n^+$-type semiconductor region NR1 also has the function of limiting the quantity of holes injected from the $p^+$-type semiconductor region PR1 into the $n^-$-type semiconductor region NR2.

On the other hand, in the main surface CSE of the semiconductor substrate SBT, a plurality of trenches T are formed to extend from the main surface CSE through the p-type semiconductor region PR2 and terminate at middle positions in the $n^-$-type semiconductor region NR2. Each of the trenches T is internally filled with the gate electrode G via a gate insulating film iG. The gate insulating film iG is made of, e.g., a silicon oxide film, while the gate electrode G is made of, e.g., a low-resistance polycrystalline silicon film. The gate electrodes G in the respective trenches T are electrically coupled to each other and electrically coupled to the signal electrodes Sg (see FIG. 15, etc.) for the gate electrodes described above. Also, in the main surface CSE of the semiconductor substrate SBT, $p^+$-type semiconductor regions ER are formed in alignment with the trenches T. The $p^+$-type semiconductor regions ER serve as the emitter region of the transistor Tr1.

Over the main surface CSE of the semiconductor substrate SBT, an insulating film iF1 is deposited. The insulating film iF1 is made of, e.g., a silicon oxide film. Over the insulating film iF1, the emitter electrode E and the signal electrodes Sg (see FIG. 15, etc.) which are described above are formed. The emitter electrode E is electrically coupled to the $p^+$-type semiconductor regions (emitter region) ER and the p-type semiconductor region PR2 (channel formation region) through openings H formed in the insulating film iF1 and via underlying metal films Bm.

Next, a description will be given of the chip CD in which the diode Df shown in FIG. 9 is formed. The left side of FIG. 17 shows a plan view of the main surface of the chip in which the diode is formed, while the right side of FIG. 17 shows a plan view of the main surface of the chip which is opposite to the main surface thereof on the left side of FIG. 17. Note that, since the chip CD in the high-side package PK1 and the chip CD in the low-side package PK2 have the same configuration, the both chips CD will be simultaneously described.

Each of the chips CD has a semiconductor substrate SBD containing, e.g., a silicon (Si) single crystal as a main component. The semiconductor substrate SBD of the chip CD has the main surface CSA (on the left side of FIG. 17) and a main surface CSK (on the right side of FIG. 17) opposite thereto. The chip CD is formed such that each of the main surfaces CSA and CSK thereof has, e.g., a generally quadrilateral shape. The respective areas of the main surfaces CSA and CSK of the chip CD are, e.g., equal. As can be seen from a comparison between FIGS. 15 and 17, the plane area of the chip CT in which the transistor Tr1 (Tr2) is formed is larger than the plane area of the chip CD in which the diode Df1 (Df2) is formed.

As shown on the left side of FIG. 17, over the main surface CSA of the chip CD, the anode electrode (anode electrode pad or top-side electrode) A is disposed in an exposed state. The anode electrode A is made of a metal material which contains, e.g., aluminum as a main component and to which silicon or the like is added. As shown on the right side of FIG. 17, over the main surface CSK of the chip CD, the cathode electrode (cathode electrode pad or back-side electrode) K is disposed in an exposed state. The cathode electrode K is made of a metal material containing, e.g., aluminum as a main component and formed so as to cover the entire region of the main surface CSK of the chip CD.

FIG. 18 is a main-portion cross-sectional view of the chip in FIG. 17. In the semiconductor substrate SBD of the chip CD, an $p^+$-type semiconductor region NR3 and an $n^-$-type semiconductor region NR4 are formed in ascending order from the lowest layer. The $p^+$-type semiconductor region NR3 is electrically coupled to the cathode electrode K.

On the other hand, in the upper portion the $n^-$-type semiconductor region NR4, a plurality of p-type semiconductor region PR3 are formed in mutually spaced-apart relation. Between the plurality of p-type semiconductor regions PR3, $p^-$-type semiconductor regions PR4 are formed. The anode electrode A described above is electrically coupled to the p-type semiconductor regions PR3 and the p⁻-type semiconductor regions PR4.

In the diode Df1 (Df2) thus configured, when a positive voltage is applied to the anode electrode A and a negative voltage is applied to the cathode electrode K, the pn junctions between the n⁻-type semiconductor region NR4 and the p-type semiconductor regions PR3 are forwardly biased so that a current flows. On the other hand, when a negative voltage is applied to the anode electrode A and a positive voltage is applied to the cathode electrode K, the pn junctions between the n⁻-type semiconductor region NR4 and the p-type semiconductor regions PR3 are backwardly biased so that no current flows. Thus, the diode Df1 (Df2) having the rectifying function can be operated.

<Example of Configuration of Semiconductor Module (Electronic Device)>

Next, a description will be given of an example of a configuration of the semiconductor module (electronic device or power module) in the present first embodiment. FIG. 19 is a plan view of the semiconductor module in the present first embodiment. FIG. 20 is a cross-sectional view along the line IV-IV in FIG. 19. FIG. 21 is a front view of a capacitive element included in the semiconductor module in FIG. 19. Note that, in FIG. 19, various members are shown in a see-through state, and the members overlapping each other in a transparent plan view are given a plurality of reference numerals. In FIG. 20, for improved clarity of illustration, the depiction of the interior of the sealing body MB of each of the packages PK1 and PK2 is omitted.

A semiconductor module PM1 in the present first embodiment is a structure included in the three-phase inverter circuit portion PW1 described above (see FIG. 9). For example, the three packages PK1 and the three packages PK2 are paired up to form three inverter circuits corresponding to three units (three phases). The three inverter circuits are disposed to be arranged along a lateral direction in FIGS. 19 and 20 such that the two packages PK1 and PK2 included in each one of the inverter circuits each corresponding to one unit (one phase) overlap each other in plan view. Each of the packages PK1 and PK2 is disposed to be interposed between the corresponding two of three cooling plates CL1, CL2, and CL3 of a cooling member CLM. In FIG. 20, the upper packages PK1 are for the high side, while the lower packages PK2 are for the low side.

The cooling member (heat sink or heat dissipation member) CLM corresponds to, e.g., the main body portion of a water-cooling device and includes, e.g., the three cooling plates CL1, CL2, and CL3 and a water supply/drainage unit SDU. The cooling plates CL1, CL2, and CL3 and the water supply/drainage unit SDU are made of a metal containing, e.g., copper or aluminum having a high thermal conductivity as a main component. In the cooling plates CL1, CL2, and CL3 and the water supply/drainage unit SDU, cooling pipes CLp (see FIG. 20) through which cooling water (cooling medium) such as, e.g., pure water is allowed to flow are placed. Note that the circled mark "x" and the circled mark "•" shown in the cross sections of the cooling pipes CLp show that the cooling water flows from "x" toward "•"

Each of the cooling plates C1, CL2, and CL3 is formed to have, e.g., a rectangular shape elongated in the lateral direction in FIGS. 19 and 20 in plan view. Specifically, each of the cooling plates CL1, CL2, and CL3 has a side h1, a side h2 opposite to the side h1, and two sides h3 and h4 crossing the sides h1 and h2. Each of the cooling plates C1, CL2, and CL3 is formed to have a size which includes the packages PK1 and PK2 corresponding to the three phases in plan view. That is, the plane area of each of the cooling plates C1, CL2, and CL3 is larger than the plane area of each of the packages PK1 and PK2. The packages PK1 and PK2 are disposed such that the main surfaces PSE and PSC of the sealing bodies MB thereof are included in each of the cooling plates CL1, CL2, and CL3 in plan view.

The foregoing water supply/drainage unit SD is disposed closer to the one side h3 of each of the cooling plates CL1, CL2, and CL3. The water supply/drainage unit SDU serves as a water supply/drainage port portion for the cooling water. That is, the cooling water flows from the water supply/drainage unit SUD into the cooling pipes CLp in the cooling plates CL1, CL2, and CL3 to circulate therein and then returns to the water supply/drainage unit SDU to be drained therefrom. Note that the cooling member CLM is not limited to a water cooling type and can variously be modified. For example, an air cooling member using a heat dissipation fin or the like can also be used appropriately.

As shown in FIG. 19, to the respective portions of the cooling plates CL1, CL2, and CL3 which are closer to the one side h1, a fixation frame FF is attached. The packages PK1 and PK2 are fixed in a state where the external terminals LD thereof are positioned by the fixation frame FF.

At a position (position facing the side surface over which the external terminals LD of the packages PK1 and PK2 corresponding to the three phases are disposed) adjacent to the one side h1 of each of the cooling plates CL1, CL2, and CL3, a driver board DB is disposed. The respective external terminals LD of the packages PK1 and PK2 are electrically coupled to wires in the driver board DB, while being inserted in the through holes of the driver board DB and fixed with a solder or the like.

As shown in FIG. 20, above the uppermost cooling plate CL3, an MCU (Micro Controller Unite) board CB (see FIG. 20) is disposed so as to cover substantially the entire semiconductor module PM1. The MCU board CB is disposed so as to cross the driver board DB and, at the point of intersection therebetween, wires in the MCU board CB and the wires in the driver board DB are electrically coupled to each other.

As also shown in FIG. 20, between the packages PK1 and PK2 and the cooling plates CL1, CL2, and CL3, bus bar plates BSp, BSn, BSwa, and BSwb (equivalent to the foregoing metal plates PC and PE) are interposed. Specifically, between each of the packages PK1 and the cooling plate CL3, the P-terminal bus bar plate (first terminal) BSp is interposed while, between the package PK1 and the cooling plate CL2, the output-terminal bus bar plate (output terminal) BSwa is interposed. On the other hand, between each of the packages PK2 and the cooling plate CL2, the output-terminal bus bar plate (output terminal) BSwb is interposed while, between the package PK2 and the cooling plate CL1, the N-terminal bus bar plate (second terminal) BSn is interposed.

These bus bar plates BSp, BSn, BSwa, and BSwb are made of flat metal plates containing, e.g., copper as a main component and electrically coupled to the packages PK1 and PK2 (i.e., chips CT and CD). The bus bar plates BSp, BSn, BSwa, and BSwb included in the inverter circuit corresponding to one unit have substantially the same shapes and substantially the same sizes (plane areas) in plan view, and are disposed so as to overlap each other in plan view.

Each of the P-terminal bus bar plates BSp has a surface (ninth surface) facing the package PK1 and a surface (tenth surface) opposite thereto. Each of the N-terminal bus bar plates BSn has a surface (eleventh surface) facing the package PK2 and a surface (twelfth surface) opposite thereto. The P-terminal bus bar plate BSp is electrically coupled to a lead-out portion BSpa, while the N-terminal bus bar plate BSn is electrically coupled to a lead-out portion BSna.

The output-terminal bus bar plate BSwa has a surface (thirteenth surface) facing the package PK1 and a surface (fourteenth) surface opposite thereto. The output-terminal bus bar plate BSwb has a surface (fifteenth surface) facing the package PK2 and a surface (sixteenth surface) opposite thereto. These output-terminal bus bar plates BSwa and BSwb are coupled to a common lead-out portion BSwd and electrically coupled to each other. Note that the bus bar plates BSp, BSn, BSwa, and BSwb will be described later.

As also shown in FIG. 19, the capacitive element Cs described above is disposed closer to the other side h2 of each of the cooling plates CL1, CL2, and CL3 (closer to the lead-out portions BSpa, BSpb, and BSwd). The capacitive element Cs is made of, e.g., a case-type film capacitor and disposed for each one of the inverter circuits each corresponding to one unit (one phase) on a one-to-one basis. Each of the capacitive elements Cs is formed to have a rectangular shape in plan view which is defined by, e.g., a side (third side) h5 facing the side h2 of each of the cooling plates CL1, CL2, and CL3, a side h6 opposite thereto, and sides h7 and h8 crossing the sides h5 and h6. As also shown in FIG. 21, in the front surface (surface facing the packages PK1 and PK2) of the capacitive element Cs, a P-terminal socket CSp, a through hole Ch, and an N-terminal socket CSn are disposed. The P-terminal socket CSp is electrically coupled to one of the electrodes of the capacitive element Cs, while the N-terminal socket CSn is electrically coupled to the other electrode of the capacitive element Cs.

As shown in FIG. 19, the through hole Ch is formed to extend from the front surface of the capacitive element Cs to the opposite surface thereof through the capacitive element Cs. The common lead-out portion BSwd of the output-terminal bus bar plates BSwa and BSwb penetrates the capacitive element Cs through the through hole Ch and protrudes from the side h6 of the capacitive element Cs. In the protruding portion of the common lead-out portion BSwd, a current sensor SS is disposed. The current sensor SS is a detector which detects an output current of the inverter circuit corresponding to one unit (one phase) and is electrically coupled to the common lead-out portion BSwd of the output-terminal bus bar plates BSwa and BSwb of each of the inverter circuits.

In the description given above, it is assumed that the structure forming the three-phase inverter circuit is the semiconductor module (electronic device). However, it may also be possible to assume that a structure forming the inverter circuit corresponding to one unit (one phase) (unit structure including the packages PK1 and PK2, the capacitive element Cs, the cooling member CLM, the bus bar plates BSp, BSn, BSwa, and BSwb, and the like) is the semiconductor module (electronic device).

Next, a description will be given of an example of a configuration of each of the unit structures forming the semiconductor module PM1 in the present first embodiment. FIG. 22 is a cross-sectional view along the line V-V in FIG. 19. FIG. 23 is an enlarged cross-sectional view of the region enclosed in the broken line in FIG. 20.

The packages PK1 and PK2 included in the inverter circuit corresponding to one unit (one phase) are disposed to be interposed between the cooling plates CL3 and CL2 and between the cooling plates CL2 and CL1 such that the respective metal electrodes EC thereof face upward and the respective metal electrodes EE thereof face downward.

The metal electrode EC of the upper package PK1 is joined in close contact relation to the P-terminal bus bar plate BSp via a conductive adhesion layer (first conductor layer) am1 made of a solder or the like and electrically coupled thereto. This can enhance a thermal conductivity between the metal electrode EC of the package PK1 and the bus bar plate BSp. The bus bar plate BSp is also joined in close contact relation to the cooling plate (first cooling body and fourth cooling body) CL3 via an insulating member (first insulator and fifth insulator) im1. The insulating member im1 electrically isolates the bus bar plate BSp (metal electrode EC of the package PK1) and the cooling plate CL3 from each other. The insulating member im1 has a thin insulating plate and a heat dissipation grease (not shown in FIGS. 21 and 22). The thin insulating plate of the insulating member im1 is made of, e.g., a ceramic. The heat dissipation grease of the insulating member im1 is made of an insulating material having a high thermal conductivity and embedded in the space between the members. This can reduce a thermal resistance between the bus bar plate BSp and the cooling plate CL3 compared to the case where the heat dissipation grease is not used.

The metal electrode EE of the upper package PK1 is joined in close contact relation to the output-terminal bus bar plate BSwa via a conductive adhesion layer (third conductor layer) am2 made of a solder or the like and electrically coupled thereto. This can enhance a thermal conductivity between the metal electrode EE of the package PK1 and the bus bar plate BSwa. The bus bar plate BSwa is also joined in close contact relation to the cooling plate CL2 via an insulating member (third insulator) im2. The insulating member im2 electrically insulates the bus bar plate BSwa (metal electrode EE of the package PK1) and the cooling plate CL2 from each other. The configuration of the insulating member im2 is the same as the configuration of the insulating member im1. This can reduce a thermal resistance between the bus bar plate BSwa and the cooling plate CL2 compared to the case where the insulating member im2 is not used (where the heat dissipation grease is not used).

The metal electrode EC of the lower package PK2 is joined in close contact relation to the output-terminal bus bar plate BSwb via a conductive adhesion layer (third conductor layer) am3 made of a solder or the like and electrically coupled thereto. This can enhance a thermal conductivity between the metal electrode EC of the package PK2 and the bus bar plate BSwb. The bus bar plate BSwb is joined in close contact relation to the cooling plate CL2 via an insulating member (fourth insulator) im3. The insulating member im3 electrically insulates the bus bar plate BSwb (metal electrode EC of the package PK2) and the cooling plate CL2 from each other. The configuration of the insulating member im3 is the same as that of the insulating member im1. This can reduce a thermal resistance between the bus bar plate BSwb and the cooling plate CL2 compared to the case where the insulating member im3 is not used (where the heat dissipation grease is not used).

The metal electrode EE of the lower package PK2 is joined in close contact relation to the N-terminal bus bar plate BSn via a conductive adhesion layer (second conductor layer) am4 made of a solder or the like and electrically coupled thereto. This can enhance a thermal conductivity between the metal electrode EE of the package PK2 and the bus bar plate BSn. The bus bar plate BSn is also joined in close contact relation to the cooling plate (second cooling body and fifth cooling body) CL1 via an insulating member (second insulator and sixth insulator) im4. The insulating member im4 electrically insulates the bus bar plate BSn (metal electrode EE of the package PK2) and the cooling plate CL1 from each other. The configuration of the insulating member im4 is the same as that of the insulating member im1. This can reduce a thermal resistance between the bus bar plate BSn and the cooling plate CL1 compared to the case where the insulating member im4 is not used (where the heat dissipation grease is not used).

As shown in FIG. 22, the lead-out portion BSpa of the P-terminal bus bar plate BSp is electrically coupled to one of the electrodes of the capacitive element Cs via the socket CSp. On the other hand, the lead-out portion BSna of the N-terminal bus bar plate BSn is electrically coupled to the other electrode of the capacitive element Cs through the socket CSn. The output-terminal bus bar plates BSwa and BSwb are mechanically and electrically coupled to the common lead-out portion BSwd through a coupling metal part BSwe. The common lead-out portion BSwd is not directly electrically coupled to the capacitive element Cs, but is electrically coupled to the foregoing U-terminal, V-terminal, or W-terminal.

The left and right sides of FIG. 24 show main-portion plan views of each of the unit structures of the semiconductor module in FIG. 19. The left side of FIG. 24 shows the upper package PK1 side, while the right side of FIG. 24 shows the lower package PK2 side. Note that, in FIG. 24, various members are shown in a see-through state, and the members overlapping in a transparent plan view are given a plurality of reference numerals.

Each of the bus bar plates BSp, BSn, BSwa, and BSwb is formed to have, e.g., a generally quadrilateral shape in plan view. That is, each of the bus bar plates BSp, BSn, BSwa, and BSwb has a side (first side and fourth side) h9 facing the side (third side) h5 of the capacitive element Cs, a side h10 (second side) opposite thereto, and two sides (fifth side) h11 and h12 crossing the sides h9 and h10.

Each of the bus bar plates BSp, BSn, BSwa, and BSwb is formed to have a plane area larger than the plane area of each of the sealing body MB and the metal electrodes EC and EE of each of the packages PK1 and PK2 and smaller than the plane area of each of the cooling plates CL1, CL2, and CL3. Each of the bus bar plates BSp, BSn, BSwa, and BSwb overlaps the sealing body MB and the metal electrodes EC and EE of each of the packages PK1 and PK2 in plan view so as to include the metal electrodes EC and EE of each of the packages PK1 and PK2 in plan view. Each of the bus bar plates BSp, BSn, BSwa, and BSwb also overlaps the sealing body MB and the metal electrodes EC and EE of each of the packages PK1 and PK2 in plan view so as to include the two chips CT and CD of each of the packages PK1 and PK2 in plan view.

Accordingly, in the present first embodiment, the heat generated in the packages PK1 and PK2 can be transmitted from the large-area metal electrodes EC and EE to the large-area bus bar plates BSp, BSwa, BSwb, and BSn to allow the thermal conductivity to be increased. The heat transmitted to the metal electrodes EC and EE of the packages PK1 and PK2 can also be diffused into a wider range using the bus bar plates BSp, BSwa, BSwb, and BSn having areas larger than those of the metal electrodes EC and EE and transmitted to the cooling plates CL3, CL2, and CL1. In addition, between the packages PK1 and PK2, i.e., between the output-terminal bus bar plates BSwa and BSwb also, the cooling plate CL2 is interposed, resulting in a configuration in which the packages PK1 and PK2 are interposed between the cooling plates CL3 and CL2 and between the cooling plates CL2 and CL1. This can improve the heat dissipation property of each of the packages PK1 and PK2 and thus improve the reliability (performance) of the semiconductor module PM1. In addition, since the plane area of each of the bus bar plates BSp, BSn, BSwa, and BSwb is smaller than the plane area of each of the cooling plates CL1, CL2, and CL3, there is no increase in the size of the semiconductor module PM1. Therefore, it is possible to provide the small-size semiconductor module PM1 having high performance and high reliability. Moreover, since the foregoing metal plates PC and PE (see FIG. 6, etc.) are configured using the bus bar plates BSp, BSn, BSwa, and BSwb, there is no increase in the number of the components.

In the case described herein, each of the bus bar plates BSp, BSn, BSwa, and BSwb is disposed so as to include the metal electrodes EC and EE of the packages PK1 and PK2 in plan view, but the disposition of the bus bar plates BSp, BSn, BSwa, and BSwb is not limited thereto. For example, each of the bus bar plates BSp, BSn, BSwa, and BSwb may also be disposed so as to include the main surfaces PSE and PSC (see FIG. 11, etc.) of the sealing bodies MB of the packages PK1 and PK2 in plan view. This can further improve the heat dissipation property of each of the packages PK1 and PK2.

By setting the plane area of each of the bus bar plates BSp, BSn, BSwa, and BSwb larger than the plane area of each of the metal electrodes EC and EE of the packages PK1 and PK2, it is possible to reduce the electrical resistances at the collector electrode C and the emitter electrode E of each of the inverter circuits. Therefore, it is possible to improve the electrical property and reliability of the semiconductor module PM1.

Also, in the present first embodiment, the external terminals LD of the packages PK1 and PK2 and the lead-out portions BSpa, BSna, and BSwd of the bus bar plates BSp, BSn, BSwa, and BSwb are disposed at exactly opposite positions. Specifically, the external terminals LD of the packages PK1 and PK2 are disposed so as to cross the one side h1 of each of the cooling plates CL1, CL2, and CL3. On the other hand, the lead-out portions BSpa, BSna, and BSwd of the bus bar plates BSp, BSn, BSwa, and BSwb are disposed so as to cross the other side h2 of each of the cooling plates CL1, CL2, and CL3. The following is the reason for this.

That is, since large currents flow in the lead-out portions BSpa, BSna, and BSwd of the bus bar plates BSp, BSn, BSwa, and BSwb in the inverter circuit, each of the lead-out portions BSpa, BSna, and BSwd has a configuration which is resistant to noise and also has a high breakdown voltage. By contrast, in the external terminals LD of the packages PK1 and PK2, small control signal currents flow so that each of the external terminals LD has a configuration which is susceptible to noise and also has a relatively low breakdown voltage. Accordingly, when the lead-out portions BSpa, BSna, and BSwd and the external terminals LD are disposed at the same position, noise occurs in the external terminals LD or the external terminals LD break down under the influence of the large currents flowing in the lead-out portions BSpa, BSna, and BSwd.

To prevent this, in the present first embodiment, the lead-out portions BSpa, BSna, and BSwd and the external terminals LD are disposed at exactly opposite positions. This can inhibit or prevent noise from being transmitted from the lead-out portions BSpa, BSna, and BSwd to the external terminals LD and also ensure a breakdown voltage for each of the external terminals LD. Therefore, it is possible to improve the electrical property and reliability of the semiconductor module M1. However, the positional relationship between the lead-out portions BSpa, BSna, and BSwd and the external terminals LD is not limited to an exactly opposite positional relationship. For example, the lead-out portions BSpa, BSna, and BSwd and the external terminals LD may also be disposed at 90 degree shifted positions. Specifically, it may also be possible that the external terminals LD are disposed so as to cross the side h1 of each of the cooling plates CL1, CL2, and CL3, and either one or all of the lead-out portions BSpa, BSna, and BSwd are disposed so as to cross the side h3 or h4 of each of the cooling plates CL1, CL2, and CL3.

FIG. 25 is a main-portion enlarged plan view of the unit structure of the semiconductor module in FIG. 19. FIG. 26 is a schematic main-portion cross-sectional view along the line V-V in FIG. 19. Note that, in FIG. 25, various members are shown in a see-through state, and the members overlapping each other in a transparent plan view are given a plurality of reference numerals. FIG. 26 shows the coupling relation of the capacitive element of the semiconductor module.

As shown in FIG. 25, a length Lx1 of each of the sides h9 and h10 of the bus bar plates BSp, BSn, BSwa, and BSwb is larger than a length Lx2 of each of the sides h11 and h12 thereof crossing the sides h9 and h10. Also, a distance Lx3 between the side (third side) h5 of the capacitive element Cs and the side (first side and fourth side) h9 of the bus bar plates BSp, BSn, BSwa, and BSwb is smaller than the length Lx2 of each of the sides h11 and h12 of the bus bar plates BSp, BSn, BSwa, and BSwb. Such a configuration allows a reduction in the distance between the pair of electrodes of the capacitive element Cs, as shown in FIG. 26. Since the electrical resistance between the pair of electrodes of the capacitive element Cs can thus be reduced, the circuit property of the semiconductor module PM1 can be improved.

FIG. 27 is a plan view showing an example of the circulation of cooling water in the semiconductor module in FIG. 19. FIG. 28 is a main-portion enlarged plan view of each of the unit structures of the semiconductor module in FIG. 27. Note that each of the arrows shows the direction in which cooling water flows.

As shown in FIG. 27, the cooling water injected from the water supply/drainage unit SDU along the one side h3 of each of the cooling plates CL1, CL2, and CL3 passes through the plurality of packages PK1 and PK2 and flows to the vicinity of the other side h4 thereof along the longitudinal direction of each of the cooling plates CL1, CL2, and CL3. Then, the cooling water flows back in the vicinity of the other side h4 to pass through the plurality of packages PK1 and PK2 again and return to the water supply/drainage unit SDU along the one side h3 of each of the cooling plates CL1, CL2, and CL3. This allows the plurality of packages PK1 and PK2 to be cooled. In particular, in the present first embodiment, as shown in FIG. 28, the manner in which the cooling water flows is set such that the chips CT in which the transistors Tr1 and Tr2 (see FIG. 10, etc.) are formed are cooled before the chips CD in which the diodes Df (see FIG. 10, etc.) are cooled. This allows the chips CT in which the temperature of the generated heat is highest to be cooled with the cooling water at a lower temperature. Therefore, it is possible to improve the efficiency of cooling of the packages PK1 and PK2.

<Example of Manufacturing Method of Semiconductor Module (Electronic Device)>

<Example of Manufacturing Method of Packages (Semiconductor Device)>

Next, a description will be given of an example of a method of manufacturing the packages PK1 and PK2 included in the semiconductor module in the present first embodiment. FIGS. 29 to 32 are illustrative views each showing the flow of the manufacturing process of the packages included in the semiconductor module in FIG. 19. Note that, in FIGS. 29 to 31, plan views and cross-sectional views each showing the outline of the individual steps are illustrated while, in FIG. 32, a plan view showing the outline of the individual steps is illustrated. Since the structures of the packages PK1 and PK2 are the same as described above, an example of a method of manufacturing the package PK1 will be described as a representative.

First, as shown in FIG. 29, a lead frame LDF is placed in an assembly area (Step St1). The lead frame LDF is made of a metal containing, e.g., copper as a main component and has a shape formed by, e.g., an etching process or a pressing process. The lead frame LDF integrally has a plurality of lead portions LDa, suspension lead portions LDb and LDc, and a dam bar portion LDd. In the chip mounting region of the lead frame LDF, a metal plate ECP is disposed, while being suspended by the suspension lead portions LDb and LDc. Note that the lower cross-sectional view in the lead frame placement step in FIG. 29 is the cross-sectional view along the line VI-VI in the upper plan view in the lead frame placement step in FIG. 29. The metal plate ECP is the member forming the metal electrode EC, which is formed thicker than the lead frame LDF (the plurality of lead portions LDa, the suspension lead portions LDb and LDc, and the dam bar portion LDd). Through holes Lh2 formed in the suspension lead portion LDc are intended to reduce the probability of peeling of the metal plate ECP from the sealing body MB (see FIG. 11, etc.).

Subsequently, over the metal plate ECP, the chips CT and CD are mounted (Step St2). That is, after paste-like conductive adhesion layers or the like are applied onto the respective regions of the metal plate ECB where the chips CT and CD are to be mounted, the chips CT and CD are pressed against the conductive adhesion layers in the individual mounting regions to be mounted over the metal plate ECP. Note that the lower cross-sectional view in the chip mounting step in FIG. 29 is the cross-sectional view along the line VI-VI in the upper plan view in the chip mounting step in FIG. 29.

The chip CT is mounted such that the collector electrode thereof faces the metal plate ECP. The collector electrode of the chip CT is electrically coupled to the metal plate ECP. The chip CD is mounted such that the cathode electrode thereof faces the metal plate ECP. The cathode electrode of the chip CD is electrically coupled to the metal plate ECP. For the conductive adhesion layer, e.g., a high-melting-point solder can be used. In the case shown herein by way of example, the metal plate ECP and the lead frame LDF are integrally coupled to each other, but the method of coupling the metal plate ECP to the lead frame LDF is not limited thereto. For example, it may also be possible to use a method which mounts the chips CT and CD over the metal plate ECP in a singulated state and then couple the suspension lead portions LDb and LDc of the lead frame LDF to the metal plate ECP.

Next, as shown in FIG. 30, the lead portions LDa of the lead frame LF are electrically coupled to the signal electrodes Sg of the chip CT via the wires BW (Step St3). The wires BW are formed of a metal containing, e.g., aluminum as a main component, but the metal forming the wires BW is not limited thereto. For example, the wires BW may also be formed of a metal containing, e.g., gold or copper as a main component. Note that the lower cross-sectional view in the wire bonding step in FIG. 30 is the cross-sectional view along the line VII-VII in the upper plan view in the wire bonding step in FIG. 30.

Subsequently, the spacer SP1 is mounted over the chip CT, while the spacer SP2 is mounted over the chip CD (Step St4). That is, after paste-like conductive adhesion layers or the like are applied onto the emitter electrode E of the chip CT and the anode electrode A of the chip CD, the spacers SP1 and SP2 are pressed thereagainst to be mounted over the chips CT and CD. Each of the spacers SP1 and SP2 is made a metal containing, e.g., copper as a main component. The spacer SP1 is electrically coupled to the emitter electrode E of the chip CT, while the spacer SP2 is electrically coupled to the anode electrode A of the chip CD. Note that the lower cross-sectional view in the spacer mounting step in FIG. 30 is the cross-sectional view along the line VII-VII in the upper plan view in the spacer mounting step in FIG. 30.

Next, as shown in FIG. 31, over the spacers SP1 and SP2, the metal plate EEP is mounted (Step St5). That is, after paste-like conductive adhesion layers or the like are applied onto the spacers SP1 and SP2, a metal plate EEP is pressed thereagainst from above to be mounted over the spacers SP1 and SP2. The metal plate EEP is the member forming the metal electrode EE described above, which is made of a metal containing, e.g., copper as a main component. The metal plate EEP has respective protruding portions which are formed along the side thereof closer to the lead portions LDa and along the side thereof opposite thereto. These protruding portions are made of relatively thin metal plates and, in respective portions of the two protruding portions, through holes Lh3 are formed. The through holes Lh3 are intended to reduce the probability of peeling of the metal plate EEP from the sealing body MB (see FIG. 11, etc.). The metal plate EEP is electrically coupled to the emitter electrode E (see FIG. 30, etc.) of the chip CT via the spacer SP1 and electrically coupled to the anode electrode A (see FIG. 30, etc.) of the chip CD via the spacer SP2. As a result, the emitter electrode E of the chip CT is electrically coupled to the anode electrode A of the chip CD through the metal plate EEP. Note that the lower cross-sectional view in the metal plate mounting step in FIG. 31 is the cross-sectional view along the line VII-VII in the upper plan view in the metal plate mounting step in FIG. 31.

Subsequently, by sealing the chips CT and CD, the spacers SP1 and SP2, the wires BW, and the like by a transfer mold method or the like, the sealing body MB is molded (Step St6). That is, in a state where the portions of the lead frame DLF which are to be molded in the sealing body are contained in the cavity of a mold die (an upper die and a lower die) not shown, a resin is injected under pressure into the cavity of the mold die. The resin forming the sealing body MB contains, e.g., an epoxy-based thermosetting resin as a main component and filler particles made of silica or the like. When the resin is heated in the mold die and partially cured to a given degree, the lead frame LDF can be removed from the mold die. After removed from the mold die, the lead frame LDF is further heated in a heating oven (baking oven) to bring the resin into a completely cured state (state where the thermosetting resin component is entirely cured) and thus allow the sealing body MB to be obtained. Then, a cutting process is performed on the sealing body MB to expose respective portions of the metal plates ECP and EEP from the main surfaces PSC and PSE of the sealing body MB. Note that the lower cross-sectional view in the sealing step in FIG. 31 is the cross-sectional view along the line VII-VII in the upper plan view in the sealing step in FIG. 31.

Then, after marks and the like are added to the sealing body MB, as shown in FIG. 32, a plating process is performed on the exposed surfaces of the lead frame LDF and the metal plates ECP and EEP to form metal films (plating films) (Step St7). In this step, the lead frame LDF is dipped in, e.g., an electrolytic solution (plating solution) including a solder material and, using the lead frame LDF as the cathode electrode, a current is caused to flow. Thus, on the metal portions exposed from the sealing body MB, metal films are selectively formed. The metal films have the function of improving wettability with respect to the solder when the packages PK1 and PK2 are mounted over the substrate via the solder or the like.

Subsequently, by partially cutting the lead frame LDF, the package PK1 is cut away from the lead frame LDF (Step St8). In this step, by appropriately cutting the lead portions LDa, the dam bar portion LDd, and the suspension lead portions LDb and LDc of the package PK1, the package PK1 is separated from the lead frame LDF. The lead portions LDa serve as the external terminals LD of the package PK1. In the case shown in this example, the one package PK1 is acquired from the one lead frame LDF. However, in terms of improving the manufacturing efficiency, it is also possible to acquire the plurality of packages PK1 from the one lead frame LDF. Also, in this step, the suspension lead portions LDb and LDc are cut simultaneously with singulation. However, the time when the suspension lead portions LDb and LDc are cut is not limited thereto. For example, it may also be possible to perform the molding of the lead portions LDa and the cutting of the suspension lead portions LDb and LDc during the step of shaping the lead portions LDa after the singulation.

Then, a baking process is performed on the packages PK1. Subsequently, an outer appearance inspection, an electrical test, and the like are performed thereon, and the packages PK1 determined to be non-defective (non-defective products) are mounted in the semiconductor module PM1. Alternatively, when the semiconductor module PM1 is assembled in another place, the non-defective packages PK1 are shipped as products.

<Example of Method of Assembling Semiconductor Module (Electronic Device)>

Next, referring to FIGS. 34 to 43, a description will be given of the assembly process of the semiconductor module in the present first embodiment along the flow in FIG. 33. FIG. 33 is an illustrative view showing an assembly flow for the semiconductor module in FIG. 19. FIGS. 34 to 36 are main-portion cross-sectional views of the semiconductor module in FIG. 19 during the assembly process thereof. FIGS. 37 to 43 are plan views of the semiconductor module after the assembly step in FIG. 36 during the assembly process thereof. Note that, in FIGS. 37 to 43, various members are shown in a see-through state, and the members overlapping each other in a transparent plan view are given a plurality of reference numerals.

First, as shown in FIG. 34, to the metal electrodes EC and EE (EC and EE) exposed from the main surfaces PSC and PSE of the sealing body MB of the package PK1 (PK2), the bus bar plates BSp (BSwb) and BSwa (BSn) are joined via the conductive adhesion layers am1 (am3) and am2 (am4) made of a solder or the like (Step MSt1). The thicknesses of the conductive adhesion layers am1 to am4 are, e.g., about 0.1 mm.

Subsequently, as shown in FIG. 35, onto the respective facing surfaces of the bus bar plate BSp and the cooling plate CL3, the respective facing surfaces of the bus bar plate BSwa and the cooling plate CL2, the respective facing surfaces of the bus bar plate BSwb and the cooling plate CL2, and the respective facing surfaces of the bus bar plate BSn and the cooling plate CL1, a heat dissipation grease Gr is printed (Step MSt2). The heat dissipation grease Gr is made of an insulating material having a high heat dissipation property such as, e.g., silicone grease and has a thickness of, e.g., about 0.15 mm.

Subsequently, between the bus bar plate BSp and the cooling plate CL3, between the bus bar plate BSwa and the cooling plate CL2, between the bus bar plate BSwb and the cooling plate CL2, and between the bus bar plate BSn and the cooling plate CL1, insulating plates ip are interposed. Each of the insulating plates ip is made of, e.g., a high-thermal-conductivity ceramic or an insulating film and has a thickness of, e.g., about 0.25 mm.

Then, in that state, as shown by the arrows in FIG. 36, the cooling plate CL3 and the cooling plate CL1 are pressed in a direction which brings the cooling plates CL3 and CL1 closer to each other. Thus, the cooling plate CL3 and the bus bar plate BSp are joined together using the insulating member im1, the cooling plate CL2 and the bus bar plates BSwa and BSwb are joined together using the insulating members im2 and im3, and the cooling plate CL1 and the bus bar plate BSn are joined together using the insulating member im4 (Step MSt3). Examples of a pressure joining method include a method in which the cooling plates CL1 and CL3 are pressed by being screwed together, a method in which the cooling plates CL1 an CL3 are pressed using a screw member provided separately, and the like.

Then, as shown in FIG. 37, the water supply/drainage unit SDU, piping PP1, and the like are attached to the cooling plates CL1 to CL3 to assemble a module main body (Step MSt4).

Concurrently with the assembly process of the module main body described above, control boards such as the driver board DB and the MCU board CB each described above are assembled. That is, after each of the control boards is designed (Step BSt1), the individual control boards are electrically coupled to each other (Step SBt2).

Next, as shown in FIG. 38, the module main body shown in FIG. 37 is contained in a case such as a module housing MEn (Step PSt1). Subsequently, as shown in FIG. 39, the capacitive element Cs is contained in the module housing MEn, and wire coupling of each of the capacitive elements Cs is performed (Step PSt2). In this step, for example, the pair of electrodes of the capacitive element Cs and the bus bar plates BSp and BSn are electrically coupled to each other via sockets or the like. The capacitive element CS is also fixed using a bolt or the like. Then, as shown in FIG. 40, the current sensor SS is placed (Step PSt3). The current sensor SS is electrically coupled to the lead-out portion BSwd (see FIGS. 19, 22, etc.) via a socket or the like in the subsequent step.

Next, as shown in FIG. 41, the control boards (the driver board DB and the MCU board CB) described above are placed (Step PSt4). In this step, the external terminals LD of the packages PK1 and PK2 are inserted into the through holes of the driver board DB and joined using a solder or the like. Also, various wires are electrically coupled to each other through sockets or the like.

Subsequently, as shown in FIG. 42, the lead-out portion BSwd serving as the UVW-phase wires of the packages PK1 and PK2 is placed. Also, various control wires and power supply wires are coupled (Step PSt5). Then, as shown in FIG. 43, the water supply/drainage piping PP1 and piping PP2 are mechanically coupled to each other via a socket or the like (Step PSt6). Thus, the semiconductor module PM1 is assembled. Then, an outer appearance inspection and a test such as an electrical test are performed on the semiconductor modules PM1, and the semiconductor modules PM1 determined to be non-defective are shipped as products.

First Modification of First Embodiment

Next, a description will be given of an example of a configuration of a semiconductor module (electronic device) according to a first modification of the first embodiment. FIG. 44 is a plan view of a semiconductor module in the first modification of the first embodiment. FIG. 45 is a cross-sectional view along the line VIII-VIII in FIG. 44. FIG. 46 is a cross-sectional view along the line IX-IX in FIG. 44. FIG. 47 is an enlarged cross-sectional view of the region enclosed in the broken line in FIG. 45. The left side of FIG. 48 shows a main-portion perspective view of each of the unit structures of the semiconductor module in FIG. 44, while the right side of FIG. 48 shows a main-portion exploded perspective view of the unit structure of the semiconductor module on the left side of FIG. 48. Note that, in FIG. 44, various members are shown in a see-through state, and the members overlapping each other in a transparent plan view are given a plurality of reference numerals. In FIG. 45, for clearer illustration, the depiction of the interiors of the sealing bodies MB of the packages PK1 and PK2 is omitted.

In a semiconductor module PM2 in the first modification of the present first embodiment, as shown in FIGS. 44 to 47, the water supply/drainage units SDU are disposed on both sides of the main portion (portion having the packages PK1 and PK2) of each of the unit structures of the semiconductor module PM2 in a widthwise direction (direction along the side h1). Specifically, the water supply/drainage units SDU of the cooling member CLM are disposed such that the main portion of each of the unit structures of the semiconductor module PM2 is interposed therebetween.

As also shown in FIGS. 45 and 47, the middle cooling plate CL2 in each of the unit structures of the semiconductor module PM2 is divided into halves. Between the resulting two cooling plates CL2, a support plate (conductor member) SPP is disposed. The support plate SPP is made of a metal plate containing, e.g., copper as a main component. As shown in FIG. 48, between the respective facing surfaces of the output-terminal bus bar plates BSwa and BSwb, the support plate SPP is disposed at a middle in the widthwise direction (direction along the side h1) thereof and joined to the respective facing surfaces of the output-terminal bus bar plates BSwa and BSwb. That is, the both end portions of the support plate SPP in the widthwise direction (shorter direction) thereof are joined (by pressure joining such as swage joining) to the bus bar plates BSwa and BSwb facing the both widthwise end portions thereof, while being fitted in respective grooves Gv formed in one surfaces of the bus bar plates BSwa and BSwb.

Thus, the outer-terminal bus bar plates BSwa and BSwb are electrically coupled to each other through the support plate SPP. This allows a further reduction in the resistance between the bus bar plates BSwa and BSwb, i.e., the resistance between the emitter electrode of the package PK1 and the collector electrode of the package PK2 than in the case in the first embodiment described above. Accordingly, it is possible to improve the electrical property of the semiconductor module PM2. Note that, between the support plate SPP and the cooling plate CL2, an insulating member (not shown) is interposed to electrically insulate the support plate SPP and the cooling plate CL2 from each other. The support plate SPP also forms the common lead-out portion BSwd of the output-terminal bus bar plates BSwa and BSwb.

FIG. 49 is a schematic main-portion cross-sectional view along the line X-X in FIG. 44. FIG. 49 shows herein the coupling relation of the capacitive element in the semiconductor module in the first modification.

The configuration in FIG. 24 described above is substantially the same. In the first modification of the present first embodiment, as described above, the support plate SPP is disposed between the bus bar plates BSwa and BSwb. As a result, as shown in FIG. 49, the output-terminal bus bar plates BSwa and BSwb are electrically coupled to each other through the support plate SPP without bypassing the cooling plate CL2. This achieves a further reduction in the distance between the pair of electrodes of the capacitive element Cs than in the case in the first embodiment described above. In other words, the resistance between the pair of electrodes of the capacitive element Cs can further be reduced to allow a further improvement in the circuit property of the semiconductor module PM2.

FIG. 50 is a main-portion enlarged plan view of the unit structure of the semiconductor module in FIG. 44, which shows an example of the circulation of cooling water in the semiconductor module. FIG. 51 is a main-portion enlarged cross-sectional view of the unit structure of the semiconductor module in FIG. 44, which shows an example of the circulation of cooling water in the semiconductor module. Note that each of the arrows shows the direction in which the cooling water flows.

In this case, the cooling water injected from each of the water supply/drainage units SDU on both sides of the packages PK1 and PK2 interposed therebetween flows to the widthwise middle (i.e., the position where the support plate SPP is placed) of each of the packages PK1 and PK2 and then flows back there to return to each of the water supply/drainage units SDU as an injection source. In this case also, the manner in which the cooling water flows is set such that the chips CT in which the transistors Tr1 and Tr2 are formed are cooled before the chips CD in which the diodes Df are formed are cooled. Therefore, in the same manner as in the first embodiment described above, it is possible to improve the efficiency of cooling of the packages PK1 and PK2.

The configuration and effects are otherwise the same as in the first embodiment described above. A method of manufacturing the semiconductor module PM2 is also substantially the same as the manufacturing method in the first embodiment described above.

Second Modification of First Embodiment

Next, a description will be given of an example of a configuration of a semiconductor module (electronic device) according to a second modification of the first embodiment. FIG. 52 is a plan view of the semiconductor module in the second modification of the first embodiment. FIG. 53 is a cross-sectional view along the line VIII-VIII in FIG. 52. FIG. 54 is a cross-sectional view along the line XI-XI in FIG. 52. FIG. 55 is an enlarged cross-sectional view of the region enclosed in the broken line in FIG. 53. FIG. 56 is a schematic main-portion cross-sectional view along the line X-X in FIG. 52. Note that, in FIG. 52, various members are shown in a see-through state, and the members overlapping each other in a transparent plan view are given a plurality of reference numerals. In FIG. 53, for clearer illustration, the depiction of the interiors of the sealing bodies MB in the packages PK1 and PK2 is omitted. FIG. 56 shows herein the coupling relation of the capacitive element of the semiconductor module in the second modification.

As shown in FIGS. 52 and 53, the structure of the cooling member CLM included in a semiconductor module PM3 in the second modification is substantially the same as in the first modification described above. An example of the circulation of cooling water is also the same as in the first modification described above. However, in the semiconductor module PM3 in the second modification, the support plate SPP is not interposed between the output-terminal bus bar plates BSwa and BSwb, and the middle cooling plate PL2 is not divided into halves.

Also, as shown in FIG. 54, in the semiconductor module PM3 in the second modification, the positioning of the packages PK1 and PK2 is reversed compared to that of the packages PK1 and PK2 in each of the first embodiment (see FIG. 22, etc.) and the first modification (see FIG. 46, etc.) each described above. That is, the packages PK1 and PK2 are disposed between the cooling plates CL3 and CL2 and between the cooling plates CL2 and CL1 with the respective metal electrodes EE thereof facing upward and with the respective metal electrodes EC thereof facing downward.

The metal electrode EC of the upper package PK1 is joined in close contact relation to the cooling plate (sixth cooling body) CL2 via the conductive adhesion layer am1, the P-terminal bus bar plate BSp, and the insulating member (seventh insulator) im1 which are named in descending order in FIG. 54. The metal electrode EE of the upper package PK1 is joined in close contact relation to the cooling plate (seventh cooling body) CL3 via the conductive adhesion layer am2, the output-terminal bus bar plate BSwa, and the insulating member (ninth insulator) im2 which are named in ascending order in FIG. 54.

On the other hand, the metal electrode EC of the lower package PK2 is joined in close contact relation to the cooling plate (eighth cooling body) CL1 via the conductive adhesion layer am3, the output-terminal bus bar plate BSwb, and the insulating member (tenth insulator) im3 which are named in descending order in FIG. 54. The metal electrode EE of the lower package PK2 is joined in close contact relation to the cooling plate (sixth cooling body) CL2 via the conductive adhesion layer am4, the N-terminal bus bar plate BSn, and the insulating member (eighth insulator) im4 which are named in ascending order in FIG. 54.

In the semiconductor module PM3 in the present second modification, the P-terminal bus bar plate BSp and the N-terminal bus bar plate BSn are disposed between the packages PK1 and PK2 with the middle cooling plate CL2 being interposed therebetween. In addition, as shown in FIG. 56, the lead-out portion BSpa of the P-terminal bus bar plate BSp and the lead-out portion BSna of the N-terminal bus bar plate BSn are disposed in adjacent and facing relation, while the respective currents Iss and Idd flowing therein are oppositely directed. That is, in the semiconductor module PM3 in the second modification, the distance between the lead-out portion BSpa of the P-terminal bus bar plate BSp and the lead-out portion BSna of the N-terminal bus bar plate BSn which are adjacent to each other can be reduced compared to that in the first embodiment described above (and in the first modification thereof). This can reduce parasitic inductance and thus further improve the circuit property of the semiconductor module PM3.

The configuration and effects are otherwise the same as in the first embodiment described above. A method of manufacturing the semiconductor module PM3 is also substantially the same as the manufacturing method in the first embodiment described above.

Second Embodiment

Next, a description will be given of an example of a configuration of a semiconductor module (electronic device) according to the present second embodiment. FIG. 57 is a plan view of each of the unit structures of the semiconductor module according to the second embodiment. FIG. 58 is a transparent plan view of the unit structure of the semiconductor module in FIG. 57. FIG. 59 is a main-portion enlarged plan view of the semiconductor module in FIG. 58. FIG. 60 is a schematic perspective view of the semiconductor module in FIG. 59. FIG. 61 is a main-portion plan view showing packages and an output-terminal bus bar plate which are included in the semiconductor module in FIG. 57 in an extracted manner. FIG. 62 is a main-portion plan view showing the packages and an upper cooling plate which are included in the semiconductor module in FIG. 57 in an extracted manner. FIG. 63 is a cross-sectional view along the line XII-XII in FIGS. 57 and 58. FIG. 64 is a schematic main-portion cross-sectional view along the line XII-XII in FIGS. 57 and 58. Note that FIG. 64 shows the coupling relation of the capacitive element in the semiconductor module in FIG. 57.

As shown in FIGS. 58 to 61, in a semiconductor module PM4 in the present second embodiment, the packages PK1 and PK2 are mounted side by side over a common output-terminal bus bar plate BSw. In addition, as shown in FIG. 63, the packages PK1 and PK2 are disposed to be interposed between the cooling plates CL1 and CL2. However, in the present second embodiment, the vertical orientation of the package PK1 is opposite to that of the package PK2. Specifically, the package PK1 is disposed between the cooling plates CL1 and CL2 such that the metal electrode EC thereof faces upward and with the metal electrode EE thereof faces downward. On the other hand, the package PK2 is disposed between the cooling plates CL1 and CL2 such that the metal electrode EE thereof faces upward and the metal electrode EC thereof faces downward.

The metal electrode EC of the package PK1 is joined in close contact relation to the cooling plate (tenth cooling body) CL2 via the conductive adhesion layer am1, the P-terminal bus bar plate BSp, and the insulating member (twelfth insulator) im1 which are named in ascending order in FIG. 63. The metal electrode EE of the package PK1 is joined in close contact relation to the cooling plate (ninth cooling body) CL1 via the conductive adhesion layer am2, the output-terminal bus bar plate BSw, and the insulating member (eleventh insulator) im2 which are named in descending order in FIG. 63.

On the other hand, the metal electrode EC of the package PK2 is joined in close contact relation to the cooling plate (ninth cooling body) CL1 via the conductive adhesion layer am3, the output-terminal bus bar plate BSw, and the insulating member (eleventh insulator) im2 which are named in descending order in FIG. 63. Thus, the emitter metal electrode EE of the package PK1 is electrically coupled to the collector metal electrode EC of the package PK2 via the output-terminal bus bar plate BSw. The metal electrode EE of the package PK2 is joined in close contact relation to the cooling plate (eleventh cooling body) CL2 via the conductive adhesion layer am4, the N-terminal bus bar plate BSn, and the insulating member (thirteenth insulator) im4 which are named in ascending order in FIG. 63.

The output-terminal bus bar plate BSw is made of a metal plate containing, e.g., copper as a main component. As shown in FIG. 61, the output-terminal bus bar plate BSw integrally has a die pad portion BSwp and the lead-out portion BSwd. The die pad portion BSwp of the bus bar plate BSw has a common surface (seventeenth surface) coupled to the metal electrode EE of the package PK1 and to the metal electrode EC of the package PK2, and a surface (eighteenth surface) opposite thereto. The opposite surface (eighteenth surface) is coupled to the cooling plate CL1 via the insulating member im2, as described above. The die pad portion BSwp has a side (first side and fourth side) h13, a side (second side) h14 opposite thereto, and two sides (fifth side) h15 and h16 located between the sides h13 and h14 so as to cross the sides h13 and h14.

The plane area of the die pad portion BSwp of the bus bar plate BSw is larger than the total plane area of the two packages PK1 and PK2. Specifically, the plane area of the die pad portion BSwp is larger than the total plane area of the metal electrodes EE and EC of the two packages PK1 and PK2. The die pad portion BSwp is disposed so as to include the metal electrodes EE and EC of the two packages PK1 and PK2 in plan view. The area size relationship and the locational relationship between the P- and N-terminal bus bar plates BSp and BSn and the packages PK1 and PK2 (metal electrodes EC and EE) are the same as in the first embodiment described above (first and second modifications). Accordingly, in the case in the present second embodiment also, in the same manner as in the first embodiment described above, it is possible to improve the heat dissipation property of each of the packages PK1 and PK2 and thus improve the reliability (performance) of the semiconductor module PM4.

The area size relationship and the locational relationship between the P-, N-, and output-terminal bus bar plates BSp, BSn, and BSw and the cooling plates CL1 and CL2 are also the same as in the first embodiment described above. Accordingly, it is possible to improve the heat dissipation property of each of the packages PK1 and PK2 without increasing the size of the semiconductor module PM4.

Also, in the present second embodiment, as shown in FIGS. 57 to 60 and 63, the lead-out portions BSpa and BSna of the P-terminal bus bar plate BSp and the N-terminal bus bar plate BSn are disposed between the pair of adjacent packages PK1 and PK2. In addition, as shown in FIG. 64, the lead-out portions BSpa and BSna extend in the thickness direction of the packages PK1 and PK2 (direction crossing the respective mounting surfaces of the packages PK1 and PK2) in adjacent and facing relation, while the respective currents Iss and Idd flowing therein are oppositely directed. That is, in the semiconductor module PM4 in the present second embodiment, the distance between the lead-out portion BSpa of the P-terminal bus bar plate BSp and the lead-out portion BSna of the N-terminal bus bar plate BSn which are adjacent to each other can be reduced compared to that in the first embodiment 1 described above (and in the first modification thereof). This can reduce the parasitic inductance and thus further improve the circuit property of the semiconductor module PM4.

Also, in the present second embodiment, as shown in FIGS. 57, 63, and 64, the capacitive element Cs is disposed above the cooling plate CL2 (i.e., at the positions to which the P-terminal lead-out portion BSpa and the N-terminal lead-out portion BSna extend). The lead-out portion BSpa of the P-terminal bus bar plate BSp is electrically coupled to one of the electrodes of the capacitive element Cs, while the lead-out portion BSna of the N-terminal bus bar plate BSn is electrically coupled to the other electrode of the capacitive element Cs. The P-terminal bus bar plate BSp and the N-terminal bus bar plate BSn are disposed between the capacitive element Cs and the output-terminal bus bar plate BSw. This can reduce the distances between the bus bar plates BSp and BSn and the capacitive element Cs and reduce an electric resistance in the circuit. Accordingly, it is possible to further improve the circuit property of the semiconductor module PM4. In addition, since the capacitive element Cs overlaps the packages PK1 and PK2 and the cooling plate CL2 in plan view, it is possible to set the plane area of the semiconductor module PM4 smaller than that of the semiconductor module PM1 in the first embodiment described above. Note that, as shown in FIGS. 57, 58, 63, and 64, between the lead-out portions BSpa and BSna, an insulating sheet iS is interposed to ensure an electrically insulated state between the lead-out portions BSpa and BSna (i.e., between the bus bar plates BSp and BSn).

FIG. 65 is a main-portion plan view of the unit structure of the semiconductor module, which shows an example of the circulation of cooling water in the semiconductor module in FIG. 57. Note that each of the arrows shows the direction in which cooling water flows.

In the present second embodiment, the water supply/drainage units SDU are disposed at both ends in the direction in which the packages PK1 and PK2 are arranged. The cooling water injected from each of the water supply/drainage units SDU flows toward the space between the adjacent packages PK1 and PK2 and then flows there in the direction of the lead-out portion BSwd. In this case also, the manner in which the cooling water flows is set such that the chips CT in which the transistors Tr1 and Tr2 are formed are cooled before the chips CD in which the diodes Df are formed are cooled. Therefore, in the same manner as in the first embodiment described above, it is possible to improve the efficiency of cooling of the packages PK1 and PK2.

The configuration (except for the configuration described using FIG. 25 in the present second embodiment) and effects are otherwise the same as in the first embodiment described above. A method of manufacturing the semiconductor module PM4 is also substantially the same as the manufacturing method in the first embodiment described above.

First Modification of Second Embodiment

Next, a description will be given of an example of a configuration of a semiconductor module (electronic device) according to a first modification of the present second embodiment. FIG. 66 is a plan view of each of the unit structures of the semiconductor module according to the first modification of the present second embodiment. FIG. 67 is a main-portion perspective view of the semiconductor module in FIG. 66. FIG. 68 is a main-portion plan view showing packages and an output-terminal bus bar plate which are included in the semiconductor module in FIG. 66 in an extracted manner. FIG. 69 is a main-portion plan view showing the packages, a P-terminal bus bar plate, and an N-terminal bus bar plate which are included in the semiconductor module in FIG. 66 in an extracted manner. FIG. 70 is a cross-sectional view along the line XII-XII in FIG. 66. FIG. 71 is a schematic main-portion perspective view of the semiconductor module in FIG. 66. Note that FIG. 71 shows the coupling relation of the capacitive element of the semiconductor module in FIG. 66.

In a semiconductor module PM5 according to the first modification of the present second embodiment, the structures of the bus bar plates BSp, BSn, and BSw and the structure of the cooling plate CL2 are different from those in the second embodiment described above. That is, as shown in FIGS. 66, 67, and 71, the lead-out portions BSpa and BSna of the P-terminal bus bar plate BSp and the N-terminal bus bar plate BSn are led out in the same direction as that in which the lead-out portion BSwd of the output-terminal bus bar plate BSw is led out. In the first modification, as shown in FIG. 67, the lead-out portions BSpa and BSna of the P-terminal bus bar plate BSp and the N-terminal bus bar plate BSn are bent in facing and adjacent relation toward the output-terminal bus bar plate BSw. As shown in FIGS. 67 and 68, at the middle (position where the lead-out portions BSpa and BSna are bent) of the side h13 of the output-terminal bus bar plate BSw, a recessed portion Re is formed. The lead-out portions BSpa and BSna of the P- and N-terminal bus bar plates BSp and BSn are designed to enter the recessed portion Re of the output-terminal bus bar plate BSs and not to come into contact with the bus bar plate BSw. Note that, as shown in FIG. 70, between the lead-out portions BSpa and BSna of the bus bar plates BSp and BSn (see FIG. 71, etc.), an insulating sheet iS is interposed to ensure an electrically insulated state between the lead-out portions BSpa and BSna (i.e., between the bus bar plates BSp and BSn).

In the semiconductor module PM5, the lead-out portions BSpa and BSna are not led out upwardly from the bus bar plates BSp and BSn. Accordingly, the cooling plate CL2 above the bus bar plate BSp and BSn is not divided, but is formed to cover the two packages PK1 and PK2. This can reduce the number of the components (cooling plates) compared to that in the case in the second embodiment described above and thus reduce the manufacturing cost. Note that an example of the circulation of the cooling water in this case is the same as in the first embodiment described above.

In the case of using the semiconductor module PM5 also, as shown in FIG. 71, the lead-out portions BSpa and BSna of the bus bar plates BSp and BSn are disposed between the pair of adjacent packages PK1 and PK2. The lead-out portions BSpa and BSna adjacent to and facing each other extend in the same direction as that in which the lead-out portion BSwd of the output-terminal bus bar plate BSw extends, while the currents Iss and Idd flowing therein are oppositely directed. That is, in the case of using the semiconductor module PM5 also, the distance between the adjacent lead-out portions BSpa and BSna of the bus bar plates BSp and BSn can be reduced compared to that in the first embodiment described above (and the first modification thereof). This can reduce parasitic inductance and thus further improve the circuit property of the semiconductor module PM5.

The configuration and the effects are otherwise the same as in the second embodiment described above. A method of manufacturing the semiconductor module PM5 is also substantially the same as the manufacturing method in the first embodiment described above.

While the invention achieved by the present inventors has been specifically described heretofore on the basis of the embodiments, the present invention is not limited to the foregoing embodiments. It will be appreciated that various changes and modifications can be made in the invention within the scope not departing from the gist thereof.

(Note 1)

An electronic device, includes:

a first sealing body sealing a first semiconductor chip having a first power transistor, a first electrode of the first power transistor, a second electrode of the first power transistor, and a first control electrode of the first power transistor, a first metal plate having a first surface facing and electrically coupled to the first electrode of the first semiconductor chip and a second surface opposite to the first surface, and a second metal plate having a third surface facing and electrically coupled to the second electrode of the first semiconductor chip and a fourth surface opposite to the third surface such that the second surface and the fourth surface are exposed from the first sealing body;

a second sealing body sealing a second semiconductor chip having a second power transistor, a third electrode of the second power transistor, a fourth electrode of the second power transistor, and a second control electrode of the second power transistor, a third metal plate having a fifth surface facing and electrically coupled to the third electrode of the second semiconductor chip and a sixth surface opposite to the fifth surface, and a fourth metal plate having a seventh surface facing and electrically coupled to the fourth electrode of the second semiconductor chip and an eighth surface opposite to the seventh surface such that the sixth surface and the eighth surface are exposed from the second sealing body;

a first terminal having a ninth surface electrically coupled to the second surface of the first metal plate via a first conductor layer and a tenth surface opposite to the ninth surface;

a second terminal having an eleventh surface electrically coupled to the eighth surface of the fourth metal plate via a second conductor layer and a twelfth surface opposite to the eleventh surface; and an output terminal electrically coupled to the fourth surface of the second metal plate and the sixth surface of the third metal plate via a third conductor layer, in which an area of the first terminal in plan view is larger than an area of the first metal plate in plan view, in which an area of the second terminal in plan view is larger than an area of the fourth metal plate in plan view, in which an area of the output terminal in plan view is larger than an area of the second metal plate in plan view or an area of the third metal plate in plan view, in which the output terminal includes a first output terminal and a second output terminal disposed so as to overlap the first output terminal in plan view and electrically coupled to the first output terminal, in which the first output terminal has a thirteenth surface facing and electrically coupled to the fourth surface of the second metal plate and a fourteenth surface opposite to the thirteenth surface, in which the second output terminal has a fifteenth surface facing and electrically coupled to the sixth surface of the third metal plate and a sixteenth surface opposite to the fifteenth surface, in which the fourteenth surface of the first output terminal is coupled to a seventh cooling body via a ninth insulator, and in which the sixteenth surface of the second output terminal is coupled to an eighth cooling body via a tenth insulator.

(Note 2)

A method of manufacturing an electronic device, includes the steps of:

(a) mounting, over a first metal plate having a first surface and a second surface opposite to the first surface, a first semiconductor chip having a first power transistor, a first main surface over which a first electrode of the first power transistor is formed, and a second main surface which is opposite to the first main surface and over which a second electrode of the first power transistor is formed such that the first main surface of the first semiconductor chip faces the first surface of the first metal plate, and electrically coupling the first electrode to the first metal plate;

(b) electrically coupling a second metal plate having a third surface and a fourth surface opposite to the third surface to the second electrode such that the third surface of the second metal plate faces the second main surface of the first semiconductor chip;

(c) sealing the first semiconductor chip, the first metal plate, and the second metal plate such that the second surface and the fourth surface are exposed;

(d) mounting, over a third metal plate having a fifth surface and a sixth surface opposite to the fifth surface, a second semiconductor chip having a second power transistor, a third main surface over which a third electrode of the second power transistor is formed, and a fourth main surface which is opposite to the third main surface and over which a fourth electrode of the second power transistor is formed such that the third main surface of the second semiconductor chip faces the fifth surface of the third metal plate, and electrically coupling the third electrode to the third metal plate;

(e) electrically coupling a fourth metal plate having a seventh surface and an eighth surface opposite to the seventh surface to the fourth electrode such that the seventh surface of the fourth metal plate faces the fourth main surface of the second semiconductor chip;

(f) sealing the second semiconductor chip, the third metal plate, and the fourth metal plate such that the sixth surface and the eighth surface are exposed;

(g) coupling, to the second surface of the first metal plate after the step (c), a first terminal having an area larger than that of the second surface via a first conductor layer;

(h) coupling, to the eighth surface of the fourth metal plate after the step (f), a second terminal having an area larger than that of the eighth surface via a second conductor layer;

(i) coupling, to the fourth surface of the second metal plate after the step (c), an output terminal having an area larger than that of the fourth surface via a third conductor layer; and (j) coupling, to the sixth surface of the third metal plate after the step (f), an output terminal having an area larger than that of the sixth surface via the third conductor layer.

(Note 3)

In the method of manufacturing the electronic device according to Note 2, the first terminal is disposed so as to include the first metal plate in plan view, the second terminal is disposed so as to include the fourth metal plate in plan view, and the output terminal is disposed so as to include the second metal plate and the third metal plate in plan view.

(Note 4)

The method of manufacturing the electronic device according to Note 2, further includes the steps of:

(k) joining the first terminal to a first cooling body via a first insulator;

(l) joining the second terminal to a second cooling body via a second insulator; and (m) joining the output terminal to a third cooling body via a third insulator.

What is claimed is:

1. An electronic device, comprising:
   a first sealing body sealing a first semiconductor chip having a first power transistor, a first electrode of the first power transistor, a second electrode of the first power transistor, and a first control electrode of the first power transistor, a first metal plate having a first surface facing and electrically coupled to the first electrode of the first semiconductor chip and a second surface opposite to the first surface, and a second metal plate having a third surface facing and electrically coupled to the second electrode of the first semiconductor chip and a fourth surface opposite to the third surface such that the second surface and the fourth surface are exposed from the first sealing body;

a second sealing body sealing a second semiconductor chip having a second power transistor, a third electrode of the second power transistor, a fourth electrode of the second power transistor, and a second control electrode of the second power transistor, a third metal plate having a fifth surface facing and electrically coupled to the third electrode of the second semiconductor chip and a sixth surface opposite to the fifth surface, and a fourth metal plate having a seventh surface facing and electrically coupled to the fourth electrode of the second semiconductor chip and an eighth surface opposite to the seventh surface such that the sixth surface and the eighth surface are exposed from the second sealing body;

a first terminal having a ninth surface electrically coupled to the second surface of the first metal plate via a first conductor layer and a tenth surface opposite to the ninth surface;

a second terminal having an eleventh surface electrically coupled to the eighth surface of the fourth metal plate via a second conductor layer and a twelfth surface opposite to the eleventh surface; and an output terminal electrically coupled to the fourth surface of the second metal plate and the sixth surface of the third metal plate via a third conductor layer, wherein an area of the first terminal in plan view is larger than an area of the first metal plate in plan view, wherein an area of the second terminal in plan view is larger than an area of the fourth metal plate in plan view, and wherein an area of the output terminal in plan view is larger than an area of the second metal plate in plan view or an area of the third metal plate in plan view.

2. The electronic device according to claim 1,
wherein the first terminal includes a region where the first power transistor is disposed in plan view,
wherein the second terminal includes a region where the second power transistor is disposed in plan view, and
wherein the output terminal includes the region where the first power transistor is disposed and the region where the second power transistor is disposed in plan view.

3. The electronic device according to claim 2,
wherein the first terminal includes the first metal plate in plan view,
wherein the second terminal includes the fourth metal plate in plan view, and
wherein the output terminal includes the second metal plate and the third metal plate in plan view.

4. The semiconductor device according to claim 2,
wherein the first terminal includes the first sealing body in plan view,
wherein the second terminal includes the second sealing body in plan view, and
wherein the output terminal includes the first sealing body and the second sealing body in plan view.

5. The electronic device according to claim 1,
wherein the tenth surface of the first terminal is coupled to a first cooling body via a first insulator, and
wherein the twelfth surface of the second terminal is coupled to a second cooling body via a second insulator.

6. The electronic device according to claim 5,
wherein the first cooling body includes the first terminal in plan view, and
wherein the second cooling body includes the second terminal in plan view.

7. The electronic device according to claim 1,
wherein the output terminal has a thirteenth surface facing and electrically coupled to the fourth surface of the second metal plate, a fourteenth surface opposite to the thirteenth surface, a fifteenth surface facing and electrically coupled to the sixth surface of the third metal plate, and a sixteenth surface opposite to the fifteenth surface,
wherein the fourteenth surface and the sixteenth surface face each other,
wherein, between the fourteenth surface and the sixteenth surface, a third cooling body is disposed,
wherein the fourteenth surface is coupled to the third cooling body via a third insulator, and
wherein the sixteenth surface is coupled to the third cooling body via a fourth insulator.

8. The electronic device according to claim 7,
wherein the tenth surface of the first terminal is coupled to a fourth cooling body via a fifth insulator, and
wherein the twelfth surface of the second terminal is coupled to a fifth cooling body via a sixth insulator.

9. The electronic device according to claim 7,
wherein, between the fourteenth surface and the sixteenth surface of the output terminal, a conductor member joined to the fourteenth surface and the sixteenth surface is provided.

10. The electronic device according to claim 1,
wherein the tenth surface of the first terminal and the twelfth surface of the second terminal are disposed so as to face each other,
wherein, between the tenth surface of the first terminal and the twelfth surface of the second terminal, a sixth cooling body is disposed,
wherein the tenth surface of the first terminal is coupled to the sixth cooling body via a seventh insulator, and
wherein the twelfth surface of the second terminal is coupled to the sixth cooling body via an eighth insulator.

11. The electronic device according to claim 10,
wherein the output terminal has a thirteenth surface facing and electrically coupled to the fourth surface of the second metal plate, a fourteenth surface opposite to the thirteenth surface, a fifteenth surface facing and electrically coupled to the sixth surface of the third metal plate, and a sixteenth surface opposite to the fifteenth surface,
wherein the fourteenth surface of the output terminal is coupled to a seventh cooling body via a ninth insulator, and
wherein the sixteenth surface of the output terminal is coupled to an eighth cooling body via a tenth insulator.

12. The electronic device according to claim 1,
wherein the output terminal has a seventeenth surface facing and electrically coupled to the fourth surface of the second metal plate and the sixth surface of the third metal plate and an eighteenth surface opposite to the seventeenth surface, and
wherein the eighteenth surface is coupled to a ninth cooling body via an eleventh insulator.

13. The electronic device according to claim 12,
wherein a lead-out portion of the first terminal and a lead-out portion of the second terminal are disposed between the first sealing body and the second sealing body to extend in a direction away from the seventeenth surface of the output terminal, and wherein a capacitive element electrically coupled between the first terminal and the second terminal is disposed at a position to which the lead-out portion of the first terminal and the lead-out portion of the second terminal extend.

14. The electronic device according to claim 13, wherein the tenth surface of the first terminal is coupled to a tenth cooling body via a twelfth insulator, and wherein the twelfth surface of the second terminal is coupled to an eleventh cooling body via a thirteenth insulator.

15. The electronic device according to claim 12, wherein a lead-out portion of the first terminal and a lead-out portion of the second terminal are disposed between the first sealing body and the second sealing body to extend along the seventeenth surface of the output terminal, and wherein the tenth surface of the first terminal and the twelfth surface of the second terminal are coupled to a common cooling body via a common insulator.

16. The electronic device according to claim 1, wherein a lead-out portion of the first terminal and a lead-out portion of the second terminal are disposed between the first sealing body and the second sealing body.

17. The electronic device according to claim 1, wherein the first sealing body includes a first control terminal which is electrically coupled to the first control electrode and partially exposed from the first sealing body, wherein the second sealing body includes a second control terminal which is electrically coupled to the second control electrode and partially exposed from the second sealing body, wherein the output terminal has a first side and a second side opposite to the first side, wherein the first control terminal and the second control terminal are disposed closer to the second side, and wherein a lead-out portion of the output terminal is disposed closer to the first side.

18. The electronic device according to claim 1, wherein the first sealing body includes a first control terminal which is electrically coupled to the first control electrode and partially exposed from the first sealing body, wherein the second sealing body includes a second control terminal which is electrically coupled to the second control electrode and partially exposed from the second sealing body, wherein the output terminal has a first side and a second side opposite to the first side, wherein the first control terminal and the second control terminal are disposed closer to the second side, and wherein a lead-out portion of the first terminal and a lead-out portion of the second terminal are disposed closer to the first side.

19. The electronic device according to claim 1, further comprising:

a capacitive element electrically coupled between the first terminal and the second terminal, wherein the capacitive element has a third side, wherein the output terminal has a fourth side facing the third side and a fifth side crossing the fourth side, wherein a length of the fourth side of the output terminal is larger than a length of the fifth side thereof, and wherein a distance between the third side of the capacitive element and the fourth side of the output terminal is smaller than the length of the fifth side of the output terminal.

20. The electronic device according to claim 1, wherein the first power transistor and the second power transistor are coupled in series between the first terminal and the second terminal to form an inverter circuit.

* * * * *